United States Patent
Takemoto et al.

(10) Patent No.: US 6,242,751 B1
(45) Date of Patent: Jun. 5, 2001

(54) CHARGED-PARTICLE-BEAM EXPOSURE DEVICE AND CHARGED-PARTICLE-BEAM EXPOSURE METHOD

(75) Inventors: Akio Takemoto; Yoshihisa Ooaeh; Tomohiko Abe; Hiroshi Yasuda; Takamasa Satoh, all of Kawasaki; Hideki Nasuno, Kasugai; Hidefumi Yabara, Kawasaki; Kenichi Kawakami, Kawasaki; Kiichi Sakamoto, Kawasaki; Tomohiro Sakazaki, Kasugai; Isamu Seto, Kawasaki; Masami Takigawa, Kawasaki; Tatsuro Ohkawa, Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/353,586

(22) Filed: Jul. 15, 1999

Related U.S. Application Data

(62) Division of application No. 08/917,464, filed on Aug. 26, 1997, now Pat. No. 5,969,365, which is a division of application No. 08/634,410, filed on Apr. 18, 1996, now Pat. No. 5,757,015.

(30) Foreign Application Priority Data

| Jun. 8, 1995 | (JP) | 7-142037 |
| Jul. 20, 1995 | (JP) | 7-184231 |
| Jul. 20, 1995 | (JP) | 7-184233 |
| Oct. 3, 1995 | (JP) | 7-256396 |

(51) Int. Cl.$^7$ .................................. H01J 37/302
(52) U.S. Cl. ...................................... 250/492.22
(58) Field of Search .................. 250/492.22, 396 R, 250/491.1, 492.23, 252.1 R

(56) References Cited

U.S. PATENT DOCUMENTS

| 4,334,139 | 6/1982 | Wittekoek et al. . |
| 5,047,647 | 9/1991 | Itoh et al. . |
| 5,757,015 | 5/1998 | Takemoto et al. . |
| 5,994,709 | * 4/1999 | Suzuki .................. 250/492.22 |
| 6,008,498 | * 12/1999 | Simizu ................. 250/492.22 |

FOREIGN PATENT DOCUMENTS

| 61-088524 | 5/1986 | (JP) . |
| 62-206828 | 9/1987 | (JP) . |
| 62-277724 | 12/1987 | (JP) . |
| 1-136332 | 5/1989 | (JP) . |
| 1-183819 | 7/1989 | (JP) . |

* cited by examiner

Primary Examiner—Kiet T. Nguyen
(74) Attorney, Agent, or Firm—Staas & Halsey LLP

(57) ABSTRACT

A method of exposing a wafer to a charged-particle beam by directing to the wafer the charged-particle beam deflected by a deflector includes the steps of arranging a plurality of first marks at different heights, focusing the charged-particle beam on each of the first marks by using a focus coil provided above the deflector, obtaining a focus distance for each of the first marks, obtaining deflection-efficiency-correction coefficients for each of the first marks, and using linear functions of the focus distance for approximating the deflection-efficiency-correction coefficients to obtain the deflection-efficiency-correction coefficients for an arbitrary value of the focus distance. A device for carrying out the method is also set forth.

62 Claims, 71 Drawing Sheets

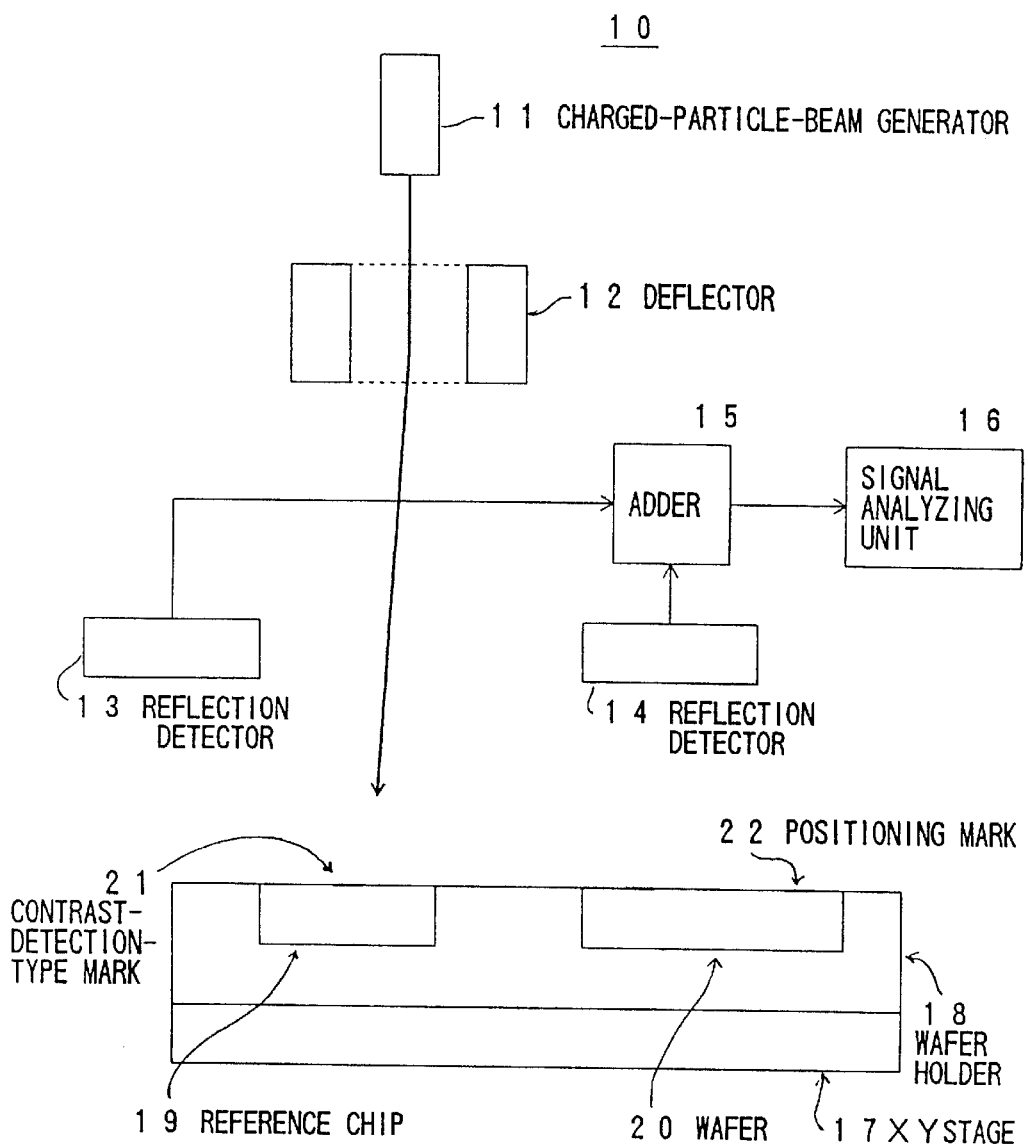

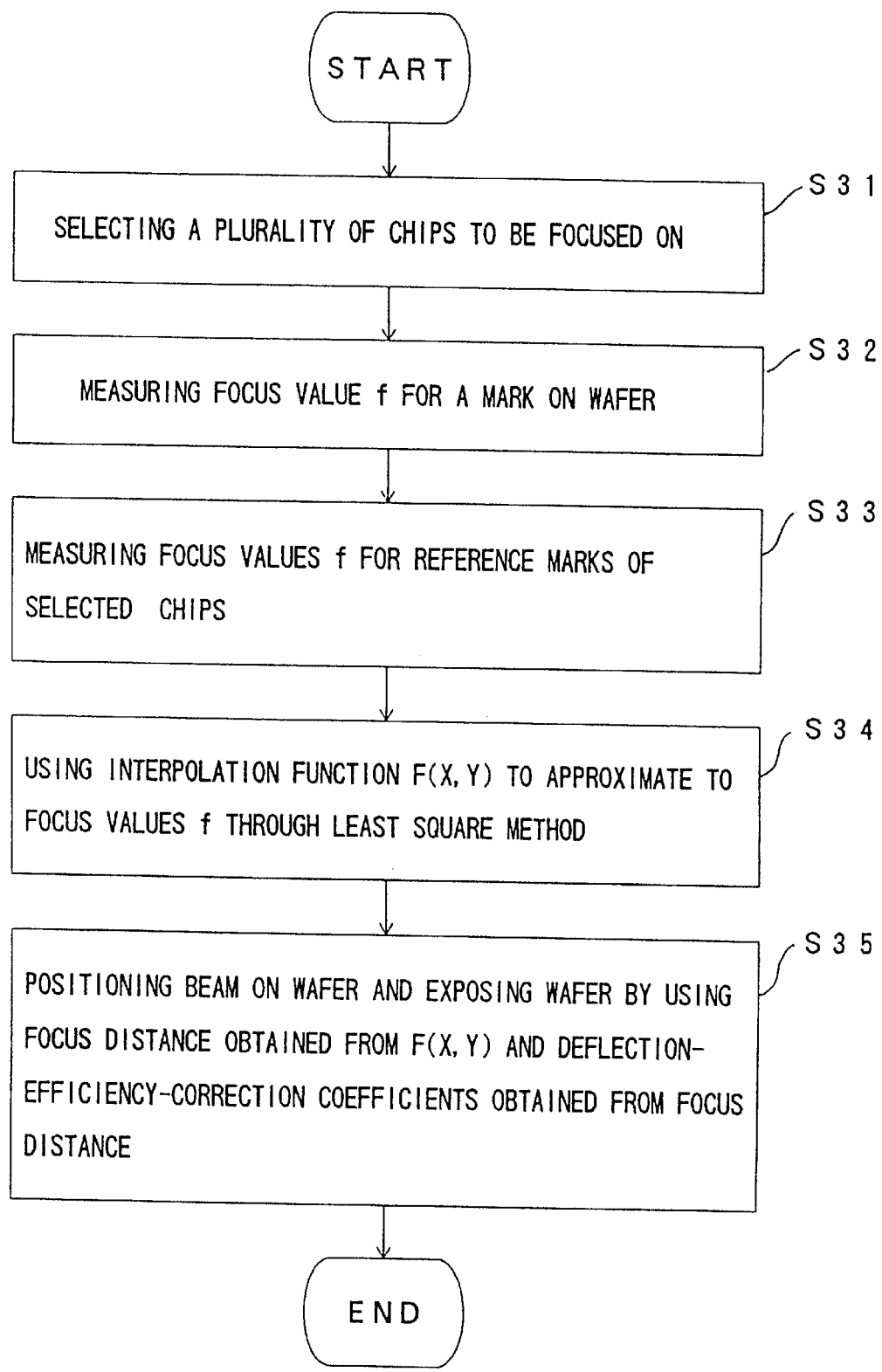

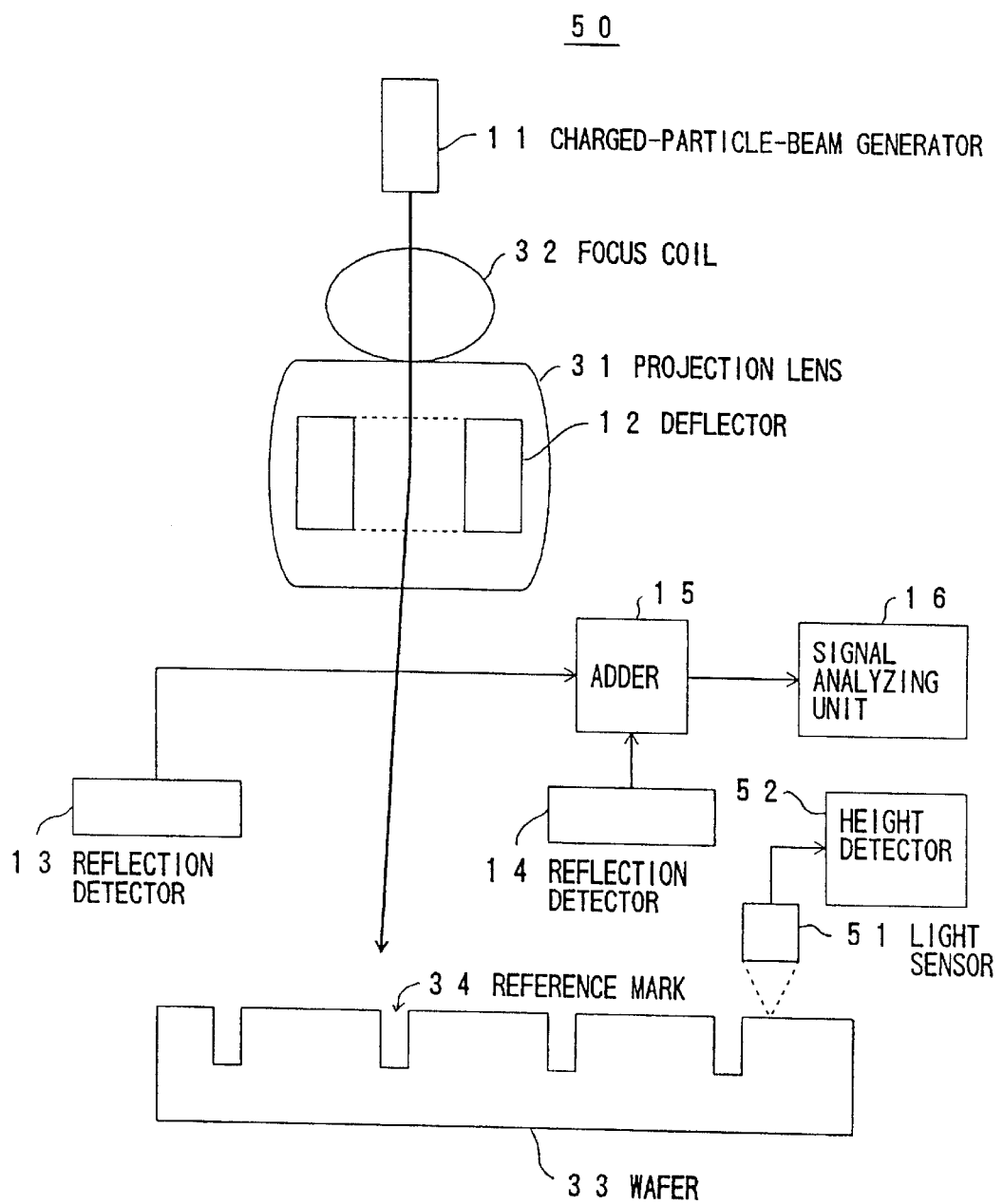

F I G. 1 7
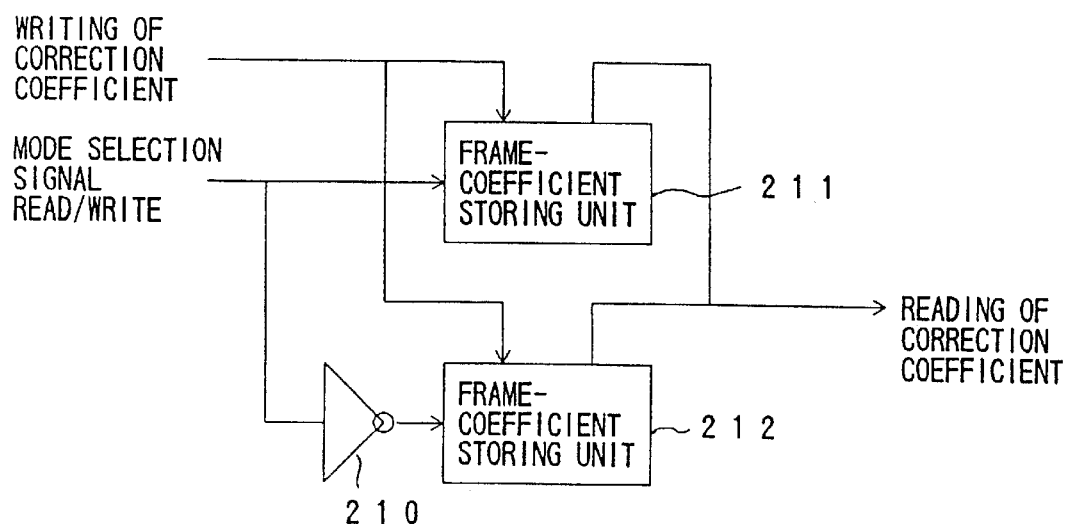

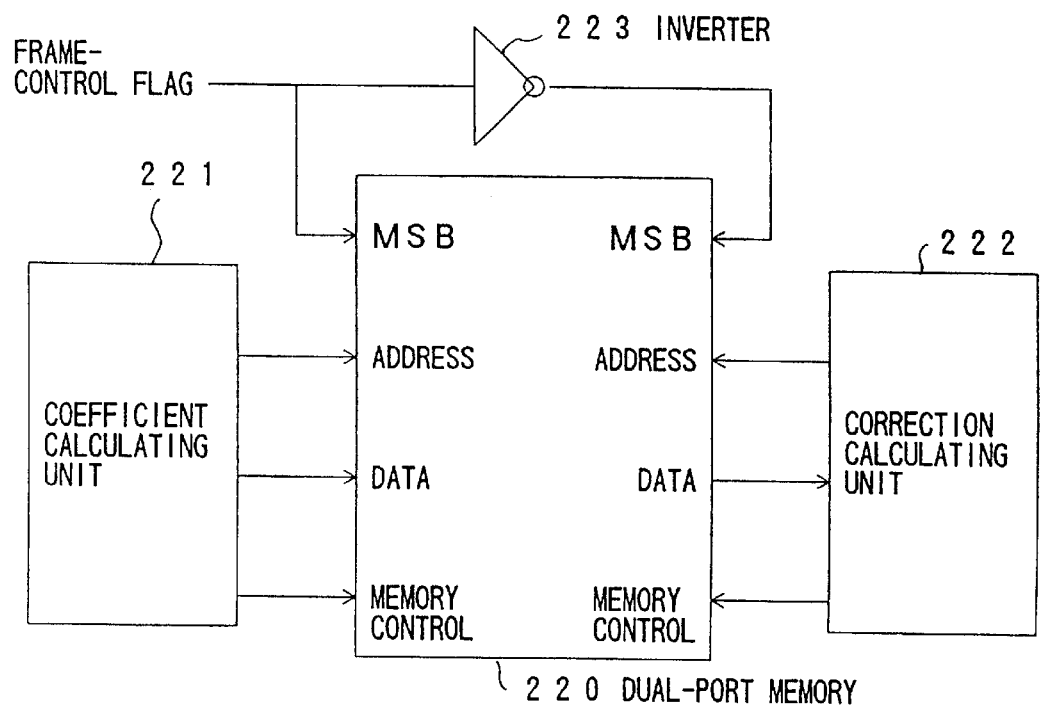

FIG. 22

| ORDER | DATA 1 | DATA 2 |
|---|---|---|
| 0 | 0 0 | AREA |
| 1 | 0 1 | CELL |
| 2 | 0 2 | CELL |
| 3 | 0 3 | CELL |
| 4 | 0 4 | AREA |
| 5 | 0 5 | CELL |
| 6 | 0 6 | CELL |
| 7 | 0 7 | CELL |
| 8 | 0 8 | AREA |
| 9 | 0 9 | CELL |
| 1 0 | 0 A | CELL |
| 1 1 | 0 B | CELL |
| . | . | . |
| . | . | . |
| . | . | . |

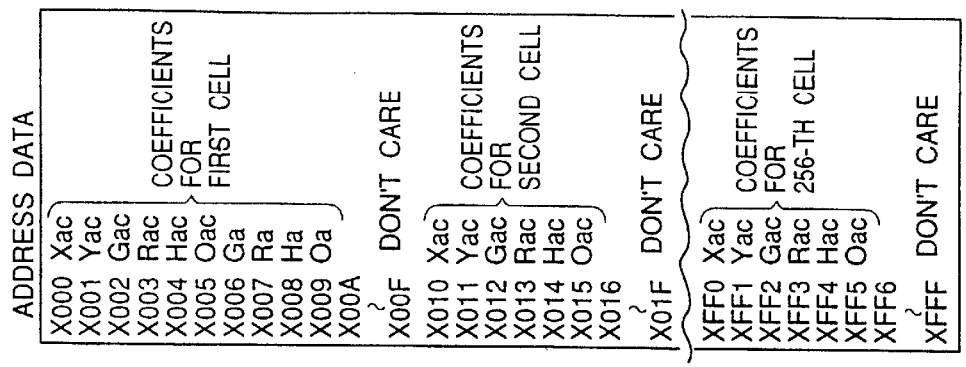
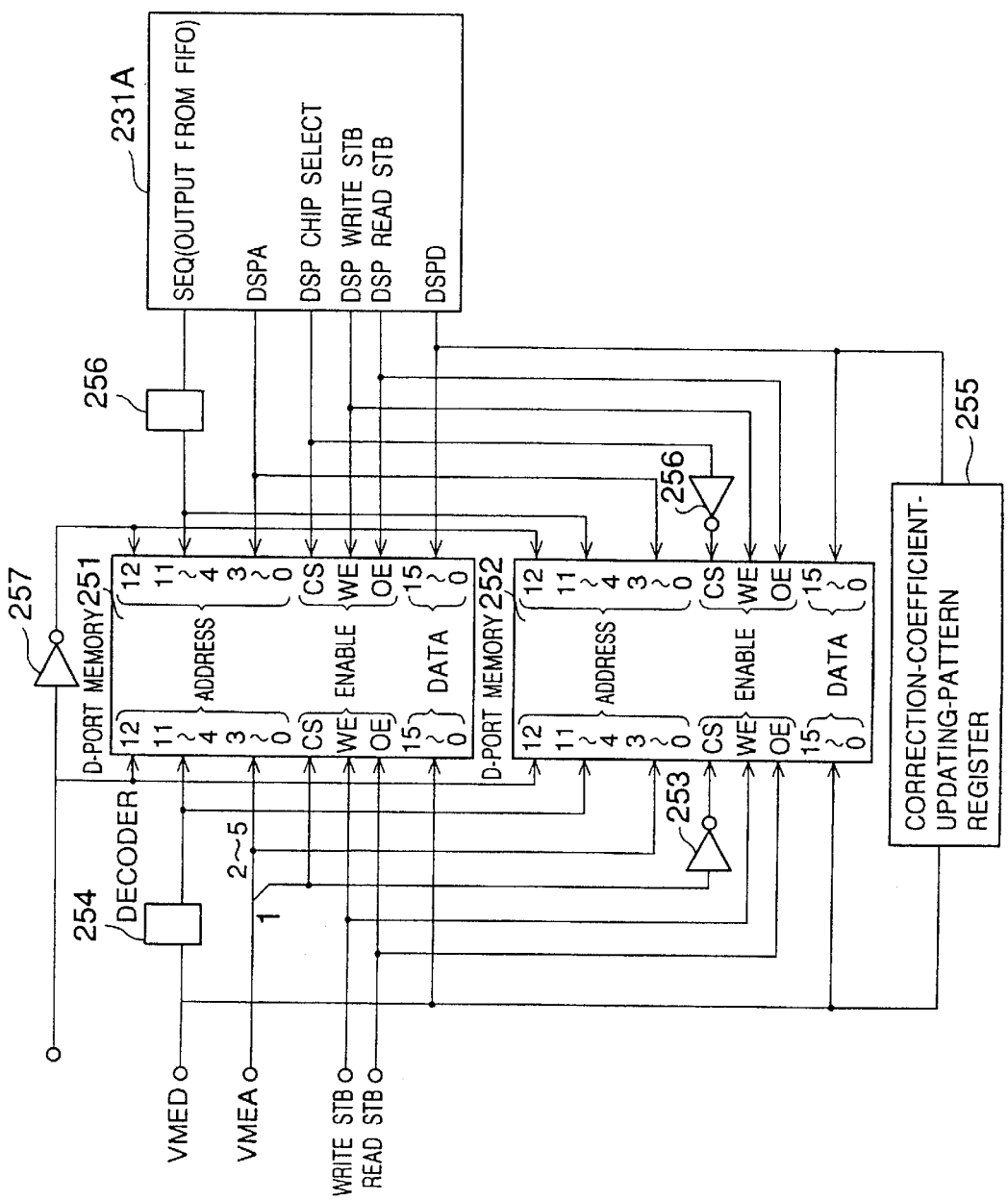

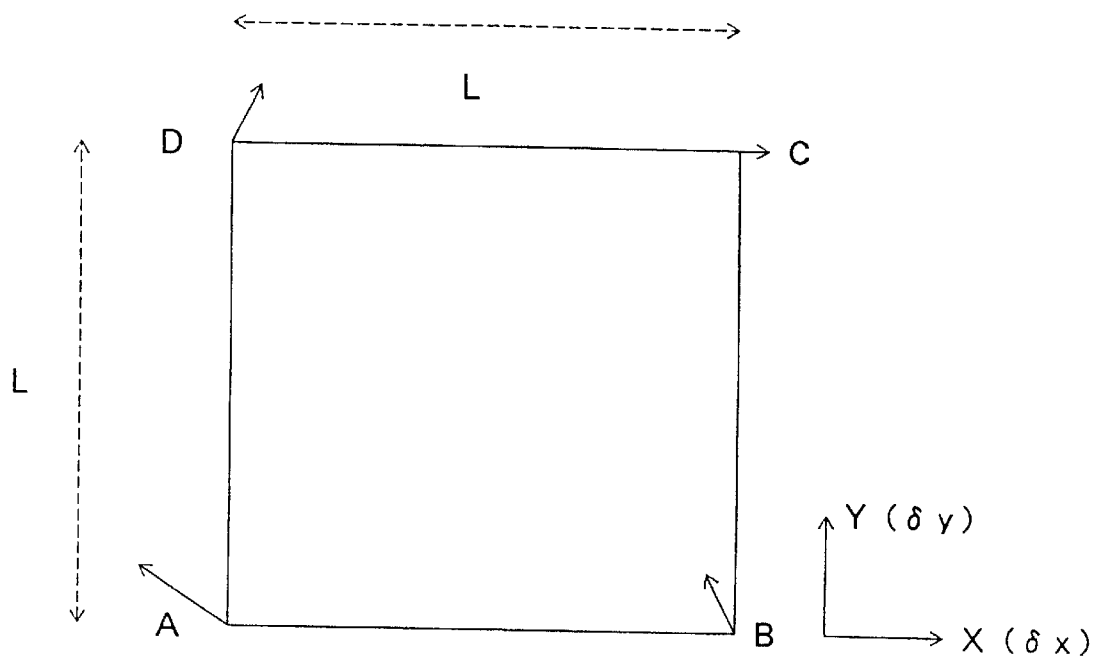
F I G. 3 2

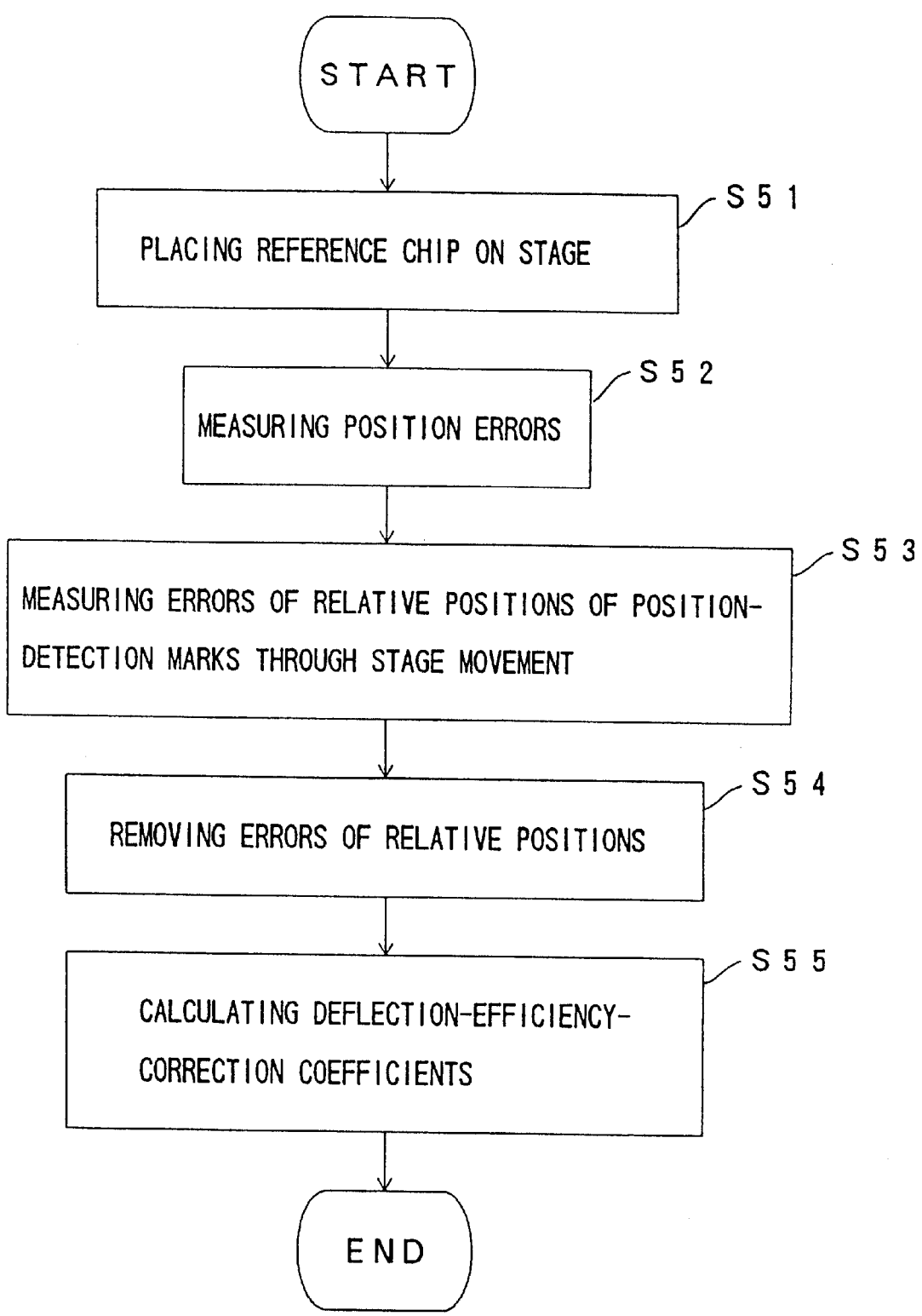

FIG.38
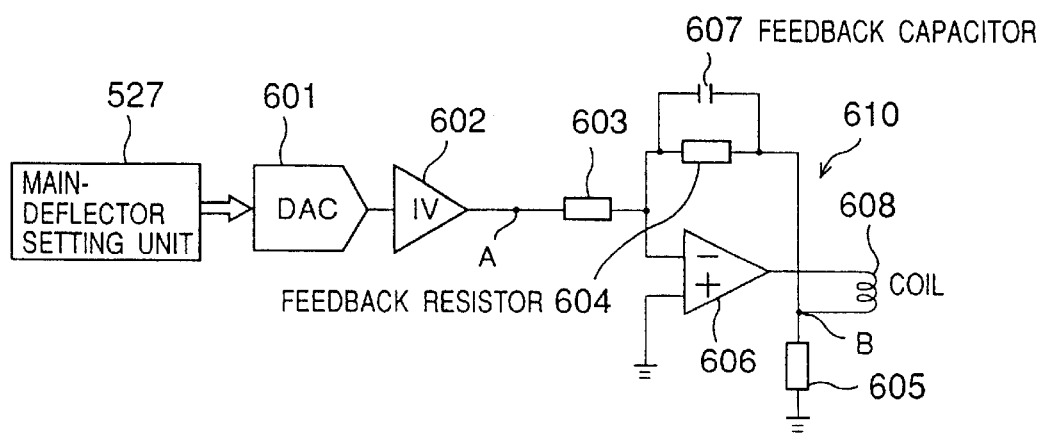
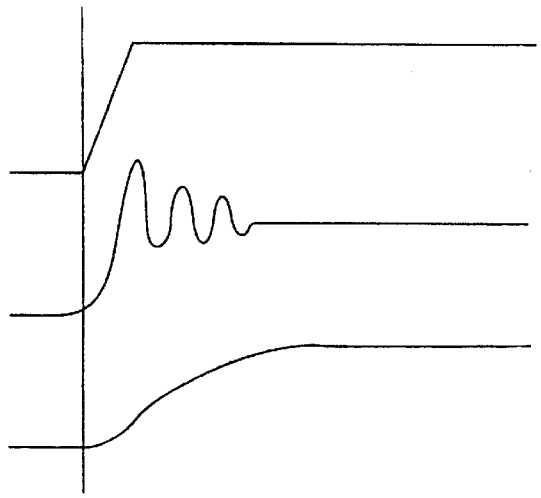
FIG.39A
FIG.39B
FIG.39C
→ TIME

FIG.40
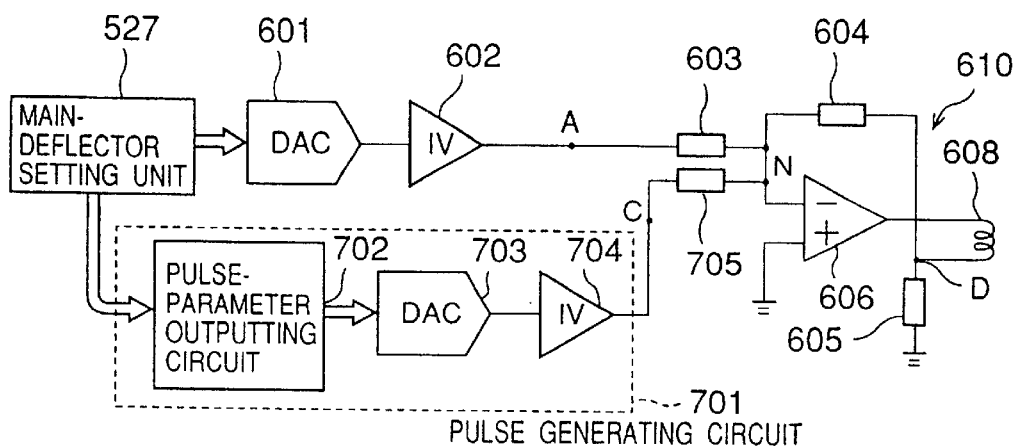
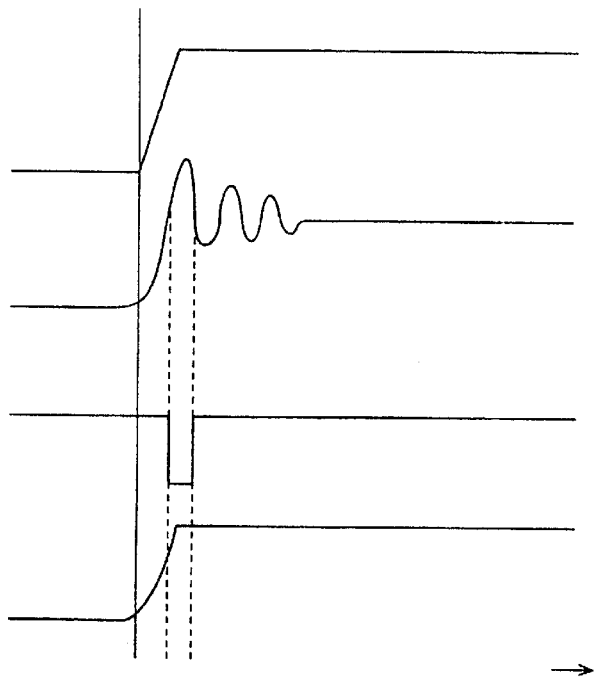
FIG.41A
FIG.41B
FIG.41C
FIG.41D

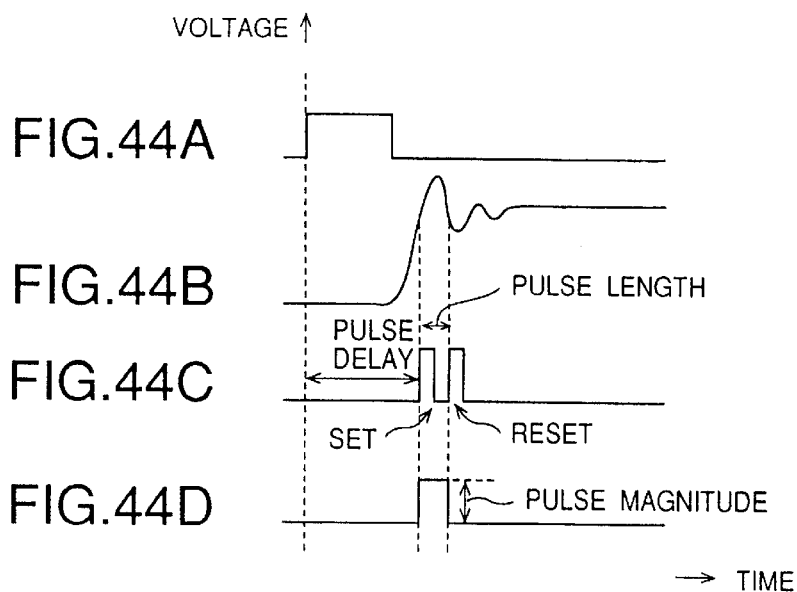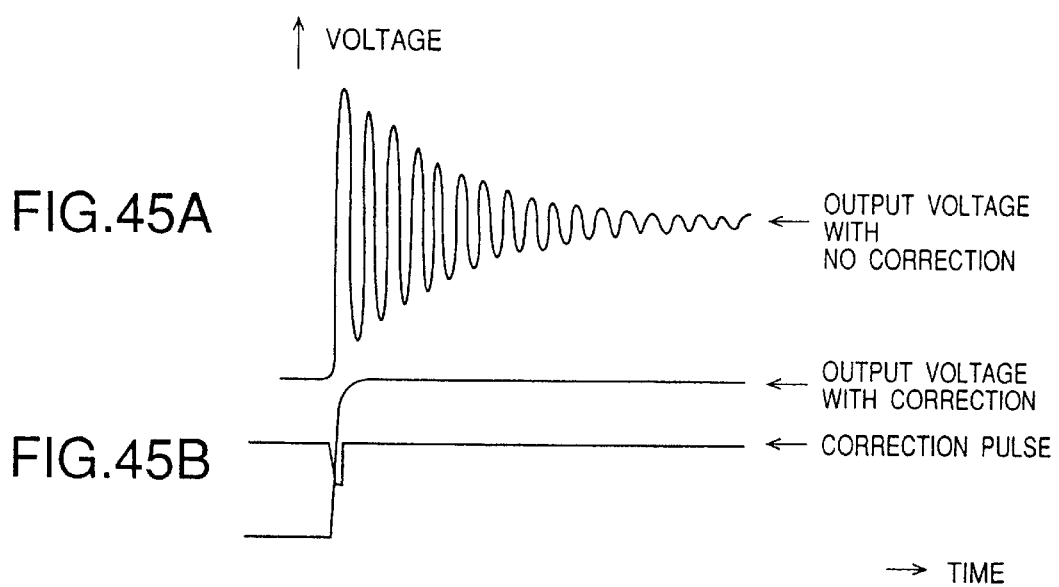

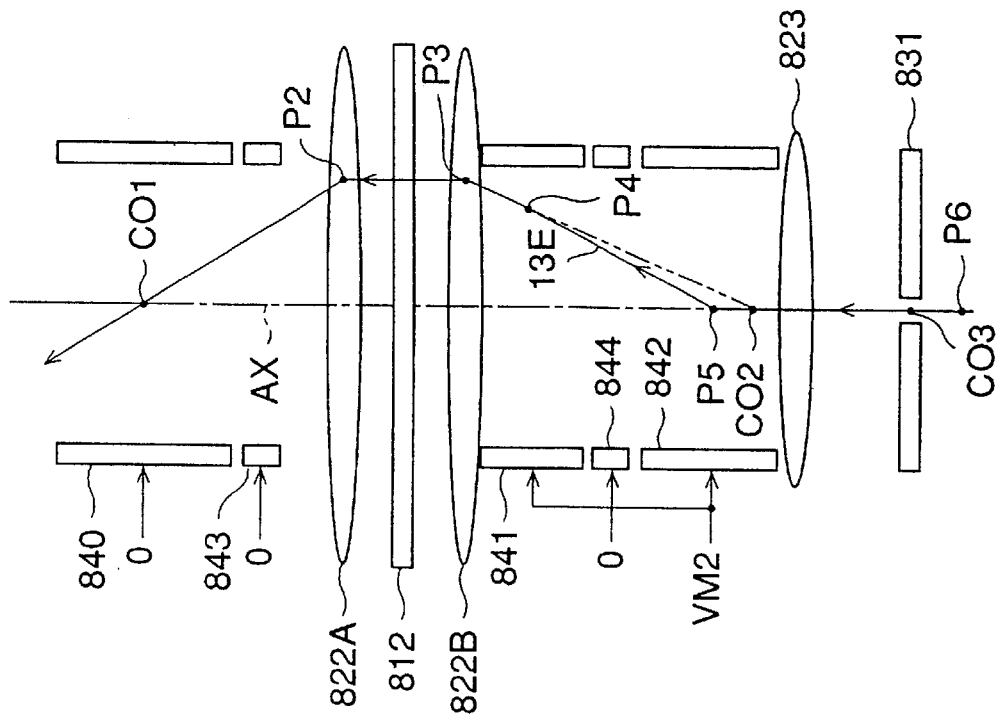
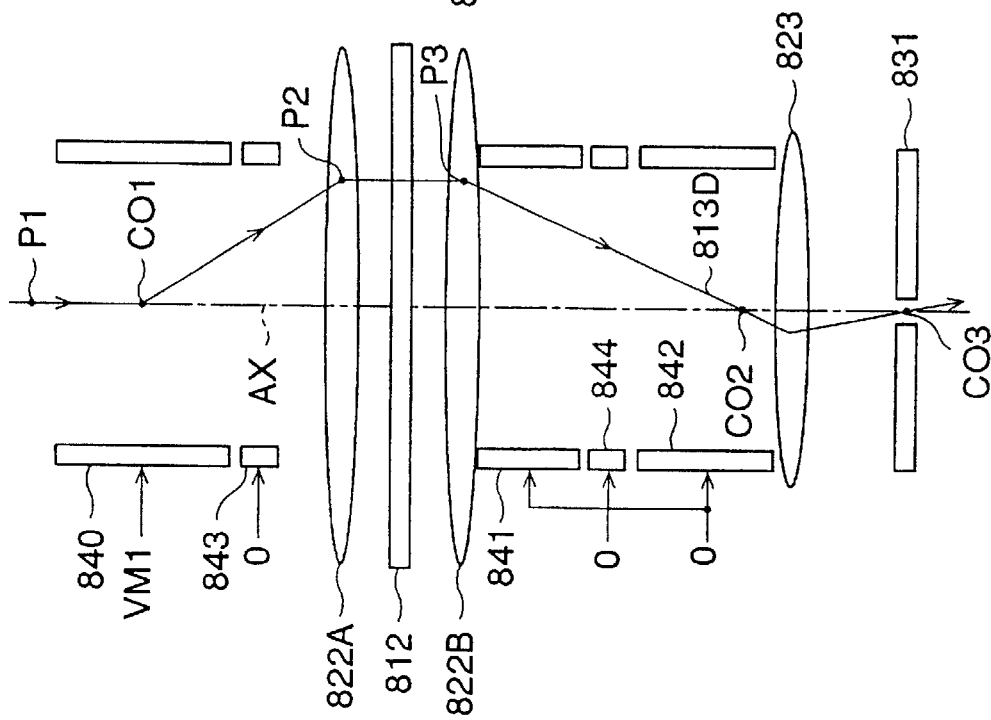

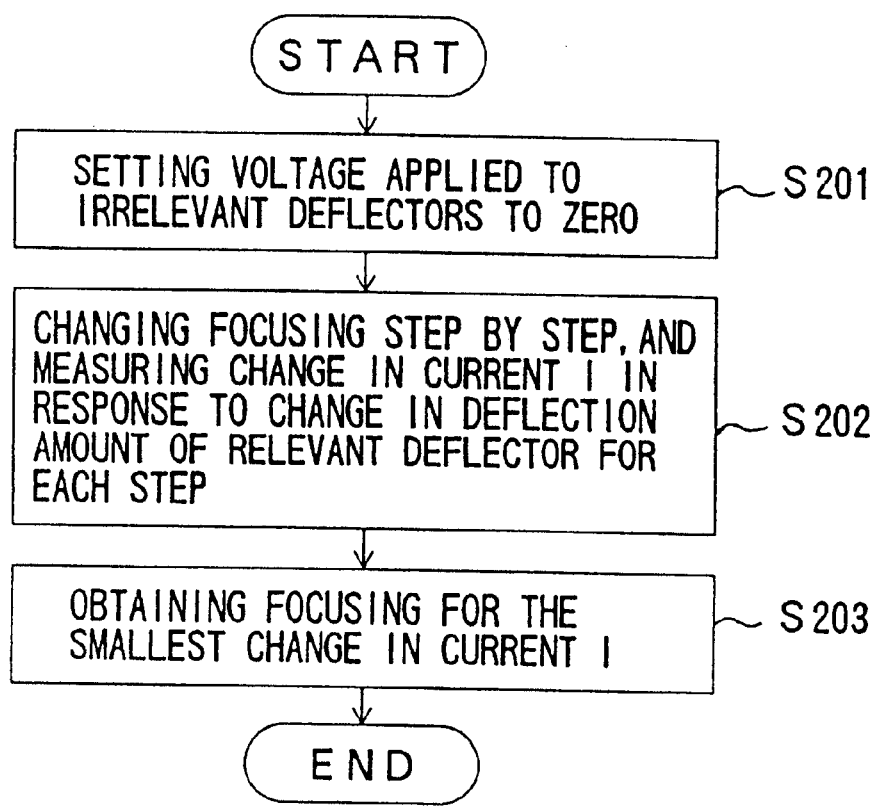

CHARGED-PARTICLE-BEAM EXPOSURE DEVICE AND CHARGED-PARTICLE-BEAM EXPOSURE METHOD

This application is a division of application Ser. No. 08/917,464, filed Aug. 26, 1997, now U.S. Pat. No. 5,969,365, which is in turn a division of application Ser. No. 08/634,410, filed Apr. 18, 1996, now U.S. Pat. No. 5,757,015.

BACKGROUND OF THE INVENTION

1. Field of the Invention

The present invention generally relates to charged-particle-beam exposure devices, and particularly relates to a charged-particle-beam exposure device which forms a pattern on a wafer by exposing the wafer to charged particles.

2. Description of the Related Art

As the circuit density of semiconductor integrated circuits increases, a finer processing technique is required. Compared to the light exposure method widely used in the manufacturing of LSI chips, the charged-particle exposure method has much superior characteristics in terms of the resolution and the focus depth. With respect to the resolution, a processing limit of the photolithography method is about 0.3 $\mu$m, while processing as fine as 0.1 $\mu$m can be achieved in the charged-particle-beam exposure method.

However, the charged-particle-beam exposure method is inferior compared to the light exposure method in terms of an exposure positioning accuracy, an overlay accuracy, and a field stitching accuracy. Because of this, the charged-particle-beam exposure method is not widely used in the field for manufacturing purposes of LSI chips.

The charged-particle-beam exposure device has a smaller area to be able to be exposed at one time, compared to a light exposure device such as a stepper. (This area is called a deflection field hereinafter.) Thus, in order to expose one LSI chip, stage movement is required to successively shift the deflection field on the LSI chip. In doing so, if the connecting precision across borders of the deflection fields is low, severance of wires and/or short-circuits are generated which greatly degrades the yield of the chips.

In order to improve the yield, the connecting precision at the field borders must be enhanced, which requires a higher precision of the deflection of the charged-particle beam. In the charged-particle-beam exposure device, the charged-particle beam is generally deflected by a magnetic field generated by coils. The coils include two systems for x-direction deflection and for y-direction deflection. Separate currents are applied to these two systems to deflect the beam in the x direction and the y direction independently. Unfortunately, the amount of beam deflection is not in proportion to the amount of current applied to the deflection coils, but is represented as a complex function of the current amount.

In order to deflect the beam with a high precision, the amount of the current applied to the deflector must be corrected. There are two types of corrections. One is a distortion correction for establishing a linear relation between the input and the deflection amount, and the other is a deflection-efficiency correction for correcting coefficients for linear factors. The distortion correction is a time consuming process since it requires data collection at various points within the field. However, the data needs to be collected only one time since a time variation of the distortion is small. On the other hand, correction coefficients can be obtained in a short period of time for the deflection-efficiency correction. However, the deflection-efficiency-correction coefficients must be frequently obtained because the deflection efficiency varies over time due to a change in thermal distribution of the deflector, etc.

In order to calibrate the deflection field, coordinates of the deflector are generally matched with coordinates of the stage, whose measure and orthogonality are guaranteed through the laser-interferometer system. In order to measure the coordinates of the deflector, an actual position of the charged-particle beam must be obtained by directing the beam to mark positions on a wafer and detecting reflected charged particles.

FIG. 1A is an illustrative drawing for explaining a method of detecting mark positions through the charged-particle-beam scan. As shown in FIG. 1A, the charged-particle beam is scanned by the deflector over a mark 306 formed as a groove in a reference chip 305. Reflection detectors 300 and 301, symmetrically arranged with respect to the axis of the beam optical system, detect reflected charged particles. Outputs of the detectors are added by the adder 302. A signal after the addition is successively obtained in synchronism with the scan of the deflector, providing a reflection signal form to be analyzed. When such a process is conducted by using the position-detection mark 306 as shown in FIG. 1A, a reflection signal form as shown in FIG. 1B is obtained. The reflection signal form obtained in this manner is analyzed by an analyzing device 303 to detect a center position of the mark. A result of the analysis is sent from the analyzing device 303 to a control-purpose computer 304, which uses the result in processes such as a correction of the beam. In general, a groove (dent) formed in a wafer (silicon) is used as a mark.

The detection of the position mark described above is conducted at various points by shifting the mark on a wafer through stage movement. In this manner, the deflection-efficiency-correction coefficients for correcting the linear factors and a distortion map of the deflector for the distortion correction are obtained.

In the mark-position-detection method described above, the detected mark positions contain errors. This is because a relative position of the mark with respect to the reflection detectors changes when the mark is detected at various points.

When the mark is detected at various points, an angle at which charged particles are reflected by the mark toward a reflection detector varies depending on a relative position of the mark with respect to the reflection detector. When reflected charged particles are detected in a configuration as shown in FIG. 2A, signal forms as shown in FIG. 2B are obtained. As shown in figures, a reflection signal having a symmetric form without a distortion can be obtained when the mark is positioned at an equal distance from the two reflection detectors. When the mark is positioned at other locations, however, a reflection signal form having an asymmetry is obtained. This is because the angle of the reflection is different for the different reflection detectors.

In addition to the problems of errors regarding the mark-position detection, there is a problem concerning the focusing of the charged-particle beam in the charged-particle-beam exposure device.

FIG. 3 is an illustrative drawing showing a configuration for the focusing of the beam in the related-art charged-particle-beam exposure device. As shown in FIG. 3, an optical system 310, using a type of light not affecting a resist, is provided between a wafer and a charged-particle lens. The optical system 310 includes a light source 311 and a light detector 312. When the wafer is exposed to the charged-particle beam, the light source 311 illuminates light on the wafer, and the light detector 312 detects light reflected from the wafer to measure the height of an exposed surface. Based on the height of the exposed surface, a focusing distance of the charged-particle lens is changed.

Such a related-art charged-particle-beam exposure device has such problems as:

a) when the focusing distance of the reflection path is changed, the deflection path of the charged-particle beam is affected to cause a displacement of the beam position on the wafer surface; and b) since structures under the exposed surface have complex patterns in a LSI device, light reflected from these patterns has an adverse effect of causing errors in the detection of the height.

The problem a) will be described below. In the charged-particle-beam exposure device, deflection coordinates X=(X, Y), having an origin at the axis of the beam optical system, are entered into a correction circuit to obtain corrected deflection coordinates X'=(X', Y').

$$X'=Gx*X+Rx*Y+Dx(X, Y) \quad (1)$$

$$Y'=Ry*X+Gy*Y+Dy(X, Y) \quad (2)$$

Here, G=(Gx, Gy) are correction coefficients concerning the gain, R=(Rx, Ry) are correction coefficients concerning the rotation, and D=(Dx, Dy) are distortions of higher orders other than the gain and the rotation. In the charged-particle-beam exposure device, a current proportional to the corrected deflection coordinates X'=(X', Y') is applied to the deflector to direct the beam at a desired position X=(X, Y) on the wafer.

When the focusing distance of the lens is changed, the beam cannot be directed to the desired position X. Thus, G, R, and the distortion D(X) must be changed in accordance with the change in the focusing distance.

In order to direct the charged-particle beam at a desired position X on a wafer surface having a given focusing distance (height) f, the correction coefficient G, the correction coefficient R, and the distortion D(X) at various heights f must be measured. In this manner, correction coefficients having the height as a variable, i.e., the correction coefficient G(f), the correction coefficient R(f), and the distortion D(X, f), are obtained. Taking these measurements, however, increases the time for adjusting the beam deflection, and leads to the correction circuit being more complex.

The problem b) will be described below. Instead of using the optical system of FIG. 3 to take the real-time measurement of the height at the time of exposure, reference marks provided on each chip to be exposed can be used for the measurement of the height. Namely, the height of each chip is measured by using the reference marks arranged at four corners of the chip to carry out the focusing and the correction. Since the reference marks have the same predetermined structure irrespective of the chips, the use of such marks allows an easy measurement of the height. In this method, however, the reference marks at the four corners must be detected for the measurement of the height each time the exposure is made. Thus, the processing time is increased. Also, the same as the method of measuring the height in real time, errors in the measurements lead to deviation of the focusing. Further, in case that the heights of the reference marks are not measured for some reason, the focusing on the chip surface cannot be carried out.

In addition to the problems of the mark-position-detection errors and the focusing described above, there is another problem concerning the accuracy of exposed patterns in the charged-particle-beam exposure device.

FIG. 4 is an illustrative drawing for explaining a process of the charged-particle exposure on a wafer. The wafer is divided into areas of a 20-mm square. Here, an IC chip pattern or the like exposed on the wafer generally has a size ranging from a 5-mm square to a 20-mm square. When the IC chips are small, four to nine chips are included together in one area. When the IC chips are large, one chip is included in one area. At the time of exposure, the corrections of the gain, the rotation, the distortion are carried out for each area on the wafer. In general, the exposure data is set for each area unit.

The charged-particle-beam exposure device generally has a main deflector capable of deflecting the beam within a large region and a sub-deflector capable of deflecting the beam at high speed within a small region. The main deflector first directs the beam at a predetermined desired position, and, then, the sub-deflector draws a pattern around the predetermined desired position. In FIG. 4, one area is divided into cells (hereinafter called cell fields), in each of which the main deflector can deflect the beam. When a center point of one cell field is aligned with the axis of the beam optical system, the main deflector can deflect the beam over this cell field. Each cell field has a size of a 1-to-2 mm square. Thus, one area is comprised of about 100 cell fields. Further, the cell field is divided into sub-fields having a size of about a 100-$\mu$m square. The sub-deflector can deflect the beam within the sub-field.

The measurements of the deflector-correction data prior to the exposure are conducted within the cell field. Based on the correction data, the correction coefficients of the main-deflector coordinates, the sub-deflector coordinates, and the distortion relative to the stage coordinates are determined. Normally, the correction coefficients of the main deflector are set for each area, and the correction coefficients of the sub-deflector are set for each cell.

The exposure is conducted for a frame, which is a region comprised of a plurality of cell fields arranged in a line. Since the width of the frame is the same as that of a cell field, the beam can be deflected by the main deflector within the width of the frame. For the exposure along a longitudinal direction of the frame, the wafer is successively shifted in the longitudinal direction of the frame through the stage movement. Namely, for the exposure in a transverse direction of the frame, the main deflector deflects the beam for positioning thereof, and the sub-deflector is used for the exposure. For the exposure in the longitudinal direction of the frame, the wafer is successively moved by the stage. After a completion of a one frame exposure, the stage takes a U turn to move the wafer in an opposite direction.

In general, the accuracy of the exposed pattern must be within a 10% tolerance of the exposed pattern. For example, when a 0.15-$\mu$m pattern is exposed, the accuracy must be higher than 0.015 $\mu$m. In order to achieve this accuracy, the beam correction described above must be precisely conducted. Moreover, there is an effect of a thermal drift of the deflectors during the wafer exposure. Thus, the correction coefficients of the main and sub-deflectors obtained prior to the exposure must be updated during the exposure.

In order to achieve a high precision, therefore, the updating of the correction coefficients must be conducted for each cell or more frequently. The correction coefficients stored in a correction operation circuit must be updated during a break of the exposure such as between the cells or between the sub-fields. Unfortunately, the updating of the correction coefficients is a time consuming process. Thus, frequent updating leads to an increase in exposure time, thereby degrading the performance.

In order to obviate this problem, all the correction coefficients may be calculated and transferred to the correction operation circuit during a time period from a data collection prior to the exposure to the beginning of the exposure. Assuming that 40 coefficients are required for one cell, for example, these 40 coefficients must be calculated for about 4000 points when a 6-inch wafer is used. This means that 1-to-5 seconds are required for the calculation. The data transfer also needs a similar time period. Furthermore, a large-volume memory for storing the correction coefficients is needed in the correction operation circuit. Also, when the correction coefficients are updated during the exposure, all the correction coefficients need to be rewritten after the collection of the correction data.

As described above, there are problems of the mark-position-detection errors, the focusing of the beam, and the setting of the correction coefficients in the related-art charged-particle-beam exposure device. A combination of these problems leads to defects of the generated exposure pattern. When counter measures are taken to avoid these defects, the time required for the adjustment and the exposure is increased, and the device becomes undesirably complex.

Accordingly, there is a need for a device and a method of exposing the charged-particle beam which can create accurate exposure patterns with high productivity.

Also, there is a need for a device and a method of exposing the charged-particle beam which can achieve high-accuracy beam focusing and high-accuracy beam positioning without requiring a long time for beam-deflection adjustment.

Also, there is a need for a device and a method of exposing the charged-particle beam which can accurately detect a mark position.

Also, there is a need for a device and a method of exposing the charged-particle beam which can use correction coefficients provided for small units of areas without sacrificing the exposure processing time.

SUMMARY OF THE INVENTION

It is general object of the present invention to provide a charged-particle-beam exposure device which can satisfy the needs described above.

It is another and more specific object of the present invention to provide a device and a method of exposing the charged-particle beam which can create accurate exposure patterns with high productivity.

It is still another object of the present invention to provide a device and a method of exposing the charged-particle beam which can achieve high-accuracy beam focusing and high-accuracy beam positioning without requiring a long time for beam-deflection adjustment.

In order to achieve the above objects according to the present invention, a method of exposing a wafer to a charged-particle beam by directing to the wafer the charged-particle beam deflected by a deflector includes the steps of arranging a plurality of first marks at different heights, focusing the charged-particle beam on each of the first marks by using a focus coil provided above the deflector, obtaining a focus distance for each of the first marks, obtaining deflection-efficiency-correction coefficients for each of the first marks, and using linear functions of the focus distance for approximating the deflection-efficiency-correction coefficients to obtain the deflection-efficiency-correction coefficients for an arbitrary value of the focus distance.

In order to achieve the same objects according to the present invention, a device for exposing a wafer to a charged-particle beam by directing to the wafer the charged-particle beam reflected by a deflector includes a focus coil provided above the deflector, a unit for arranging a plurality first marks at different heights, a unit for focusing the charged-particle beam on each of the first marks by using the focus coil, a unit for obtaining a focus distance for each of the first marks, a unit for obtaining deflection-efficiency-correction coefficients for each of the first marks, and a unit for obtaining the deflection-efficiency-correction coefficients for an arbitrary value of the focus distance by using linear functions of the focus distance for approximating to the deflection-efficiency-correction coefficients.

According to the method and the device described above, the deflection-efficiency-correction coefficients for any focus distance are obtained by simply measuring the deflection-efficiency-correction coefficients and the focus distances for the marks arranged at different heights. Thus, the method and the device can achieve high-accuracy beam positioning without requiring a long time for beam-deflection adjustment.

The above method further includes the steps of positioning a second mark at a center of an optical system of the charged-particle beam, obtaining a first position and a first focus distance of the second mark by focusing the charged-particle beam on the second mark through the focus coil, obtaining a second position of the second mark after shifting the second mark to a second focus distance different from the first focus distance, and using a linear function of the focus distance for approximating to a displacement of the charged-particle beam based on the first position, the second position, the first focus position, and the second focus position to obtain the displacement for an arbitrary value of the focus distance, obtaining a reference focus distance for each of the reference marks provided on the wafer by focusing the charged-particle beam on each of the reference marks through the focus coil, using a function of coordinates on the wafer for approximating the reference focus distance through a least square method to obtain an exposure focus distance for an arbitrary point on the wafer, and carrying out positioning and exposure of the wafer by using the exposure focus distance, the deflection-efficiency-correction coefficients for the exposure focus distance, and the displacement for the exposure focus distance.

The above device further includes a unit for positioning a second mark at a center of an optical system of the charged-particle beam, a unit for obtaining a first position and a first focus distance of the second mark by focusing the charged-particle beam on the second mark through the focus coil, a unit for obtaining a second position of the second mark after shifting the second mark to a second focus distance different from the first focus distance, a unit for obtaining a displacement of the charged-particle beam for an arbitrary value of the focus distance by using a linear function of the focus distance for approximating to the displacement of the charged-particle beam based on the first position, the second position, the first focus position, and the second focus position, a reference-focus-distance obtaining unit for obtaining a reference focus distance for each of reference marks provided on the wafer by focusing the charged-particle beam on each of the reference marks through the focus coil, a unit for obtaining an exposure focus distance for an arbitrary point on the wafer by using a function of coordinates on the wafer for approximating the reference focus distance through a least square method, and a unit for carrying out positioning and exposure of the wafer by using the exposure focus distance, the deflection-efficiency-correction coefficients for the exposure focus distance, and the displacement for the exposure focus distance.

According to the method and the device described above, the displacement of the charged-particle beam is approximated to by the linear function of the focus distance, and, also, the exposure focus distance on the surface of the wafer is approximated by the function of coordinates on the wafer. Thus, higher orders of the deflection distortion dependent on the height need not be measured, so that the time required for the adjustment of the entire system can be shortened. Also, failure to focus the beam at the time of exposure is avoided so as to greatly reduce the blurring of patterns.

It is still another object of the present invention to provide a device and a method of exposing the charged-particle beam which can accurately detect a mark position.

In order to achieve the above object according to the present invention, a method of exposing a wafer to a charged-particle beam by directing to the wafer the charged-particle beam deflected by a deflector, the method comprising the steps of positioning a position-detection mark at predetermined locations, the position-detection mark including heavy metal buried in a substrate which has lower reflectivity than the heavy metal, the heavy metal and the substrate having the same flat surface, and detecting positions of the position-detection mark by using the charged-particle beam.

In order to achieve the same object according to the present invention, a device for exposing a wafer to a charged-particle beam by directing to the wafer the charged-particle beam deflected by a deflector, the device comprising, a wafer stage carrying the wafer to move the wafer, and a position-detection mark provided on the wafer stage, the position detection mark including heavy metal buried in a substrate which has lower reflectivity than the heavy metal, the heavy metal and the substrate having the same flat surface.

According to the method and the device described above, the position detection mark is formed from the heavy metal and the substrate, so that a difference in the reflection intensity between the heavy metal and the substrate can be detected at a time of mark detection. Thus, the use of such a position detection mark eliminates errors in the mark-position detection.

It is a further object of the present invention to provide a device and a method of exposing the charged-particle beam which can use correction coefficients provided for small units of areas without sacrificing the exposure processing time.

In order to achieve the above object according to the present invention, a device exposes a wafer to a charged-particle beam deflected by a deflector, in which each of the frames defined on the wafer is successively exposed to the charged-particle beam while the wafer is continuously shifted through stage movement. The device includes an obtaining unit for obtaining data regarding correction of the deflector in order to correct positioning of the charged-particle beam for a precise exposure of the wafer, a data storing unit for storing the data, a coefficient calculating unit for calculating, based on the data stored in the data storing unit, correction coefficients of the correction for a first frame of the frames prior to an exposure, and for calculating, based on the data stored in the data storing unit, the correction coefficients of the correction for a n+1-th (n:integer) frame of the frames during a period when a n-th frame of the frames is being exposed, a coefficient storing unit for storing the correction coefficients, and a correction calculating unit for correcting the charged-particle beam to expose one of the frames based on the correction coefficients calculated while an immediately previous one of the frames is being exposed.

In order to achieve the same object according to the present invention, a method exposes a wafer to a charged-particle beam in a charged-particle beam exposure device having a main deflector deflecting the charged-particle beam within a first area and a sub-deflector deflecting the charged-particle beam within a second area smaller than the first area, an exposed surface of the wafer being divided into areas, each of the areas being divided into cell fields, each of cell fields corresponding to the first area and being divided into sub-fields, each of the sub-fields corresponding to the second area, the cell fields being arranged in a plurality of lines defining frames on the wafer, each of the frames being successively exposed to the charged-particle beam by moving the wafer through stage movement. The method includes the steps of obtaining data regarding corrections of the main deflector and the sub-deflector prior to an exposure of the wafer in order to correct positioning of the charged-particle beam for a precise exposure of the wafer, calculating correction coefficients of the corrections for a first frame of the frames based on the data prior to the exposure of the wafer, calculating the correction coefficients for a given frame of the frames based on the data while a frame immediately before the given frame is being exposed, and correcting the charged-particle beam to expose one of the frames based on the correction coefficients calculated while a frame immediately before the one of the frames is being exposed.

According to the method and the device, when densely provided complex correction coefficients are set in the device for enhancement of exposure precision, the calculation and storage of the correction coefficients are carried out in parallel with other processes required for the exposure. Therefore, a large amount of calculation is carried out, and the correction coefficients are set, without increasing the processing time for the exposure. That is, high-speed processing the same as the prior-art device can be achieved. Furthermore, since the correction coefficients for only two frames are stored, a large volume memory is not necessary for the storage of the correction coefficients.

Other objects and further features of the present invention will be apparent from the following detailed description when read in conjunction with the accompanying drawings.

BRIEF DESCRIPTION OF THE DRAWINGS

FIG. 5 is an illustrative drawing showing a charged-particle-beam exposure device using a contrast-detection-type mark according to a first principle of the present invention;

FIG. 12 is a flowchart of an exposure process for a wafer by using the device of FIG. 9;

FIG. 14 is an illustrative drawing of a charged-particle-beam exposure device according to a second embodiment of the second principle;

FIG. 17 is a block diagram of a coefficient storing unit according to a second embodiment of the third principle;

FIG. 18 is a block diagram showing an example in which a dual-port memory is used as frame-coefficient storing units of FIG. 17;

FIG. 22 is a table showing an example of a correction-coefficient pattern set by a correction-coefficient-pattern storing unit of FIG. 21;

FIG. 23A is a circuit diagram of an example of a dual-port memory controlled by the configuration of FIG. 17;

FIG. 23B is a chart showing data to be stored in the dual-port memory of FIG. 23A;

FIG. 32 is an illustrative drawing for explaining calculations of correction coefficients;

FIG. 33 is a flowchart of a process of correcting the deflection efficiency of the sub-deflector of FIG. 28 according to a second embodiment of the fourth principle;

FIG. 38 is a block diagram of an exemplary driving unit of a main deflector of FIG. 36;

FIGS. 39A through 39C are time charts showing signals observed at various points of FIG. 38;

FIG. 40 is an block diagram of a main part of a charged-particle-beam exposure device according to a first embodiment of a sixth principle of the present invention;

FIGS. 41A through 41D are time charts showing signals observed at various points of FIG. 40;

FIG. 44A is a time chart showing a clock provided from a clock unit of FIG. 36 to a digital-to-analog converter and a clock generating circuit of FIG. 42;

FIG. 44B is a time chart showing an output signal observed at a node D of FIG. 42 when a pulse generating circuit of FIG. 42 is not provided;

FIG. 44C is a time chart showing a clock provided from the clock generating circuit to a DAC of FIG. 42;

FIG. 44D is a time chart showing a correction pulse signal output from an IV converter of FIG. 42;

FIGS. 45A and 45B are time charts showing output voltages obtained through a simulation;

FIGS. 66A and 66B are illustrative drawings for explaining trajectories of the charged-particle beam deflected by the deflectors;

FIG. 68 is a flowchart of a process of determining focusing A1 to correct a position of a cross-over image in FIG. 64;

DETAILED DESCRIPTION OF THE PREFERRED EMBODIMENTS

Figure 1A:
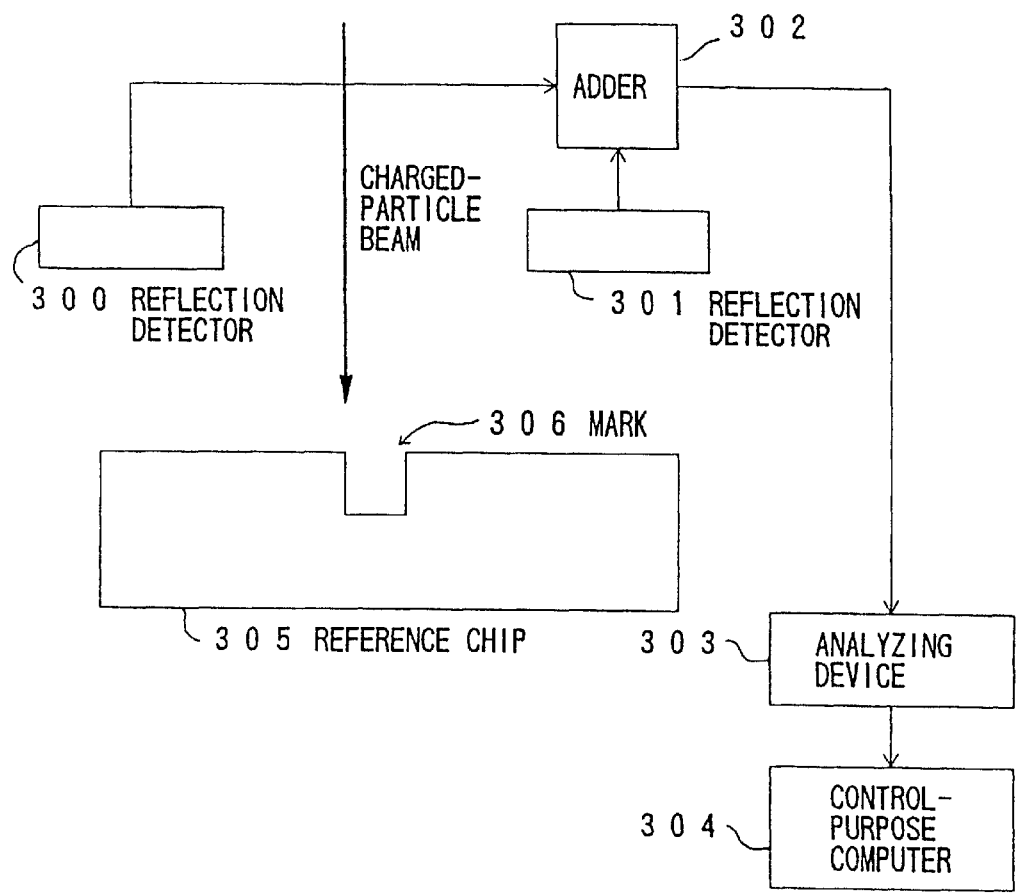
FIG. 1A is an illustrative drawing for explaining a method and a device for detecting a mark position through charged-particle-beam scan.
Figure 1B:
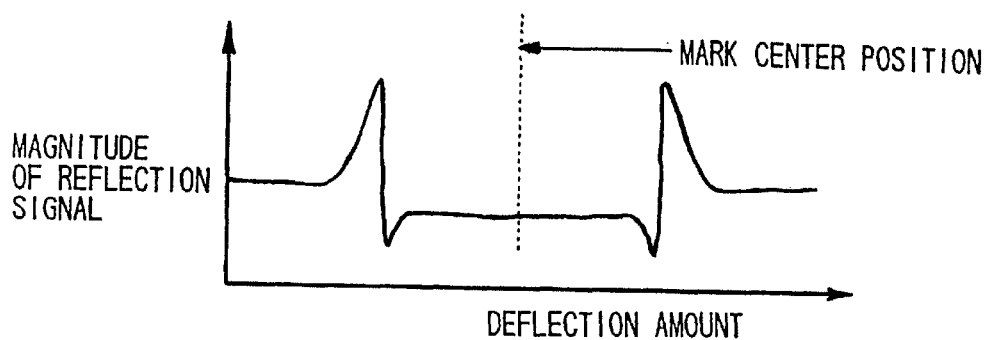
FIG. 1B is an illustrative drawing showing a signal form for detecting a mark position obtained by the device of FIG. 1A.
Figure 2A:
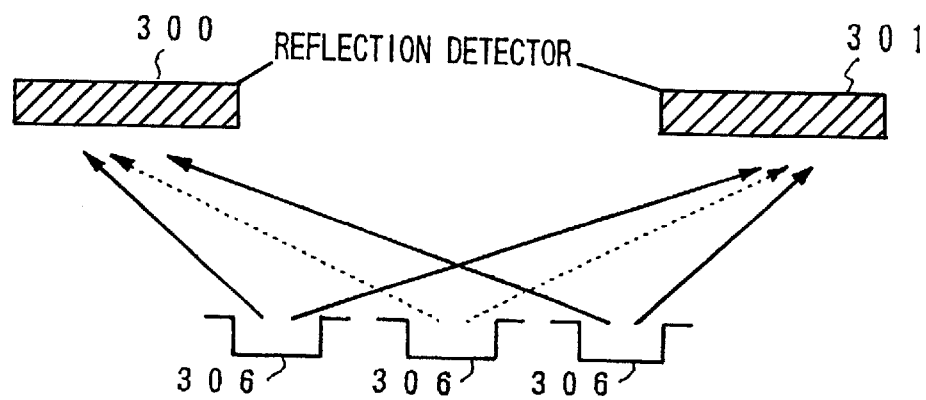
FIGS. 2A and 2B are illustrative drawings for explaining asymmetry observed in the signal form when the mark position is detected.
Figure 2B:
Figure 3:
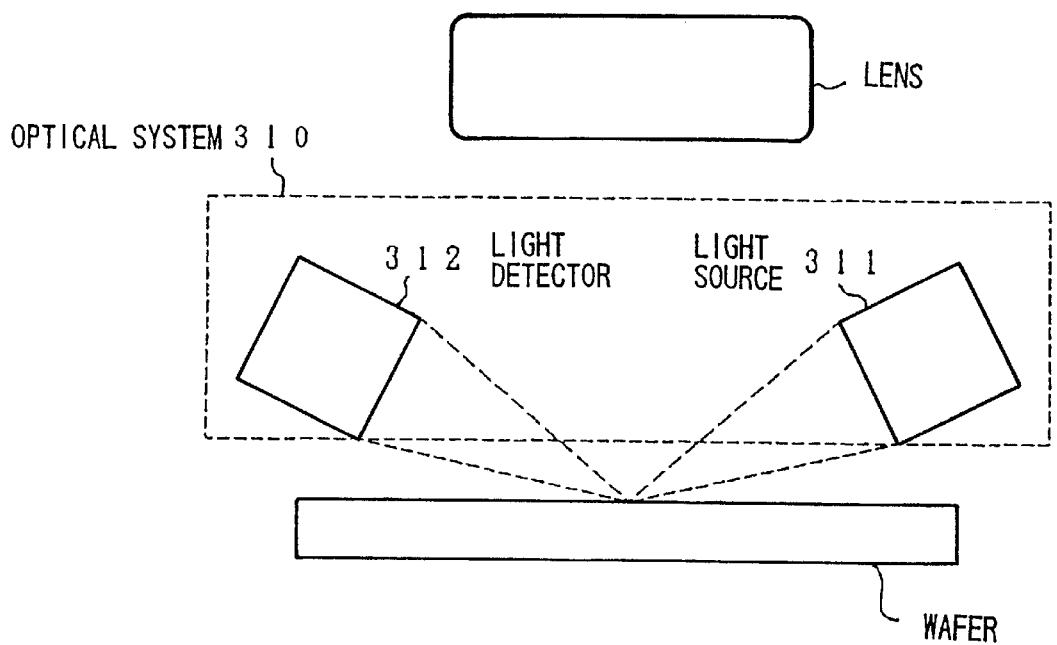
FIG. 3 is an illustrative drawing showing a configuration for the focusing of the beam in a related-art charged-particle-beam exposure device.
Figure 4:
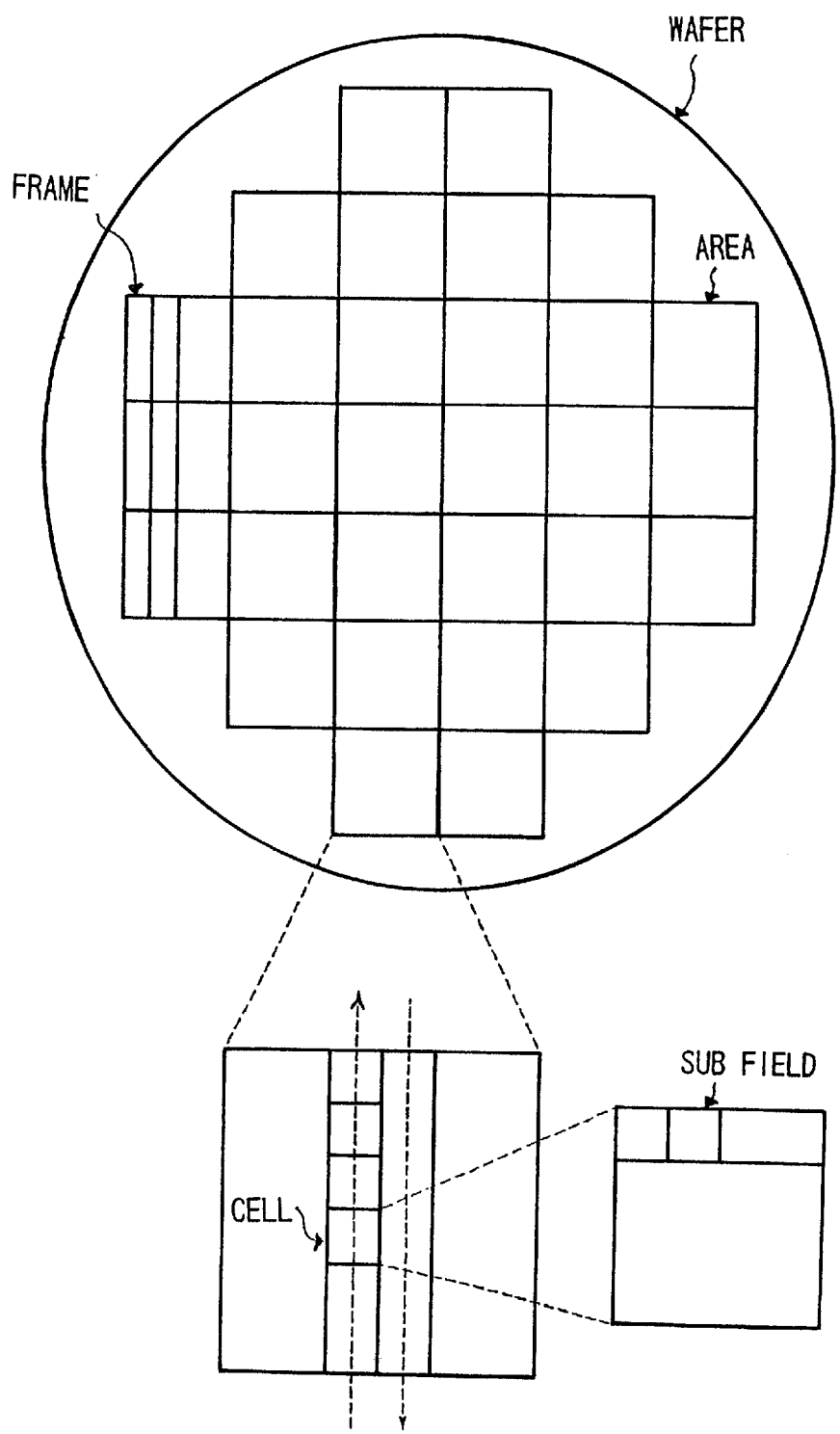
FIG. 4 is an illustrative drawing for explaining a process of the charged-particle exposure on a wafer.

In the following, principles and embodiments of the present invention will be described with reference to the accompanying drawings.

A first principle of the present invention will be described below. The first principle is concerned with a device and a method of exposing, using a charged-particle beam which can accurately detect a mark position for the purposes of beam correction and beam positioning.

The first principle of the present invention uses a mark of buried heavy metal instead of a dent mark. When the dent mark is used, charged particles reflected by the dent with a strong reflection in a certain direction are detected. Thus, depending on the detector's position relative to the dent mark, the detector may detect a strong reflection or may detect a weak reflection. Accordingly, if the detector's relative position to the mark is different, a magnitude and a profile of the detected reflection signal will be different. As a result, when a dent mark is used, the detected reflection signal is asymmetrically deformed unless the detectors are arranged symmetrically with respect to the mark.

For a mark defined by a buried heavy metal according to the first principle of the present invention, a mechanism of detecting the mark is principally different from that of the dent mark (hereinafter called an edge-detection-type mark). For the mark of the first principle, a difference in the reflection intensity between the heavy metal and the background (silicon) is detected. Namely, a contrast in the reflection intensity is detected for the mark of the first principle. Hereinafter, the mark utilizing a difference in the reflection intensity is called a contrast-detection-type mark.

According to the first principle, the use of the contrast-detection-type mark eliminates errors in the mark-position detection.

FIG. 5 is an illustrative drawing showing a charged-particle-beam exposure device 10 using the contrast-detection-type mark. The charged-particle-beam exposure device 10 includes a charged-particle-beam generator 11, a deflector 12, reflection detectors 13 and 14, an adder 15, a signal analyzing unit 16, a XY stage 17, and a wafer holder 18. The wafer holder 18 includes a reference chip 19 and a wafer 20. Each of the reference chip 19 and the wafer 20 includes a contrast-detection-type mark 21 and positioning marks 22. The charged-particle-beam exposure device 10 also includes a control unit (not shown) to control the charged-particle-beam generator 11, the deflector 12, the signal analyzing unit 16, the XY stage 17, etc.

Figure 6A:
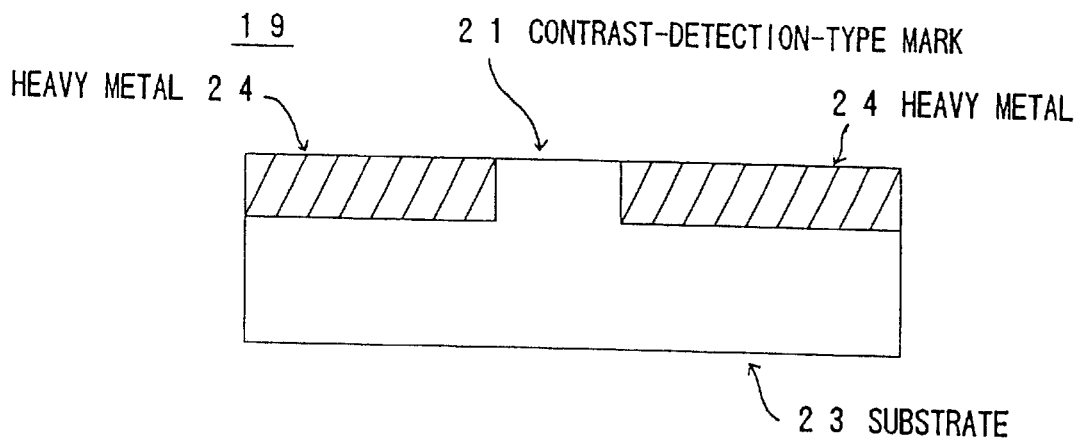
FIGS. 6A and 6B are illustrative drawings showing examples of the contrast-detection-type mark formed in a reference chip.
Figure 6B:
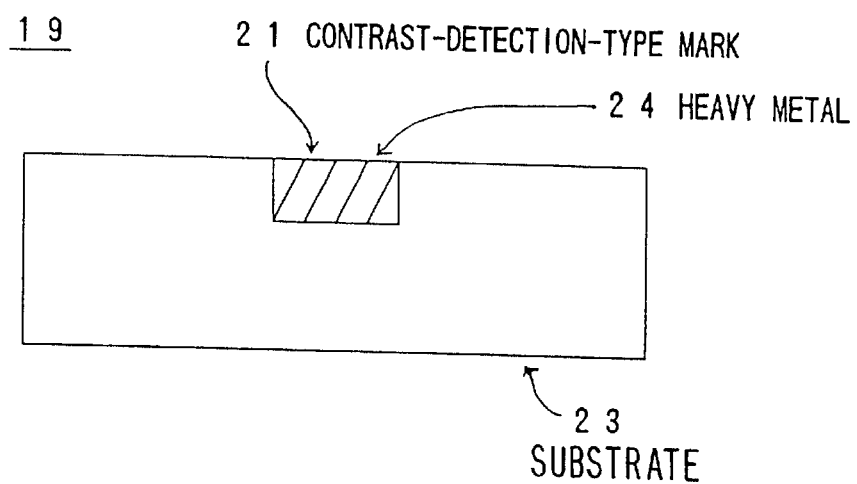

FIGS. 6A and 6B are illustrative drawings showing examples of the contrast-detection-type mark 21 formed in the reference chip 19. As shown in FIGS. 6A and 6B, the contrast-detection-type mark 21 is formed by burying heavy metal 24 such as Au, Ta, W, etc., in a substrate 23 such as silicon. A surface of the reference chip 19 can be made smoothly flat within a 0.1-$\mu$m accuracy by using the CMP (chemical mechanical polishing) method or the like. The CMP method is a well-known mechanical polishing method using a chemical polishing substance, and a description thereof will be omitted.

As shown in FIG. 5, a charged-particle beam emitted from the charged-particle-beam generator 11 is deflected by the deflector 12, and is directed to the reference chip 19 or to the wafer 20. At the time of obtaining the distortion map and the deflection-correction coefficients, the beam is scanned over the contrast-detection-type mark 21 of the reference chip 19. The reflection detectors 13 and 14 symmetrically arranged with respect to the axis of the beam optical system detect reflected charged particles, and the adder 15 adds outputs of the detectors. A detected reflection signal after the addition is measured in synchronism with the scan of the deflector, and, then, is analyzed by the signal analyzing unit 16 to detect a center position of the mark. The contrast-detection-type mark 21 is successively positioned at predetermined locations by the XY stage 17. Thus, errors of the mark-position detections by using the deflector 12 can be known, based on the coordinates of the XY stage 17.

The mark-position detection described above is carried out for various positions of the mark by successively shifting the contrast-detection-type mark 21 through the XY stage 17. In this manner, the distortion map and the deflection-efficiency-correction coefficients of the deflector 12 are obtained.

Since an exposure stage comes immediately after the growth of a layer to be patterned in the LSI process, most of the positioning marks 22 on the wafer 20 are edge-detection-type marks. In order to position the wafer 20, therefore, the positioning marks 22 of the edge-detection type are successively positioned at a center of the beam optical system to be detected. At the center of the beam optical system, position-detection errors are not generated even if the edge-detection-type mark is used. In this manner, the precise position and rotation of a pattern under a surface of the wafer 20 can be known.

Figure 7:
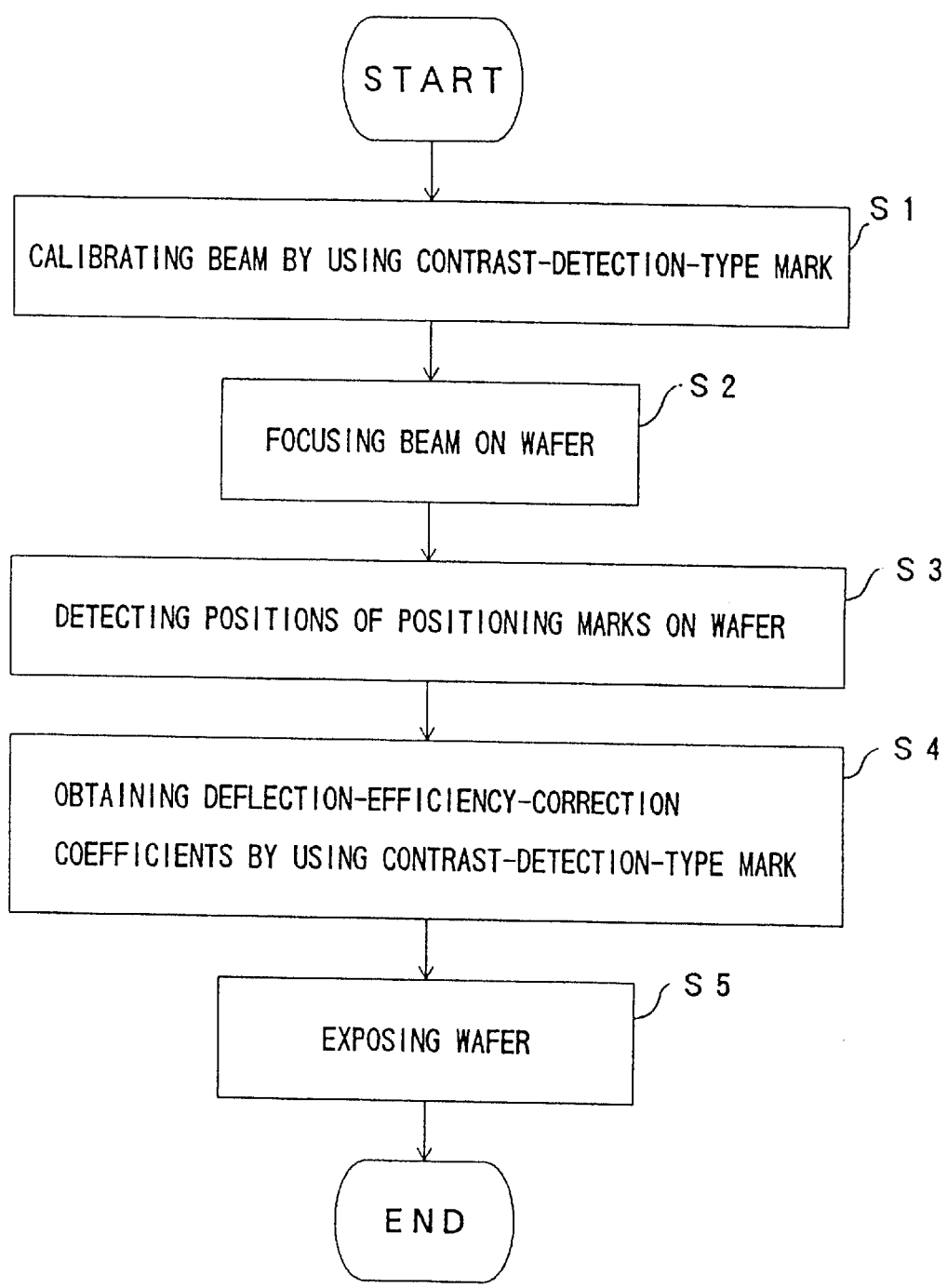
FIG. 7 is a flowchart of a process of exposing a wafer in the charged-particle-beam exposure device of FIG. 5 according to a first embodiment of the present invention.

FIG. 7 is a flowchart of a process of exposing the wafer 20 in the charged-particle-beam exposure device 10 according to a first embodiment of the present invention.

At a step S1, a deflection-distortion map is obtained by using a contrast-detection-type mark on a reference chip to calibrate the charged-particle beam.

At a step S2, marks on a wafer are scanned, and the beam is focused on the wafer.

At a step S3, a plurality of positioning marks on the wafer are successively positioned at a center of the field through the XY stage to detect the mark positions. In this manner, the precise position and rotation of patterns under a surface of the wafer are known.

At a step S4, deflection-efficiency-correction coefficients are obtained by using the contrast-detection-type mark.

At a step S5, a pattern is exposed on the wafer. This ends the procedure.

When a long-time exposure is carried out, the deflection-efficiency-correction coefficients may be repeatedly obtained at the step S4 at predetermined time intervals to update these coefficients.

According to the procedure described above, the distortion map and the deflection-efficiency-correction coefficients are obtained by using the contrast-detection-type marks. Thus, the precise calibration and correction of the beam deflector can be carried out. Also, the positioning marks are detected at the center of the field, i.e., at the center of the beam optical system, so that the precise positions and rotations of the underneath patterns can be known. Therefore, exposed patterns are precisely connected across field borders.

Figure 8:
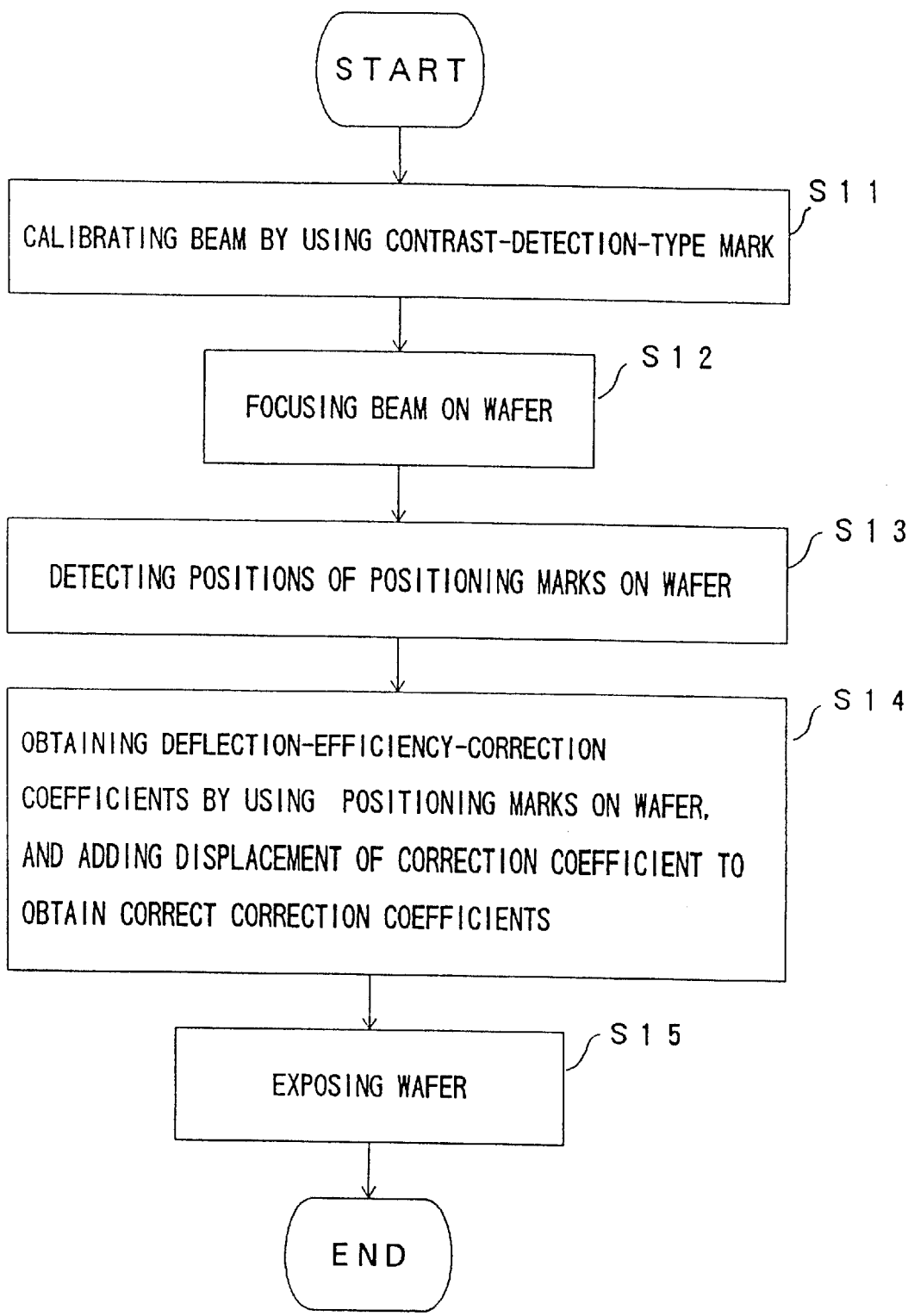
FIG. 8 is a flowchart of another process of exposing the wafer in the charged-particle-beam exposure device of FIG. 5 according to a second embodiment of the present invention.

FIG. 8 is a flowchart of another process of exposing the wafer 20 in the charged-particle-beam exposure device 10 according to a second embodiment of the present invention. In the second embodiment, the positioning marks of the edge-detection type on the wafer are used to obtain the deflection-efficiency-correction coefficients. Errors in the correction coefficients obtained by using the edge-detection-type marks have a repeatability in the same device if the marks have the same structure. Thus, displacements commensurate with the errors measured in advance can be added to the correction coefficients to obtain the correct correction coefficients.

At a step S11, a deflection-distortion map is obtained by using a contrast-detection-type mark on a reference chip to calibrate the charged-particle beam.

At a step S12, marks on a wafer are scanned, and the beam is focused on the wafer.

At a step S13, a plurality of positioning marks on the wafer are successively positioned at a center of the field through a XY stage to detect the mark positions. In this manner, the precise position and rotation of patterns under a surface of the wafer are known.

At a step S14, deflection-efficiency-correction coefficients are obtained by using the positioning marks on the wafer. Furthermore, displacements of the correction coefficients measured in advance are added to the obtained deflection-efficiency-correction coefficients to obtain correct correction coefficients.

At a step S15, a pattern is exposed on the wafer. This ends the procedure.

When a long-time exposure is carried out, the deflection-efficiency-correction coefficients may be repeatedly obtained at the step S14 at predetermined time intervals to update these coefficients.

According to the procedure described above, an accurate distortion map is obtained by using the contrast-detection-type marks. Also, the deflection-efficiency-correction coefficients are obtained by using the positioning marks on the wafer, and the displacements measured in advance are added to the obtained correction coefficients to obtain correct correction coefficients. Also, the positioning marks are detected at the center of the field, i.e., at the center of the beam optical system, so that the precise positions and rotations of the underneath patterns can be known. Therefore, exposed patterns are precisely connected across field borders.

According to the first and second embodiments of the first principle of the present invention, exposed patterns are precisely connected across field borders even for underneath patterns having the positioning marks of the edge-detection type, such underneath patterns being used in the patterning of semiconductor integrated circuits.

In the following, a second principle of the present invention will be described below. The second principle is concerned with a device and a method of exposing a charged-particle beam which can achieve high-accuracy beam focusing and high-accuracy beam positioning without requiring a long time for beam-deflection adjustment.

The second principle of the present invention uses the deflection-correction coefficients varying in proportion to the focusing distance after focusing the beam by a lens (focus coil) provided above the deflector.

In order to focus the beam on a wafer surface at different heights without greatly changing the deflected-beam path, a lens (focus coil) provided above the main and sub-deflectors must be used. When the beam is focused in this manner, the deflected-beam path is not affected by the focusing of the beam. However, the deflected beam is not incident on the wafer surface at a normal angle. Therefore, when the height of the wafer surface is varied, a position of the deflected-beam path on the wafer surface is changed even though the deflected beam remains on the same path.

In this case, a displacement of the position is proportional to a change in the height and the amount of the deflection. Thus, it is sufficient to change the coefficients G and R in proportion to the height f.

$$G(f) = g_0 + g_1 * f \quad (3)$$

$$R(f) = r_0 + r_1 * f \quad (4)$$

Here, the distortion D(X) is not dependent on the height f.

When a center axis of the focus coil is displaced relative to the axis of the beam, the beam is deflected by the excitation of the focus coil, so that the deflection field on the wafer surface is displaced in its entirety. When the displacement of the center axis is small, however, an angle of the beam deflection is proportional to the focus value. Thus, the displacement δ can be regarded as being proportional to the focus value.

$$\delta(f) = \delta_0 + \delta_1 * f \quad (5)$$

According to the second principle of the present invention, higher orders of the deflection distortion dependent on the height need not be measured, so that the time required for the adjustment of the entire system can be shortened. Also, failure to focus the beam at the time of exposure is avoided, thereby to greatly reduce the blurring of patterns.

Figure 9:
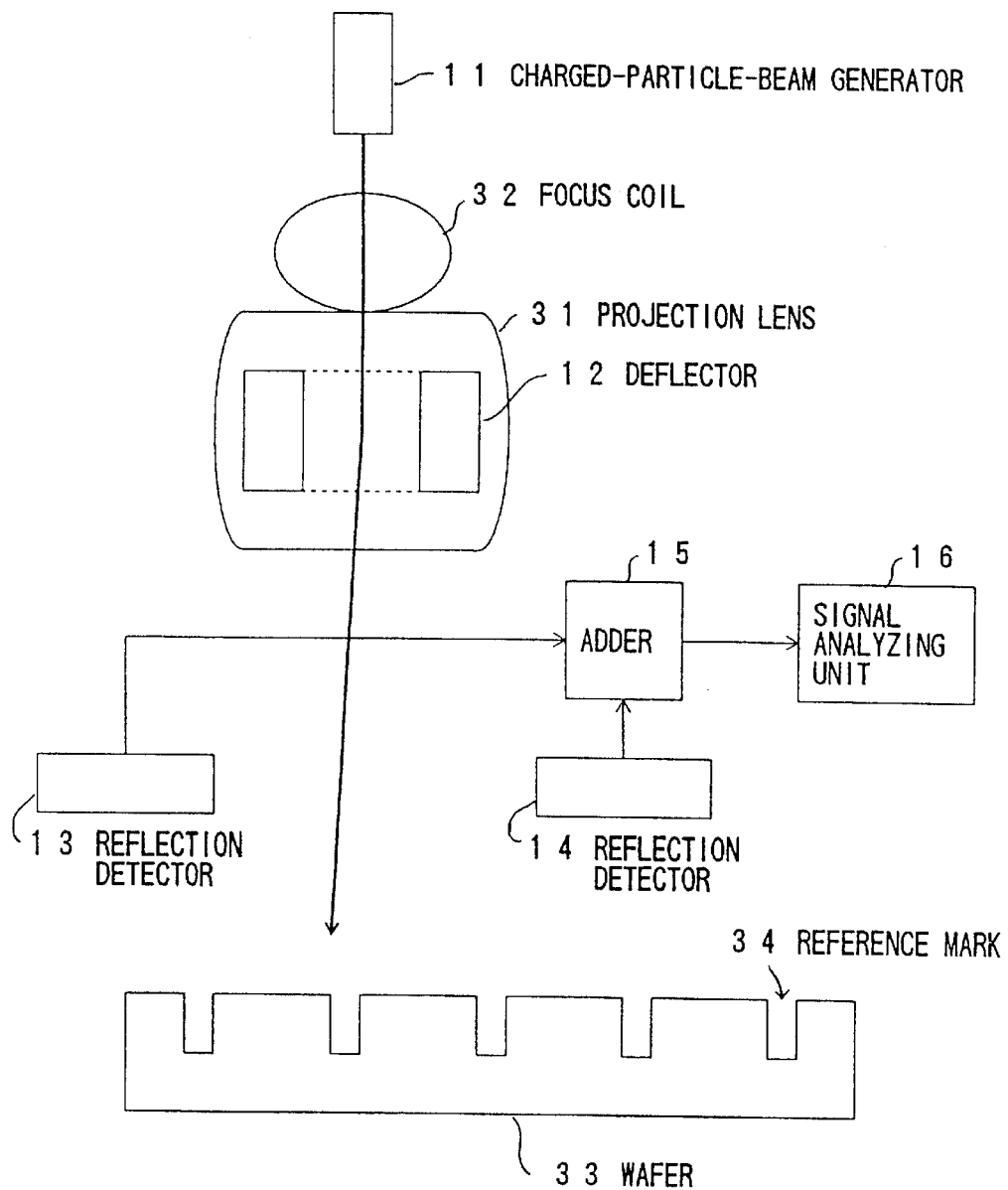
FIG. 9 is an illustrative drawing of a charged-particle-beam exposure device according to a first embodiment of the second principle.

FIG. 9 is an illustrative drawing of a charged-particle-beam exposure device according to a first embodiment of the second principle.

A charged-particle-beam exposure device 30 of FIG. 9 includes the charged-particle-beam generator 11, the deflector 12, the reflection detectors 13 and 14, the adder 15, the signal analyzing unit 16, a projection lens 31, and a focus coil 32. The charged-particle-beam exposure device 30 also includes the XY stage 17 (not shown) and a control unit (not shown) in the same manner as in FIG. 5 to control the charged-particle-beam generator 11, the deflector 12, the signal analyzing unit 16, the XY stage 17, the projection lens 31, the focus coil 32, etc. In FIG. 9, the same elements as those of FIG. 5 are referred by the same numerals, and a description thereof will be omitted. A charged-particle beam emitted from the charged-particle-beam generator 11 exposes a predetermined pattern on a wafer 33. On the wafer 33 are provided reference marks 34.

The focusing of the beam is carried out not by the projection lens 31 provided at the bottom but by the focus coil 32. As shown in FIG. 9, the focus coil 32 is provided separately from the beam-deflection field of the deflector 12. By changing the amount of an excitation current applied to the focus coil 32, it is possible to focus the beam on a wafer surface without changing a deflected-beam path.

Figure 10:
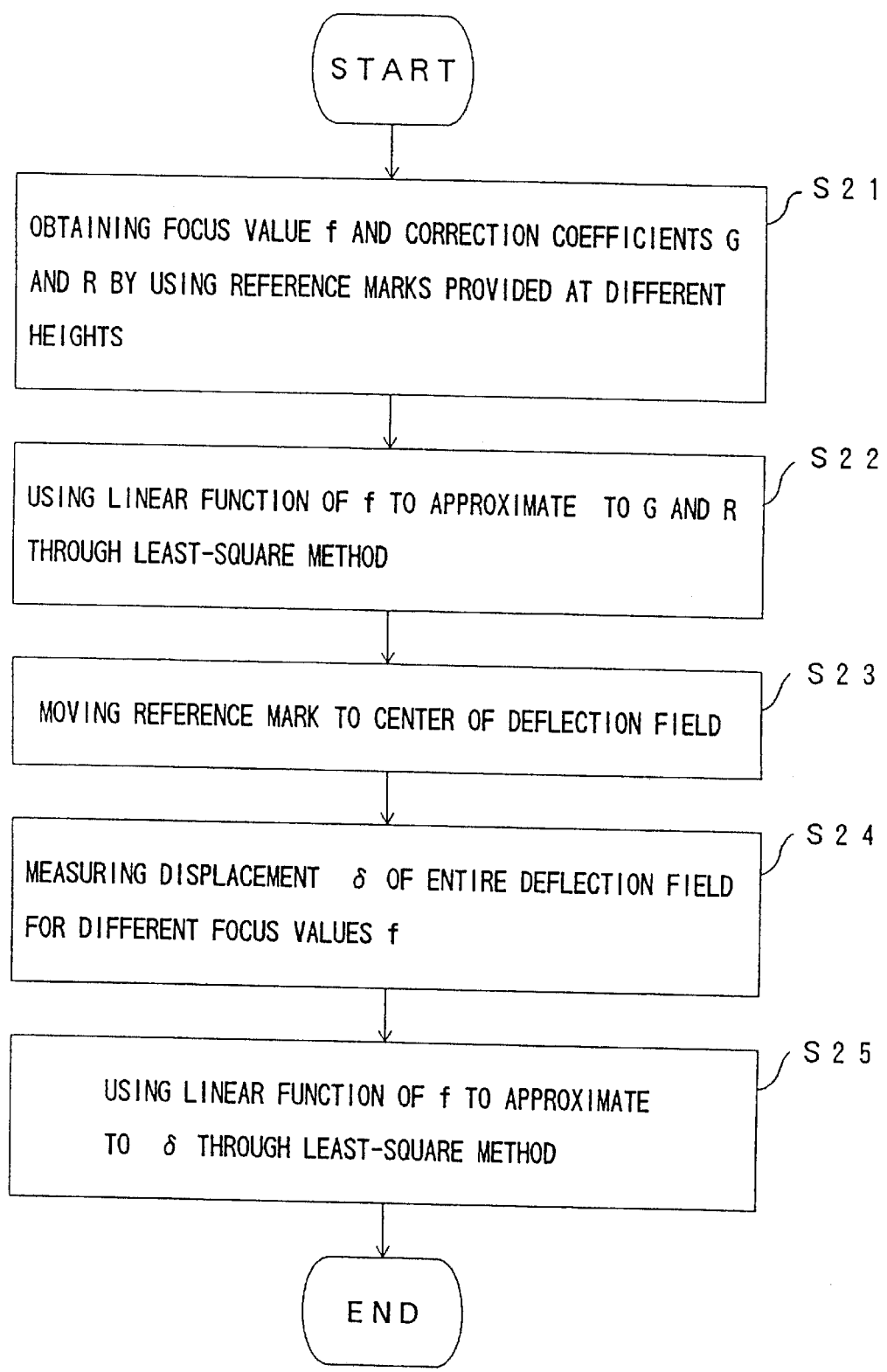
FIG. 10 is a flowchart of a process of obtaining deflection-efficiency-correction coefficients as well as a displacement by using the device of FIG. 9.

FIG. 10 is a flowchart of a process of obtaining the deflection-efficiency-correction coefficients G(f) and R(f) as well as the displacement δ(f).

Figure 11A:
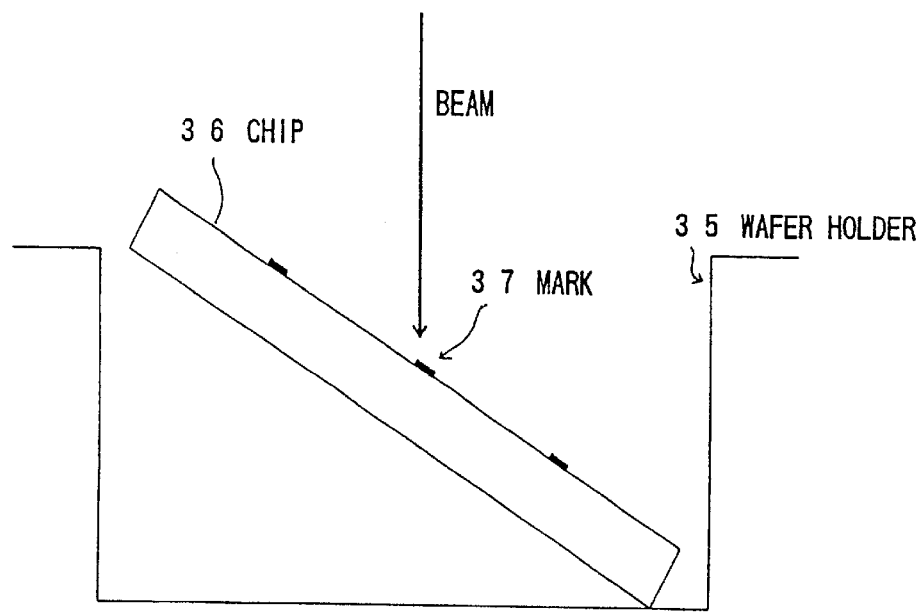
FIGS. 11A through 11C are illustrative drawing showing chips and marks used in the process of FIG. 10.

At a step S21, a focus value (just focus) $f_i$ and the correction coefficients $G(f_i)$ and $R(f_i)$ are measured by using three reference marks $M_i$ (i=1, 2, 3) provided at the height $f_i$ (i=1, 2, 3), respectively. As the reference marks $M_i$, marks 37 formed on a chip 36 held in a slanted position in a wafer holder 35 can be used as shown in FIG. 11A. A method of achieving a just focus for obtaining the focus value $f_i$ will be described later.

Figure 11B:
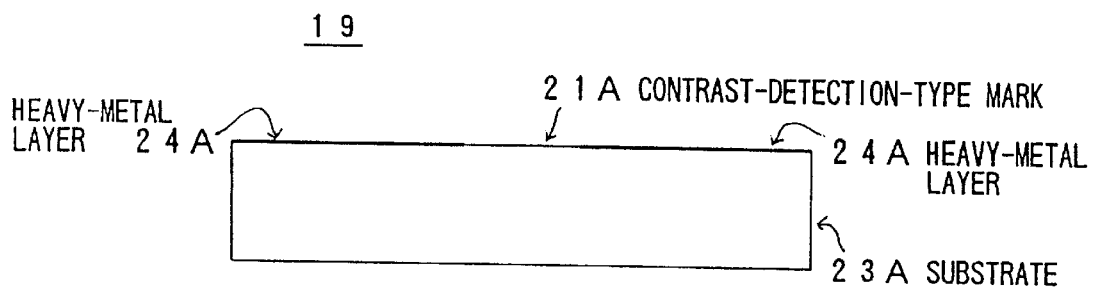
Figure 11C:
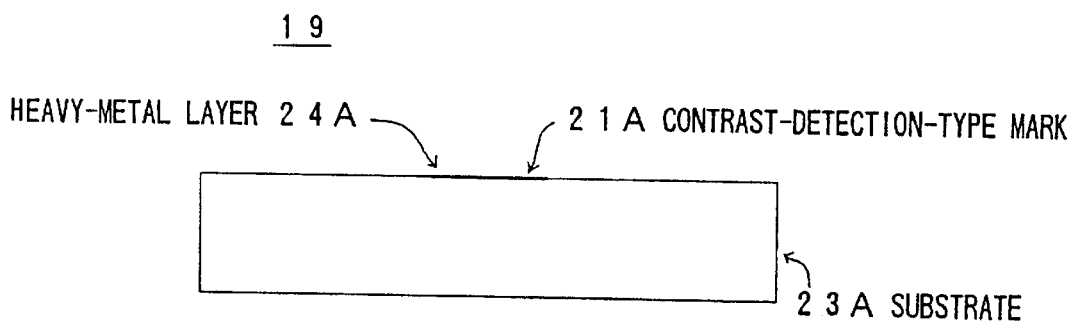

Dent marks may be used as the reference marks here. Also, the contrast-detection-type marks with a buried heavy metal according to the first principle of the present invention may be used as the reference marks. Alternately, contrast-detection-type marks as shown in FIGS. 11B and 11C may be used as the reference marks. In FIGS. 11B and 11C, a contrast-detection-type mark 21A is formed by patterning a heavy-metal layer 24A of such metal as Au, Ta, W, or the like on a the substrate 23A. The heavy-metal layer 24A for forming the contrast-detection-type mark 21A has a thickness of about 0.2 μm.

At a step S22, $G(f) = g_0 + g_1 * f$ is fitted by applying the least-square method to $G(f_i)$ (i=1, 2, 3) obtained above for the three points, so that the coefficients $g_0$ and $g_1$ are obtained. $R(f) = r_0 + r_1 * f$ is fitted by applying the least-square method to $R(f_i)$ (i=1, 2, 3) obtained above for the three points, so that the coefficients $r_0$ and $r_1$ are obtained.

At a step S23, the reference mark M is moved to the center of the deflection field.

At a step S24, the reference mark M is detected by using the just focus value f, a focus value f+df, and a focus value f−df (df is a change in the focus value). By doing so, δ(f), δ(f+df), and δ(f−df) representing the displacements of the entire deflection field depending on the focus value are measured.

At a step S25, $\delta(f) = \delta_0 + \delta_1 * f$ is fitted by applying the least-square method to δ(f), δ(f+df), and δ(f−df) obtained above, so that the coefficients $\delta_0$ and $\delta_1$ are obtained. This ends the procedure.

In this manner, the deflection-correction coefficients G(f) and R(f) as well as the displacement δ(f) are easily and quickly obtained. Use of these values for exposure makes it possible to generate a precise exposure pattern.

FIG. 12 is a flowchart of an exposure process for the wafer 33.

At a step S31, a plurality (m) of chips to be focused on are selected based on information about a chip arrangement on the wafer 33.

At a step S32, the beam is directed to a mark on the wafer 33 to measure the focus value $f_0$. Here, this mark is a mark for the beam adjustment located near the center of the beam optical system.

At a step S33, the beam is successively directed to the reference marks 34 located at coordinates $(X_i, Y_i)$ in the m selected chips, so that the focus values $f(X_i, Y_i)$ are obtained.

At a step S34, an interpolation function F(X, Y) is fitted to the focus values $f(X_i, Y_i)$ by applying the least-square method, wherein the interpolation function F(X, Y) is provided as:

k+1<n $$F(X, Y) = \Sigma A_{k1} \cdot X^k \cdot Y^l \quad (6)$$

k,l

Through the least-square fitting, the coefficients $A_{k1}$ are obtained. Here, the highest order n of the interpolation function is predetermined based on a flatness and a distortion of the wafer 33.

At a step S35, the positioning of the beam on the wafer 33 and an exposure thereof is carried out by using the focus distances obtained from the interpolation function and the deflection-efficiency-correction coefficients obtained from the focus distances. Namely, the focus value F(X, Y) is obtained by using a coordinate (X, Y) to be exposed on the wafer 33. Then, the focus value f of the focus coil 32 is set to F(X, Y), and the deflection-efficiency-correction coefficients G(f) and R(f) of the deflector 12 are set in accordance with the equation (3) and (4), respectively. Further, the displacement obtained by the equation (5) is incorporated in the deflection data of the deflector 12 to cancel the displacement.

Figure 13A:
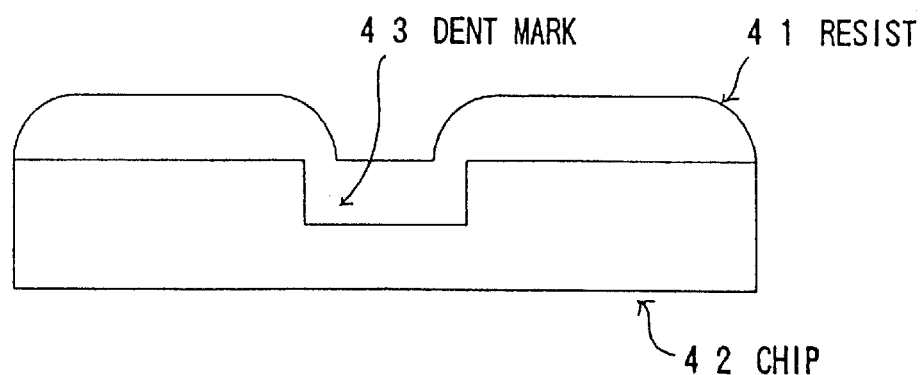
FIGS. 13A and 13B are illustrative drawings for explaining a method of detecting a just focus value of the charged-particle beam.
Figure 13B:

FIGS. 13A and 13B are illustrative drawings for explaining a method of detecting the just focus (i.e., precision focus) value of the charged-particle beam.

The charged-particle beam is scanned over a dent mark 43 in a chip 42 covered with a resist 41, and reflected charged particles are detected. An exemplary detected reflection signal is shown in FIG. 13B. In order to obtain the just focus value, the reflection signal of FIG. 13B is successively measured as the focusing of the beam is varied. Then, a reflection signal having the steepest slope at an edge indicated by an arrow in FIG. 13B is selected from the reflection signals of various focus values. The focus value of this selected reflection signal is the just focus value. The same method can be used for obtaining a just focus value for a contrast-detection-type mark.

FIG. 14 is an illustrative drawing of a charged-particle-beam exposure device according to a second embodiment of the second principle. In FIG. 14, the same elements as those of FIG. 9 are referred by the same numerals, and a description thereof will be omitted. A charged-particle-beam exposure device 50 of FIG. 14 includes the XY stage 17 (not shown) and a control unit (not shown) in the same manner as in FIG. 5 to control the charged-particle-beam generator 11, the deflector 12, the signal analyzing unit 16, the XY stage 17, the projection lens 31, the focus coil 32, etc.

In FIG. 14, the charged-particle-beam exposure device 50 also includes a light sensor 51 and a height detector 52. The light sensor 51 illuminates light on the wafer 33, and detects light reflected therefrom. Here, light which does not have a photosensitive effect on the wafer 33 is used. An output from the light sensor 51 is provided to the height detector 52. The height detector 52 measures the height of a surface of the wafer 33 based on the output from the light sensor 51. In this manner, when the reference marks 34 have such a structure that the height thereof cannot be detected by the beam scan, the height of the mark on the wafer is optically measured by using the height detector 52.

Here, the height $f_o$ optically measured is different from the focus value (focus distance) f which is used for the charged-particle beam. In order to convert the height $f_o$ to the focus value f, a difference $f_{od}$ between the height and the focus value should be obtained. By using a reference mark to which both the optical measurement method and the beam measurement method can be applied, the difference $f_{od}$ is obtained as $f_o - f$. This process may be carried out only once in advance. In order to perform the focusing and calibration of the beam, the focus value f can be calculated as $f_{o-fod}$.

According to the first and second embodiments of the second principle of the present invention, the focus value F(X, Y) at any point (X, Y) on the wafer can be obtained in a short period of time. Based on the obtained focus value, the deflection-efficiency-correction coefficients and the displacement, which are dependent on the focus value, are easily obtained. Even in the case that the focusing of the beam fails for a certain reference mark or that the obtained focus values contain errors to some extent, precise focusing of the beam is still possible because the interpolation function serves to smooth out a distribution of focus values. Also, there is a case in which the reference marks have such a structure that the focusing of the beam is difficult for these marks. In this case, the height of the mark is measured by the optical measurement method, so that the focus value of the focus coil can be determined.

Furthermore, instead of measuring the focus values at the same time as exposure or measuring the focus values for each chip, a global alignment method used in positioning by an optical stepper may be used for the focusing of the beam. In this case, a variation of the measurements or a deviation of the focus point can be eliminated.

In the following, a third principle of the present invention will be described. The third principle is concerned with a device and a method of exposing the charged-particle beam which can use correction coefficients provided for small units of areas without sacrificing the exposure processing time.

In the third principle of the present invention, data for obtaining the correction coefficients is collected and stored in a memory area prior to an exposure process. Then, the correction coefficients used for a first frame are calculated from the data and stored prior to an exposure of the first frame. After that, the correction coefficients used for a N+1-th frame are calculated from the data and stored during an exposure of a N-th frame.

Memory means for storing the two-frame correction coefficients is a conventional memory having enough storage capacity. This memory means may have a memory area storing all the correction coefficients for two frames such that the correction coefficients for one frame can be written while the correction coefficients for the other frame is read. In this case, writing/reading of the correction coefficients are smoothly conducted. Such memory means includes a buffer memory, a FIFO memory, a dual-port memory of a certain type, and a combination of these.

In the third principle of the present invention, when densely provided complex correction coefficients are set in the device for enhancement of exposure precision, the calculation and storage of the correction coefficients are carried out in parallel with other processes required for the exposure. Therefore, a large amount of calculation is carried out, and the correction coefficients are set, without increasing the processing time for the exposure. That is, high-speed processing the same as the prior-art device can be achieved. Furthermore, a large volume memory is not necessary for the memory means. Since the correction coefficients for only two frames are stored in the memory means, updating of cell-correction coefficients and the like can be easily and quickly carried out during the exposure.

Moreover, the data for the deflector correction may be newly collected during an exposure of the wafer, and the correction coefficients are calculated by using the newly collected data and stored in the memory means. Thus, all the correction coefficients stored in the memory area do not have to be updated even when new correction data becomes necessary during the exposure. Thus, a precise exposure pattern is created by using densely distributed correction coefficients without increasing the exposure processing time.

Figure 15:
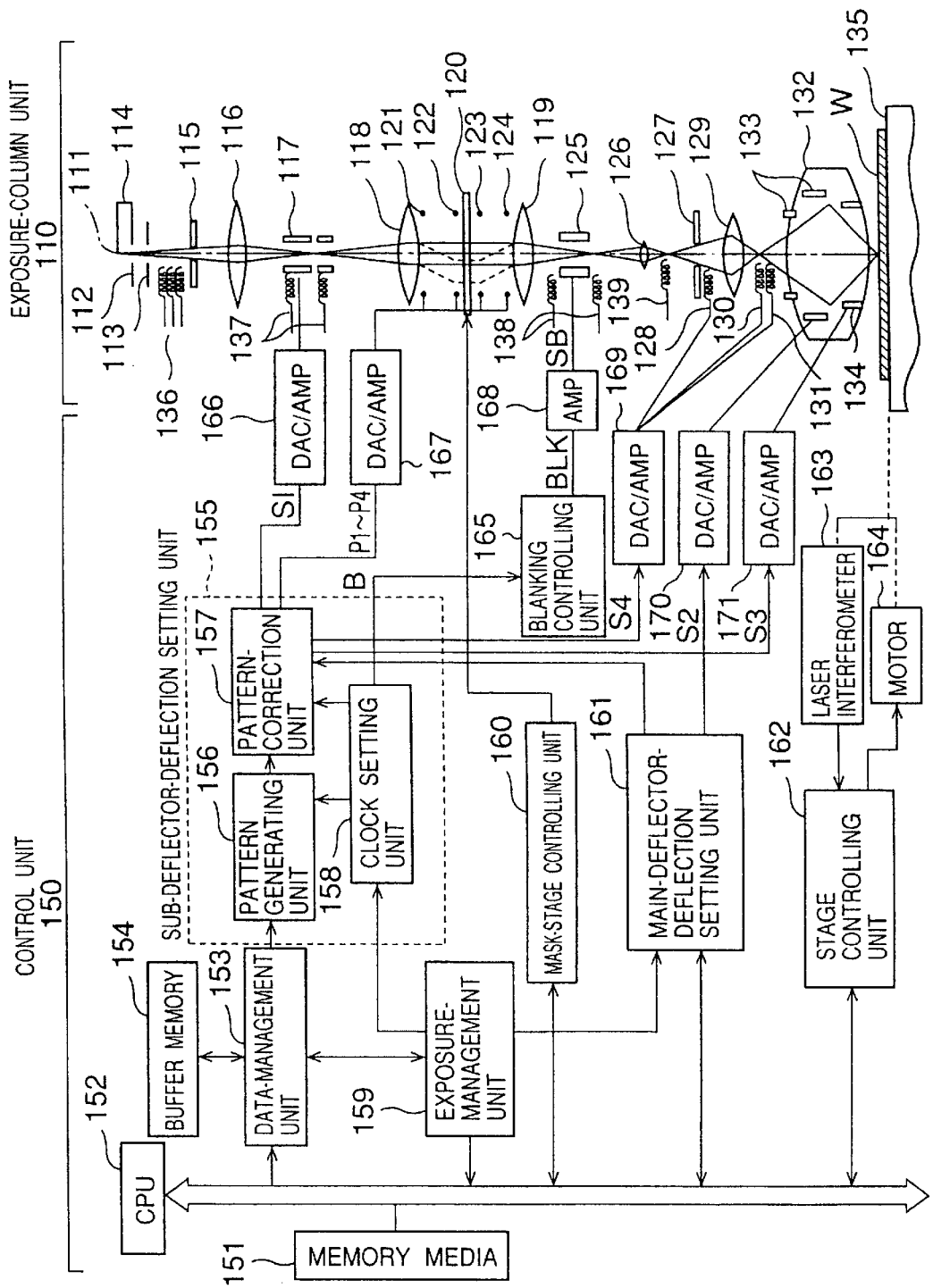
FIG. 15 is a block diagram of an exemplary charged-particle-beam exposure device for conducting an exposure process according to a third principle of the present invention.

FIG. 15 is a block diagram of an exemplary charged-particle-beam exposure device for conducting an exposure process according to the third principle of the present invention.

In FIG. 15, a charged-particle-beam exposure device 100 includes an exposure-column unit 110 and a control unit 150. The exposure-column unit 110 includes a charged-particle-beam generator 114 having a cathode 111, a grid 112, and an anode 113. The exposure-column unit 110 further includes a first slit 115 providing a rectangular shape of the charged particle beam, a first lens 116 converging the shaped beam, and a slit deflector 117 deflecting a position of the shaped beam on a mask 120 based on a deflection signal S1. The exposure-column unit 110 further includes second and third lenses 118 and 119 opposing each other, the mask 120 mounted movably in a horizontal direction between the second and third lenses 118 and 119, and first-to-fourth deflectors 121 through 124 deflecting the beam between the second and third lenses 118 and 119 based on position information P1 through P4 to select one of a plurality of holes provided through the mask 120. The exposure-column unit 110 further includes a blanking 125 cutting off or passing the beam according to a blanking signal, a fourth lens 126 converging the beam, an aperture 127, a refocus coil 128, and a fifth lens 129. The exposure-column unit 110 further includes a dynamic focus coil 130, a dynamic stigmator coil 131, an objective lens 132 projecting the beam on to a wafer, and a main deflector 133 and a sub-deflector 134 positioning the beam on the wafer according to exposure-position signals S2 and S3. The exposure-column unit 110 further includes a stage 135 carrying the wafer to move it in X–Y directions, and first-to-fourth alignment coils.

The control unit 150 includes a memory media 151 comprising a disk or MT recorder for storing design data of integrated circuits, and a CPU 152 controlling the charged-particle-beam exposure device. The control unit 150 further includes a data-management unit 153, an exposure-management unit 159, a mask-stage controlling unit 160, a main-deflector-deflection setting unit 161, and a stage controlling unit 162, all of which are connected via a data bus (i.e., VME bus). Exposure data includes main-deflector data and sub-deflector data, and is stored in a buffer memory 154 via the data-management unit 153 prior to the exposure process. The buffer memory 154 is used as a high-speed buffer for reading the exposure data, thereby negating an influence of low-speed data reading from the memory media 151.

The main-deflector data is set in the main-deflector-deflection setting unit 161 via the exposure-management unit 159. The exposure-position signal S2 is output after the deflection amount is calculated, and is provided to the main deflector 133 via the DAC/AMP 170. Then, the sub-deflection data for exposing a selected field is read from the data-management unit 153, and is sent to the sub-deflector-deflection setting unit 155. In the sub-deflector-deflection setting unit 155, the sub-deflection data is broken down into shot data by the pattern generating unit 156, and is corrected by the pattern-correction unit 157. These circuits operates in a pipeline according to a clock signal generated by the clock setting unit 158.

After the processing of the pattern-correction unit 157, a signal S1 for setting a slit size, mask-deflection signals P1 through P4 for determining a deflected position on the mask 120 of the beam deflected according to the signal S1 after passing through the first slit 115, a signal S3 for determining a position on the wafer of the beam shaped by the mask 120, and a signal S4 for correcting distortion and blurring of the beam are obtained. Also, the clock setting unit 158 provides a blanking controlling unit 165 with a B signal for controlling the blanking operation.

An exposure position on the wafer is controlled by the stage controlling unit 162. In doing so, a coordinate position detected by a laser interferometer 163 is supplied to the stage controlling unit 162. Referencing to the coordinate position, the stage controlling unit 162 moves the stage 135 by driving a motor 164.

In this manner, the control unit 150 controls the exposure-column unit 110 such that the charged-particle beam emitted from the charged-particle-beam generator 114 is rectangularly shaped by the first slit 115, converged by the lenses 116 and 118, deflected by the mask deflectors 121 and 122, and directed to the mask 120. The beam having passed through the mask 120 passes through the blanking 125, is converged by the fourth lens 126, is deflected to a center of a sub-field of about 100-$\mu$m square by the main deflector 133, and is deflected within this sub-field by the sub-deflector 134.

Elements concerning the detection and analysis of reflection signals necessary for the positioning of the wafer and the calibration of the beam are the same as those shown in FIG. 5, and, thus, are omitted in FIG. 15.

Figure 16:
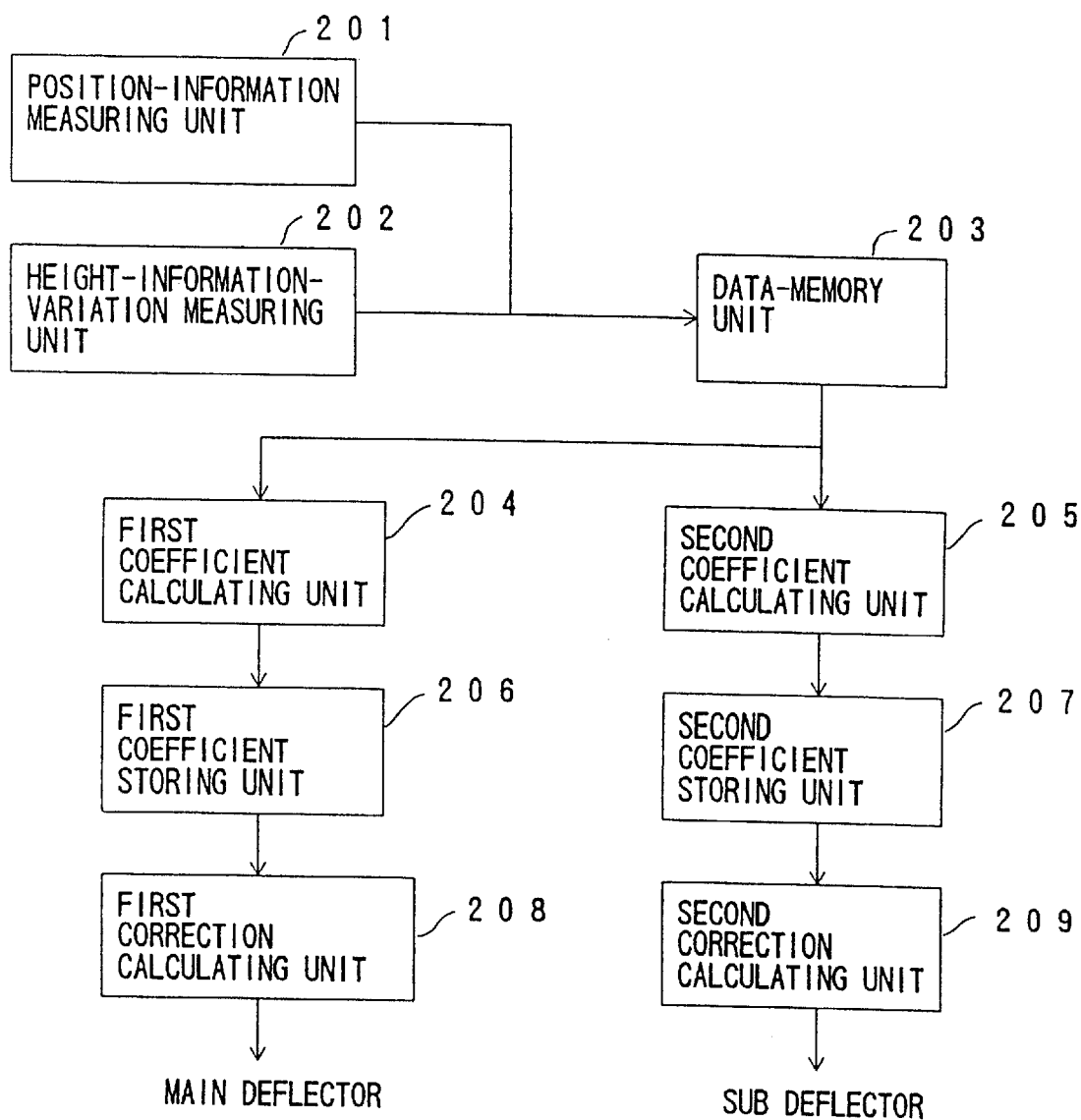
FIG. 16 is a block diagram of a correction-coefficient calculating and setting unit according to a first embodiment of the third principle.

FIG. 16 is a block diagram of a correction-coefficient calculating and setting unit according to a first embodiment of the third principle. The correction-coefficient calculating and setting unit is used in the charged-particle-beam exposure device 100 of FIG. 15.

In FIG. 16, a correction-coefficient calculating and setting unit 200 includes a positioning-information measuring unit 201, a height-variation-information measuring unit 202, a data-memory unit 203, a first coefficient calculating unit 204, a second coefficient calculating unit 205, a first coefficient storing unit 206, a second coefficient storing unit 207, a first correction calculating unit 208, and a second correction calculating unit 209.

The positioning-information measuring unit 201 obtains data for positioning the wafer to be exposed. This data includes a displacement of a beam deflected to a mark as well as beam-size-reduction information. The height-variation-information measuring unit 202 obtains data regarding a variation in the height of the wafer. The data measured by the positioning-information measuring unit 201 and the height-variation-information measuring unit 202 is stored in the data-memory unit 203. The measurement and storing of the data are finished by the start of an exposure. The positioning-information measuring unit 201 and the height-variation-information measuring unit 202 are implemented by the reflection detectors 13 and 14, the adder 15, and the signal analyzing unit 16 of FIG. 5, for example. The data-memory unit 203 is implemented by the memory media 151 and the buffer memory 154 of FIG. 15.

Immediately before the start of an exposure, the beam is adjusted. Then, the wafer is moved through stage movement to a position where a first frame is started to be drawn, i.e., the wafer is moved from a position where the beam is adjusted to a position where the exposure is started. This stage movement is controlled by the stage controlling unit 162.

The first coefficient calculating unit 204 and the second coefficient calculating unit 205 receive information on a frame position from the CPU 152 controlling the stage controlling unit 162. Based on this information, the first coefficient calculating unit 204 and the second coefficient calculating unit 205 calculate the correction coefficients used for a given cell field at the time of a first-frame exposure, and store these correction coefficients in the first coefficient storing unit 206 and the second coefficient storing unit 207, respectively. The beam adjustment and the stage movement before the start of an exposure take at least 2 seconds. The calculation of the correction coefficients previously described is easily conducted within this time interval.

The first coefficient calculating unit 204, the first coefficient storing unit 206, and the first correction calculating unit 208 are implemented by the main-deflector-deflection setting unit 161 of FIG. 15. The second coefficient calculating unit 205, the second coefficient storing unit 207, and the second correction calculating unit 209 are implemented by a sub-deflector-deflection setting unit 155 of FIG. 15.

After the exposure of the first frame is started, the first coefficient calculating unit 204 and the second coefficient calculating unit 205 calculate the correction coefficients for the second frame, and store the correction coefficients in the first coefficient storing unit 206 and the second coefficient storing unit 207, respectively. In the same manner, while an N-th frame is being exposed, the correction coefficients used for an N+1-th frame are calculated. Even if the calculation and storing of the correction coefficients for the N+1-th frame are completed before the end of the exposure of the N-th frame, the correction coefficients used for the next (N+2-th) frame are not calculated.

An address corresponding to each cell field of two frames is necessary in the first coefficient storing unit 206 and the second coefficient storing unit 207. When a wafer of an 8-inch diameter is used with a cell field of a 1-mm square, the number of addresses required for one frame is 200. 400 addresses are used for two frames. Thus, only a small memory volume is required. Here, each correction coefficient needs 32 bits.

The correction coefficients needing to be updated during an exposure include area-correction coefficients (G, R, D, and δ) for correcting a beam within an area totaling 8 coefficients for X and Y coordinates, 8 cell-correction coefficients for transforming coordinates of the main deflector with respect to the stage-movement directions, 8 stage-correction coefficients for aligning the stage-movement directions with wafer coordinates at the time of continuous stage movement, and correction-coefficients for determining the beam focus value for each cell. The area-correction coefficients may be updated at the time when the beam shifts across an area border during the stage movement. Other correction coefficients need to be updated for each cell. Hereinafter, correction coefficients needing to be updated for each cell are collectively called cell-correction coefficients.

The first correction calculating unit 208 and the second correction calculating unit 209 read the correction coefficients from the first coefficient storing unit 206 and the second coefficient storing unit 207, respectively. These correction coefficients are supplied to the main deflector and the sub-deflector.

FIG. 17 is a block diagram of a coefficient storing unit according to a second embodiment of the third principle. In the second embodiment, the first coefficient storing unit 206 and the second coefficient storing unit 207 of the first embodiments are controlled such that the correction coefficients for one frame can be written while the correction coefficients for another frame are being read.

The first coefficient storing unit 206 and the second coefficient storing unit 207 of FIG. 16 store all the correction coefficients set for the cell fields of two frames. In order to smoothly carry out the reading and writing of the correction data, it is necessary to write the correction coefficients for one frame while the correction coefficients for another frame are being read.

The first coefficient storing unit 206 or the second coefficient storing unit 207 of FIG. 17 includes an inverter 210 and frame-coefficient storing units 211 and 212. A mode selection signal takes a value of 0 or 1, and determines which one of a writing mode and a reading mode is used. The frame-coefficient storing unit 211 receives the mode selection signal, and the frame-coefficient storing unit 212 receives an inverted mode selection signal output from the inverter 210. When the mode selection signal indicates the writing mode, therefore, the correction coefficients are written into the frame-coefficient storing unit 211, and are read out from the frame-coefficient storing unit 212. On the other hand, when the mode selection signal indicates the reading mode, therefore, the correction coefficients are read from the frame-coefficient storing unit 211, and are written in the frame-coefficient storing unit 212.

The mode selection signal reverses each time when an exposure process moves from one frame to a next frame. Hereinafter, the mode selection signal is called a frame-control flag. The frame-control flag may be provided from the CPU 152 of FIG. 15. In this manner, the writing/reading of data is controlled such that the correction coefficients for one frame can be written while the correction coefficients for another frame are being read.

The frame-coefficient storing units 211 and 212 of FIG. 17 may include a buffer memory, a FIFO memory, a dual-port memory of a certain type, or a combination of these. When it includes a buffer memory, control of writing addresses and reading addresses is necessary. When a FIFO memory is used, control of addresses is not necessary as in a buffer memory since the correction coefficients are read in an order in which they are written. However, the control coefficients cannot be used repeatedly in the FIFO memory.

FIG. 18 is a block diagram showing an example in which a dual-port memory is used as the frame-coefficient storing unit 211 and the frame-coefficient storing unit 212 of FIG. 17.

When a dual-port memory 220 is used as shown in FIG. 18, an MSB (most significant bit) of the memory is used as the frame-control flag. The frame-control flag is reversed by an inverter 223 on a data reading side as compared to a data writing side. At a time when a frame is changed (i.e., when the stage movement takes a U-turn), the frame-control flag is reversed. Addresses other than the MSB are used as addresses for storing the correction coefficients by the coefficient calculating unit 221 (204 or 205). In the same manner, the correction calculating unit 222 (208 or 209) uses the addresses other than the MSB as addresses for reading the correction coefficients. Thus, when the correction coefficients are written in either one of the upper or lower half of the memory space, the correction coefficients are read from the other half.

By using the dual-port memory 220 as shown in FIG. 18, the calculation and setting of the correction coefficients are conducted without requiring complex control of an updating timing and a reading timing of the correction coefficients. Also, there is an advantage in that addresses of the correction coefficients for wafer coordinates can be matched between when the data is written and when the data is read.

Figure 19:
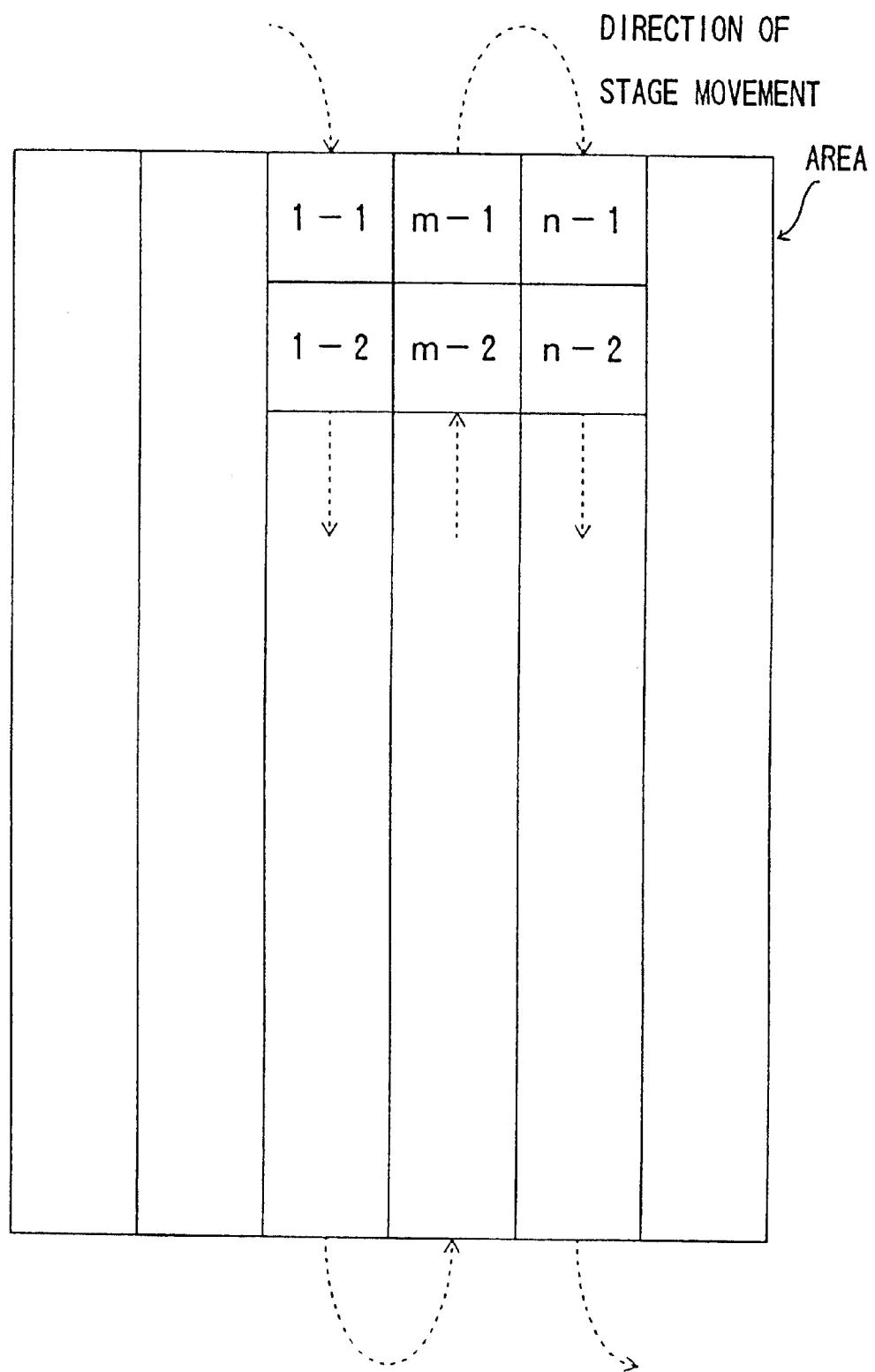
FIG. 19 is an illustrative drawing showing portions in one area where frame exposures begin and end.

FIG. 19 is an illustrative drawing showing portions in one area where frame exposures begin and end. In FIG. 19, cells are denoted by 1—1, 1–2, m-1, m-2, n-1, and n-2. The cell-correction coefficients for each cell are different for a different cell, and the area-correction coefficients for one area are the same for all the cells in FIG. 19. While an m-th frame is under an exposure, the correction coefficients for an n-th frame are calculated and stored in the coefficient storing unit. However, the area-correction coefficients for the m-th frame and the n-th frame are the same so that there is no need to update the area-correction coefficients in this case.

Figure 20:
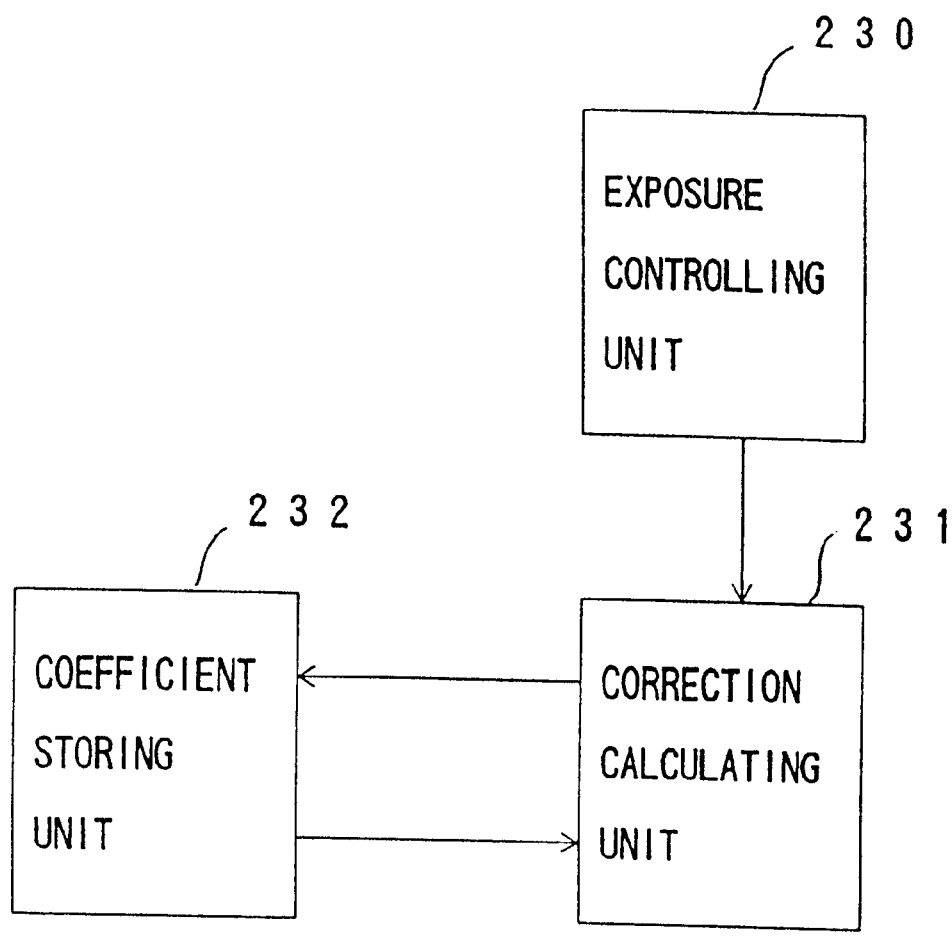
FIG. 20 is a block diagram of a portion for controlling the updating of cell-correction coefficients and area-correction coefficients according to a third embodiment of the third principle of the present invention.

FIG. 20 is a block diagram of a portion for controlling the updating of the cell-correction coefficients and the area-correction coefficients according to a third embodiment of the third principle of the present invention.

According to the third embodiment of the third principle, the updating of the cell-correction coefficients and the area-correction coefficients are controlled by an exposure controlling unit. The exposure controlling unit may be implemented in the exposure-management unit 159 of FIG. 15.

In FIG. 20, an exposure controlling unit 230 provides a correction calculating unit 231 with a timing signal indicating a timing of a cell-to-cell shift and a timing of an area-to-area shift. The correction calculating unit 231 reads the correction coefficients from a coefficient storing unit 232 based on the timing signal. Namely, the correction calculating unit 231 reads the cell-correction coefficients from the coefficient storing unit 232 at a timing of a cell-to-cell shift, and reads the area-correction coefficients as well as the cell-correction coefficients at a timing of an area-to-area shift.

In order to provide the timing signal indicating a timing of a cell-to-cell shift and a timing of an area-to-area shift, the exposure controlling unit 230 needs to keep a constant observation of exposure positions. This is achieved by using a counter or the like for counting a cell number and an area number.

Figure 21:
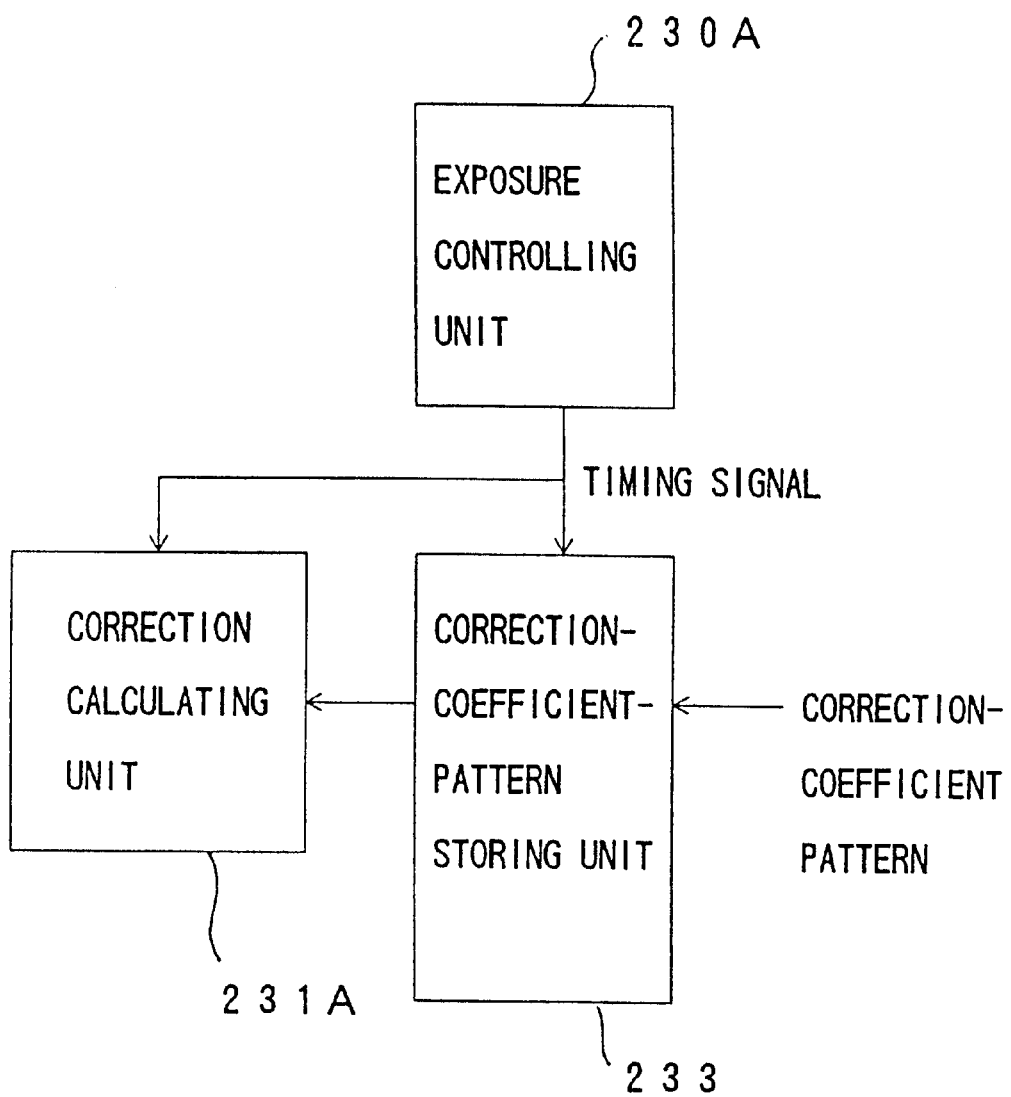
FIG. 21 is a block diagram of a variation of the third embodiment of the third principle.

FIG. 21 is a block diagram of a variation of the third embodiment of the third principle. In this variation, a pattern of stored correction coefficients is kept in a memory. Information on the correction-coefficient pattern is provided to the correction calculating unit 231 based on the timing signal.

In FIG. 21, an exposure controlling unit 230A provides a timing signal to a correction calculating unit 231A and to a correction-coefficient-pattern storing unit 233. The correction-coefficient-pattern storing unit 233 keeps a pattern of the stored correction coefficients, and provides the correction calculating unit 231A with information indicating an area-to-area shift or a cell-to-cell shift. In this configuration, the updating of the correction coefficients can be controlled based only on an output of the correction-coefficient-pattern storing unit 233.

An example of the correction-coefficient pattern is shown in FIG. 22. In FIG. 22, "00" of first data (00, AREA) indicates that a cell to be exposed next is a first cell, and "AREA" thereof indicates that this cell belongs to a new area. "01" of second data (01, CELL) indicate that a cell to be exposed next is a second cell, and "CELL" thereof indicates that there is no area change. In the example of FIG. 22, fifth data (04, AREA) indicates that a fifth cell belongs to a new area. Namely, the first area includes four cells in FIG. 22. The correction-coefficient pattern of FIG. 22 is merely an example, and variations thereof may be used in the present invention to indicate needs, as well as no need, for updating particular ones of the correction coefficients.

The correction-coefficient-pattern storing unit 233 of FIG. 21 may preferably include a buffer memory, a FIFO memory, or a dual-port memory. Among these memories, the FIFO memory is the best. The correction-coefficient pattern is determined based on exposure arrangement information, so that an entire correction coefficient pattern covering up to an end of an exposure can be determined at a time of a beginning of the exposure. Thus, it is preferable to use a FIFO memory in terms of convenience of use since the FIFO memory has such a structure that data can be consecutively read and written.

FIG. 23A is a circuit diagram of an example of a dual-port memory controlled by the configuration of FIG. 17. In FIG. 23A, the frame-control flag is assigned to the MSB of address lines of the dual-port memory, and left-hand-side data of the FIFO output of FIG. 22, i.e., "00, 01, 02, * * *", is input to bits other than the MSB. Here, a DSP (digital signal processor) is used as the correction calculating unit 231A.

A circuit of FIG. 23A includes the correction calculating unit 231A, dual-port memories 251 and 252, an inverter 253, a decoder 254, a correction-coefficient-updating-pattern register 255, a resister 256, and inverters 257 and 258. The dual-port memories 251 and 252 receive VMED (address and data), VMEA (address), a write strobe signal WRITE STB, and a read strobe signal READ STB from the coefficient calculating unit.

The least significant bit of an address signal is provided to a chip-selection node CS of the dual-port memory 251. Also, a reversed signal of the least significant bit by the inverter 253 is input to a chip-selection node CS of the dual-port memory 252. Thus, data provided to the circuit is supplied in turn to one of the dual-port memory 251 and the dual-port memory 252. The reason why the dual-port memory 251 and the dual-port memory 252 are provided is because the two dual-port memory, rather than one, can increase a memory volume to store more correction coefficients. In FIG. 23A, bits 4 through 11 of address inputs on a data writing side are provided with data on the data bus instead of address data on the address bus. This is because this configuration can boost a processing speed. In this configuration, the data on the data bus is decoded by the decoder 254 to determine an address.

FIG. 23B is a chart showing data to be stored in the dual-port memory 251, for example. As shown in FIG. 23B, the lowest four bits (bits 0 through 3) of the address correspond to each correction coefficient, and eight bits (bits 4 through 11) next to these four bits represent a cell number. Thus, assuming that a correction coefficient Rac is stored at an address of a hexagonal 3 of the lowest four bits, $R_{ac}$ for a first cell is stored at an address "003", and $R_{ac}$ for a 256th cell is stored at an address "FF3".

Assume that data is output from the FIFO as shown in FIG. 22. An upper address of the dual-port memory 251 or the dual-port memory 252 is determined by the first data (00, AREA). For example, the dual-port memory 251 may be selected by the correction calculating unit 231A as a chip to be used. In this case, based on information "AREA" of the first data, the correction calculating unit 231A reads all the data stored in addresses 0 through 9 of the dual-port memory 251 to use the data for correction of the charged-particle beam. After an exposure of a first cell is completed, the second data (01, CELL) is provided from the FIFO to determine the upper address of the dual-port memory 251. Based on information "CELL" of the second data, the correction calculating unit 231A reads data stored in addresses 0 through 5 to use the data for correction of the beam.

The correction-coefficient-updating-pattern register 255 is arranged in parallel with the dual-port memories 251 and 252. The correction-coefficient-updating-pattern register 255 is used when the correction coefficients are controlled at a level finer than the level of the area-correction coefficients and the cell-correction coefficients such that some of the area correction coefficients are not updated at a certain timing, etc. By using information stored in the correction-coefficient-updating-pattern register 255, the correction calculating unit 231A can avoid reading unnecessary correction coefficients based on information about the correction coefficients needed to be updated. There is a case in which all the correction coefficients do not have to be updated when an exposure is made. In a case where requirements for an exposed-pattern precision are not so high, for example, a desired precision may be achieved without frequently changing the correction coefficient. In this case, information on the correction coefficients with no need to be updated is stored in the correction-coefficient-updating-pattern register 255 in advance. Then, before the start of an exposure, this information is input to input ports of the correction calculating unit (DSP) 231A. Based on this information, the correction calculating unit (DSP) 231A reads only necessary correction coefficients from the dual-port memories 251 and 252 to update them during the exposure.

In the third principle, when the complex and densely distributed correction coefficients are set for an enhancement of exposure precision, the calculation and setting of the correction coefficients are carried out in parallel with other processes required for the exposure. Thus, the calculation and setting of a large number of correction coefficients are conducted without increasing the processing time for the exposure. Also, there is no need for a large memory volume, only the correction coefficients for two frames being stored. Therefore, the cell-correction coefficients can be easily updated at high speed during the exposure. As a result, it is possible to create an exposure pattern only by taking almost the same processing time as required in the related art without sacrificing the precision. Thus, the third principle of the present invention greatly contributes to the development of the manufacturing technology for the LSI chips having fine patterns.

As described above, according to the present invention, the measured deflection-efficiency-correction coefficients are approximated by using the linear functions of the focus distance, the deflection-efficiency-correction coefficients are easily obtained as functions of the focus distance.

Also, according to the present invention, the measured displacement is approximated to by using the linear function of the focus distance, the displacement is easily obtained as a function of the focus distance.

Also, according to the present invention, the height of the wafer surface is approximated as a function of the coordinates to provide the focus distances, and the positioning and exposure of the wafer are conducted by using the deflection-correction coefficients and the displacement corrected with respect to the focus distances. Therefore, the data collection for correction of the beam does not require much time and labor, yet a precise exposure pattern being created.

Also, according to the present invention, the height of the wafer surface is optically measured even when focusing on the reference marks fails. Therefore, a precise exposure pattern is created for wafers having any types of reference marks.

Furthermore, according to the present invention, the position-detection marks of the contrast-detection type allowing a detection based on differences in the reflection intensities are used. Thus, errors in the detection of mark positions are eliminated.

Also, according to the present invention, the position-detection marks of the contrast-detection type having a high precision of surface flatness are used. Thus, errors in the detection of mark positions are eliminated.

Also, according to the present invention, the position-detection marks of the contrast-detection type allowing a detection based on differences in the reflection intensities are used. Thus, the deflection-distortion map and the deflection-efficiency-correction coefficients free from errors are obtained.

Also, according to the present invention, the position-detection marks of the contrast-detection type allowing a detection based on differences in the reflection intensities are used to expose the wafer after correcting the charged-particle beam. Therefore, a precise exposure pattern is created.

Also, according to the present invention, the distortion of the charged-particle beam is corrected by using the position-detection marks of the contrast-detection type allowing a detection based on differences in the reflection intensities, and the deflection efficiency of the beam is corrected by canceling the measurement errors in the correction-efficiency-correction coefficients obtained from the positioning marks or the beam adjustment marks provided on the wafer. Therefore, a precise exposure pattern is created on the wafer.

Also, according to the present invention, the positioning marks may be detected at the center axis of the beam optical system to eliminate errors in the detection of the positioning marks.

Furthermore, according to the present invention, the correction coefficients for a N+1-th frame are calculated while the correction coefficients for a N-th frame are being exposed, so that the exposure process and the calculation of the correction coefficients are conducted in parallel (simultaneously). Thus, a precise exposure pattern is created by using densely distributed correction coefficients without increasing the exposure processing time.

Also, according to the present invention, it is sufficient to store only the correction coefficients for two frames. Thus, a precise exposure pattern is created by using densely distributed correction coefficients without increasing the exposure processing time.

Also, according to the present invention, the writing and reading of the correction coefficients are smoothly conducted in parallel. Thus, a precise exposure pattern is created by using densely distributed correction coefficients without increasing the exposure processing time.

Also, according to the present invention, the correction coefficients with no need to be updated are not updated during an exposure of a given frame to achieve an efficient correction of the deflector. Thus, a precise exposure pattern is created by using densely distributed correction coefficients without increasing the exposure processing time.

Also, according to the present invention, the correction coefficients for a given frame are updated while another frame is being exposed. Thus, a precise exposure pattern is created by using densely distributed correction coefficients without increasing the exposure processing time.

Also, according to the present invention, the data for the deflector correction may be newly collected during an exposure of the wafer, and the correction coefficients are calculated by using the newly collected data. Thus, the correction coefficients stored in the memory do not have to be updated even when new correction data become necessary during the exposure. Thus, a precise exposure pattern is created by using densely distributed correction coefficients without increasing the exposure processing time.

Moreover, there are other problems concerning the present invention, and these problems will be described below.

The charged-particle-beam exposure method has superior characteristics in terms of the resolution and the focus depth, compared to the light exposure method widely used in the manufacturing of LSI chips. However, the charged-particle-beam exposure method is inferior in terms of an exposure positioning accuracy and an overlay accuracy. Thus, the charged-particle-beam exposure method is not widely used in the field for manufacturing purposes.

In general, a charged-particle-beam exposure device controls a charged-particle beam through an electromagnetic field to draw patterns on photosensitive material. Therefore, the positioning of the beam can be corrected for each pattern. On the other hand, a correction operation is complex, and a beam adjustment (calibration) for determining various correction coefficients is lengthy.

The charged-particle-beam exposure device generally has a main deflector for deflecting the beam within a large area and a sub-deflector for deflecting the beam within a small area at high speed. A combination of these two deflectors makes it possible to draw patterns in a large area at high speed. Typically, the main deflector is a coil, and the sub-deflector is a static-charge deflector.

The charged-particle beam deflected by the main deflector passes through an electric field generated by the sub-deflector with the electric field deflecting the beam at high speed. In this case, a position of the beam passing through the sub-deflector varies according to the deflection amount (deflection angle) incurred by the main deflector. Since there is a distortion in the electric field generated by the sub-deflector, a variation in the position of the passing beam leads to the deflection amount of the sub-deflector being changed accordingly.

In the charged-particle-beam exposure device having more than one deflector, therefore, a deflection efficiency of the sub-deflector is changed depending on the path of the charged-particle beam deflected by the main deflector. In order to correct a distribution of the deflection efficiency, typically, the deflection efficiency of the sub-deflector is measured for each deflection amount of the main deflector.

Figure 24:
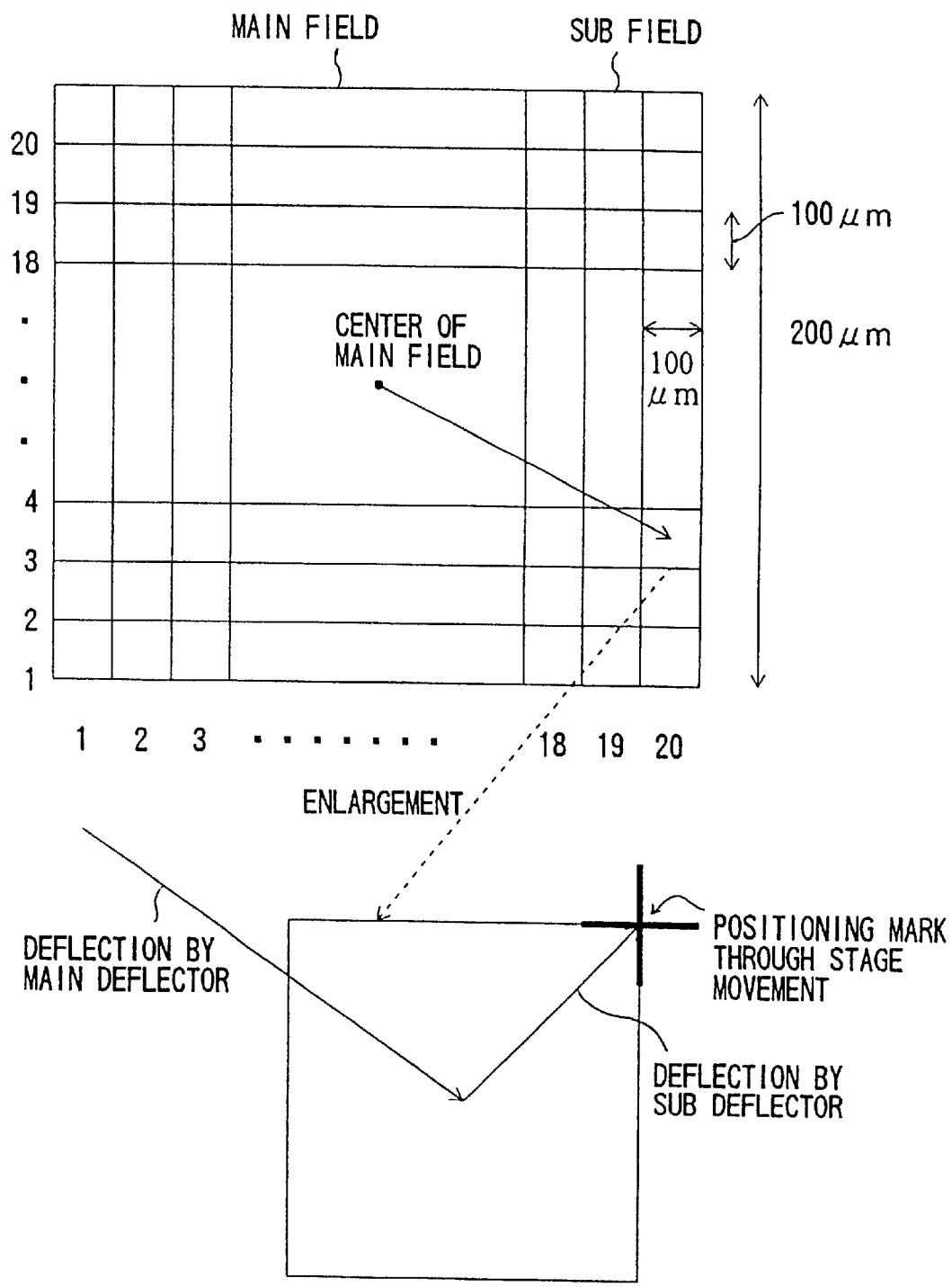
FIG. 24 is an illustrative drawing showing a first related-art method of obtaining a map of deflection-efficiency-correction coefficients of a sub-deflector.

FIG. 24 is an illustrative drawing showing a first related-art method of obtaining a map of deflection-efficiency-correction coefficients of the sub-deflector. The first related-art method will be described with reference to FIG. 24.

In an example of FIG. 24, a deflection area of the main deflector is a 2000-$\mu$m square, and a deflection area of the sub-deflector is a 100-$\mu$m square. The deflection area of the main deflector is divided into 400 (20×20) fields of a 100-$\mu$m square. Within this field, a pattern is drawn by deflecting the beam through the sub-deflector without using the main deflector. The area of the 2000-$\mu$m square is called a main field, and the area of the 100-$\mu$m square is called a sub-field.

In this example, the sub-deflector's deflection efficiency should be measured at 20×20 points of deflection positions of the main deflector, each of the 20×20 points being arranged in a corresponding one of the 100-$\mu$m squares. A procedure for measuring the sub-deflector's deflection efficiency at the 20×20 points includes the steps of:

(1) setting the deflection position of the main deflector at a center of a sub-field (Ix, Iy);

(2) carrying out the following two steps at the four corners of the sub-field;

(2)-1 positioning a position-detection mark at a corner of the sub-field through stage movement;

(2)-2 deflecting the beam through the sub-deflector to the corner provided with the position-detection mark to detect a position of the position detection mark;

(3) calculating deflection-efficiency-correction coefficients based on differences between the detected positions of the mark and the actual positions (as defined by the stage movement) thereof at the four corners; and (4) repeating the steps (1) through (3) for all the sub-fields at Ix=1, 2, * * * 20 and Iy=1, 2, * * * 20.

This procedure takes time for the measurement since 1600 (20×20×4) stage movements are required. Assuming that a time period required for a stage vibration caused by the stage movement to be settled is 500 ms, the measurement of all the correction coefficients for the sub-fields takes 13 minutes and 20 seconds (800 seconds).

Figure 25:
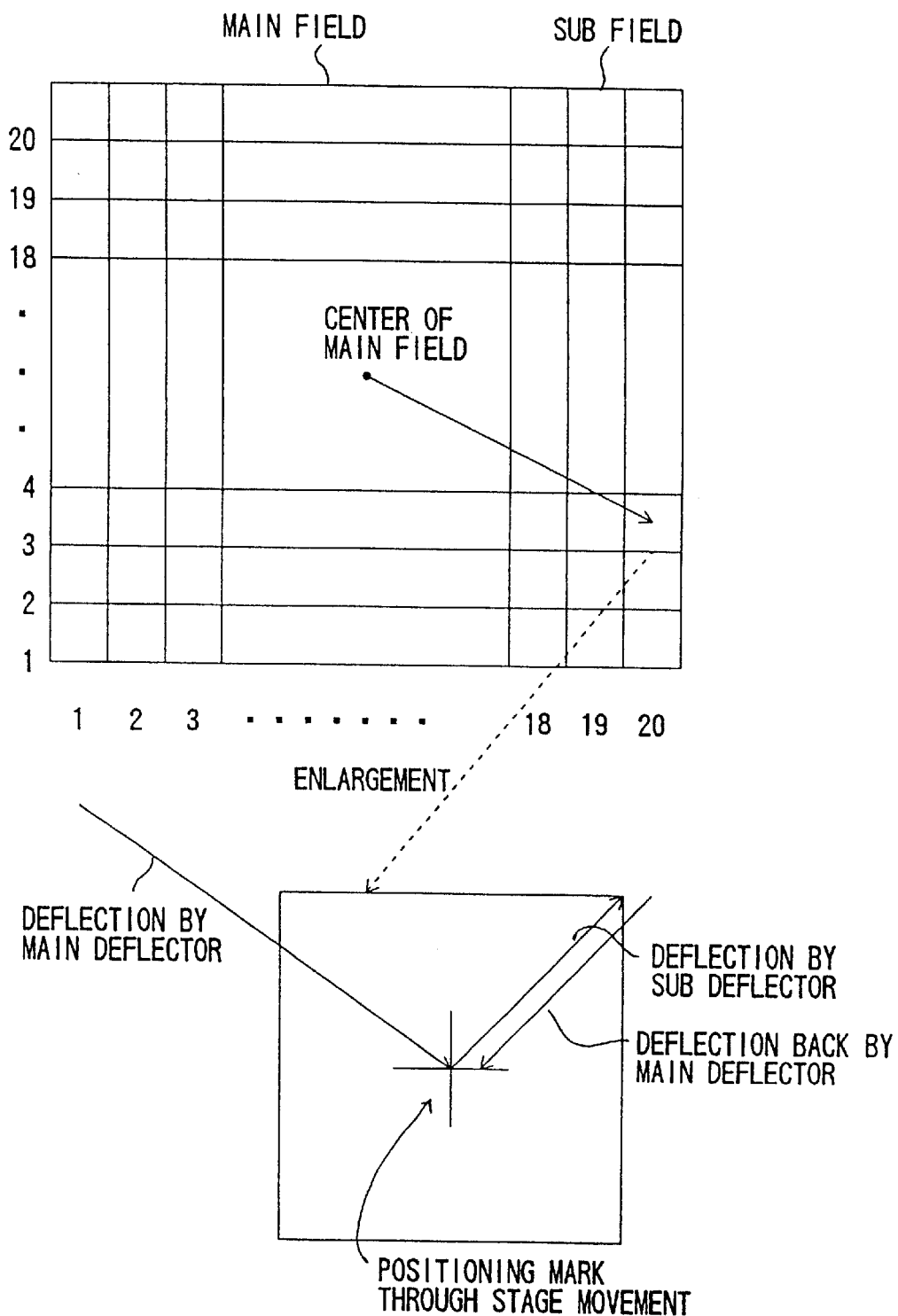
FIG. 25 is an illustrative drawing showing a second related-art method of obtaining a map of deflection-efficiency-correction coefficients of the sub-deflector.

In response, a method of reducing the number of the stage movements to one fourth without decreasing the number of the measurement points has been proposed. FIG. 25 is an illustrative drawing showing a second related-art method of obtaining a map of deflection-efficiency-correction coefficients of the sub-deflector.

In an example of FIG. 25, sizes of the main field and the sub-field are the same as in the first related-art method. A procedure for measuring the sub-deflector's deflection efficiency at the 20×20 points includes the steps of:

(1) positioning a position-detection mark at a center of a sub-field (Ix, Iy) through stage movement, and setting the deflection position of the main deflector at the center of the sub-field (Ix, Iy);

(2) carrying out the following three steps at the four corners of the sub-field;

(2)-1 deflecting the beam at a corner of the sub-field through the sub-deflector;

(2)-2 deflecting the beam back to the center of the sub-field through the main deflector;

(2)-3 detecting a position of the position-detection mark at the center of the sub-field by using the beam;

(3) calculating deflection-efficiency-correction coefficients based on differences between the detected positions of the mark and the actual position (as defined by the stage movement) thereof; and (4) repeating the steps (1) through (3) for all the sub-fields at Ix=1, 2, * * * , 20 and Iy=1, 2, * * * , 20.

This procedure does not require a stage movement at the step (2), so that the number of the stage movements becomes equal to the number of sub-fields, which is 400 (20×20) in this case. Assuming that a time period required for a stage vibration caused by the stage movement to be settled is 500 ms, the measurement of all the correction coefficients for the sub-fields takes 3 minutes and 20 seconds (200 seconds). This time period is one fourth of that of the first related-art method.

However, the second related-art method has a drawback in that errors involved in the measured coefficients become large when the sub-deflector's deflection efficiency has much dependency on the deflection amount of the main deflector. In order to measure the sub-deflector's deflection efficiency for the sub-field (Ix, Iy), the deflection amount of the main deflector should be set at the center of this sub-field. In the second related-art method, however, the deflection amount of the main deflector is changed at the step (2)-2. Strictly speaking, the second related-art method measures the differences between the detected positions and the actual positions of the mark at the corners of a sub-field displaced by (50 $\mu$m, 50 $\mu$m) from the actual sub-field. Assuming that the deflection efficiency of the sub-field displaced by (50 $\mu$m, 50 $\mu$m) is different from that of the actual sub-field by 0.1%, the differences at the corners contain errors of 0.05 $\mu$m. Thus, correct deflection-efficiency-correction coefficients are not obtained.

The first related-art method does not contain such errors. However, it requires four times as long a measurement time as that of the second related-art method as previously described.

Accordingly, there is a need in the field of a beam adjustment of charged-particle-beam exposure devices for a method which can carry out a more precise deflection-efficiency correction than the related-art methods without sacrificing the processing time.

In the following, fourth and fifth principles of the present invention and embodiments thereof will be described with reference to the accompanying drawings.

Figure 26:
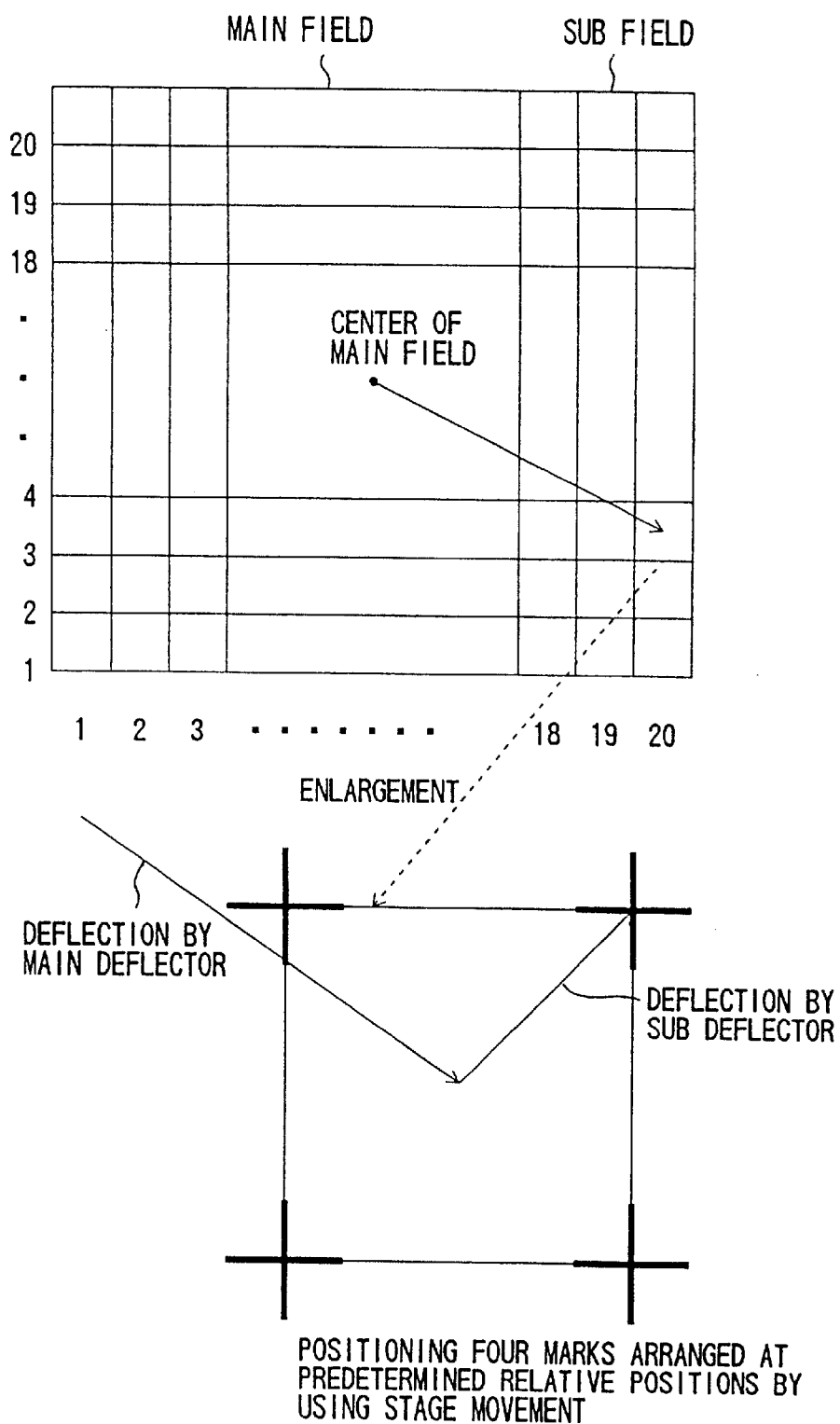
FIG. 26 is an illustrative drawing showing a fourth principle of the present invention.

FIG. 26 is an illustrative drawing showing the fourth principle of the present invention. In the fourth principle, four position-detection marks arranged at relative positions corresponding to the four corners of a sub-field are used as shown in FIG. 26. First, a stage is moved so as to position the position-detection marks at the four corners of a given sub-field. Then, the main deflector deflects the charged-particle beam to a center of the given sub-field. Further, the sub-deflector successively deflects the charged-particle beam to the corners of the given sub-field to detect positions of the position-detection marks.

In this manner, data for the four corners of the given sub-field is obtained through only one stage movement. In this case, the charged-particle beam deflected by the main deflector is positioned at the center of the given sub-field, thereby generating no error in the deflection-efficiency-correction coefficients. However, if the four position-detection marks contain errors in their relative positions, these errors will be contained in the sub-deflector's deflection-efficiency-correction coefficients for all the sub-fields. Namely, all the sub-fields will have the same errors. In order to eliminate these errors, one of the following methods may be used:

(1) correcting the correction coefficients at a time of the data measurement by using arrangement errors of the position-detection marks measured in advance and stored in a memory;

(2) correcting the correction coefficients by using the arrangement errors of the position-detection marks measured through stage movement at-the time of the data measurement; and (3) positioning one of the position-detection marks through stage movement at a center of a sub-field located at a center of the main field after the data measurement, deflecting the beam at the center of the sub-field using the main deflector, deflecting the beam successively at the four corners of the sub-field using the sub-deflector, detecting the one of the position-detection marks after directing the beam back to the center of the sub-field using the main deflector, and correcting errors of the sub-deflector based on an assumption that the main deflector contain no error in the deflection thereof.

In either one of these three methods, the same error compensation can be applied to all the sub-fields.

According to the fourth principle of the present invention, the charged-particle beam deflected by the main deflector is positioned at the center of the main deflector, so that there is no error in the correction coefficients. Also, the number of stage movements is one fourth that of the first related-art method, and is the same as that of the second related-art method, so that the data measurement time is rather short. In the case in which the number of sub-fields is 20×20 and the time length for the stage vibration to subside is 500 ms, the correction data is measured taking 3 minutes and 20 seconds (20×20×0.5 sec).

The above description of the fourth principle has been given by taking an example of four position-detection marks. However, it is apparent that the time length required for the data measurement is shorter than that of the first related-art method as long as more than one position-detection mark is used.

Figure 27:
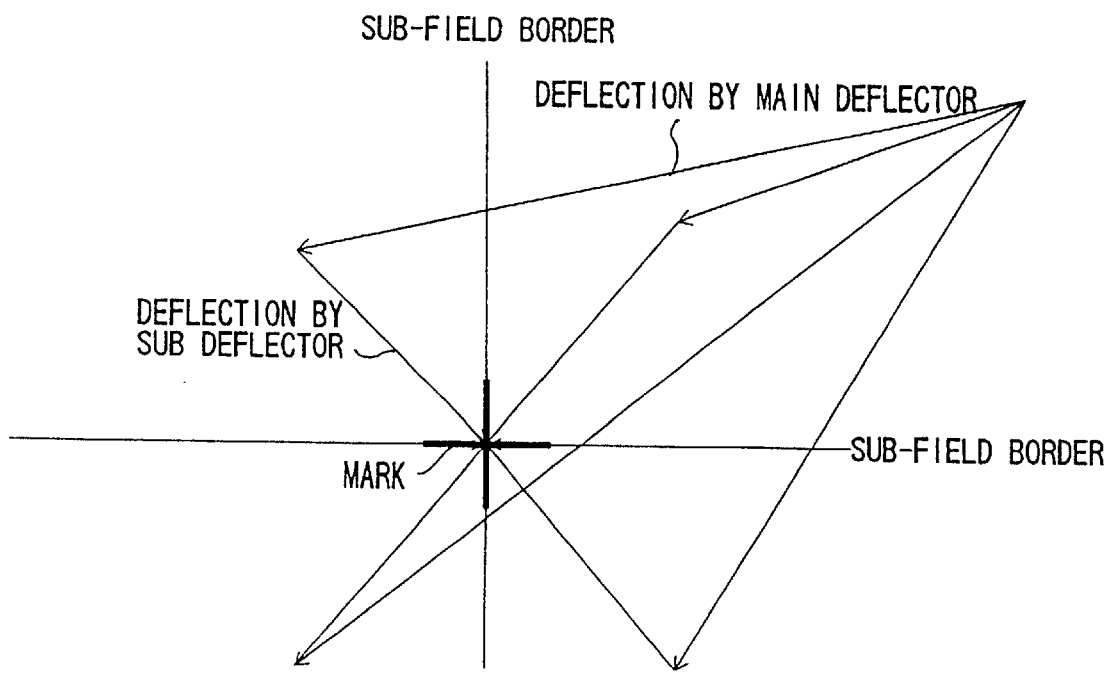
FIG. 27 is an illustrative drawing showing a fifth principle of the present invention.

FIG. 27 is an illustrative drawing showing the fifth principle of the present invention. In the fifth principle, one position-detection mark is positioned through stage movement at a point where four surrounding sub-fields share a corner point thereof, as shown in FIG. 27. Then, the main deflector deflects the charged-particle beam to a center of one of the four surrounding sub-fields. Further, the sub-deflector deflects the charged-particle beam to the position-detection mark to detect a position of the position-detection mark and to store a difference between the detected position and the actual position of the mark. The same procedure is carried out for the four surrounding sub-fields.

In this manner, the correction data is measured for a respective corner of the four surrounding sub-fields, requiring only one stage movement. This data measurement is carried out at all the sub-field corners. Then, the correction coefficients are calculated based on the detected differences for each of the sub-fields.

According to the fifth principle of the present invention, the charged-particle beam deflected by the main deflector is positioned at the center of the main deflector, so that there is no error in the correction coefficients. Also, the number of stage movements is one fourth that of the first related-art method, and is almost the same as that of the second related-art method, so that the data measurement time is rather short. In the case in which the number of the sub-fields is 20×20 and the time length for the stage vibration to subside is 500 ms, the correction data is measured taking 3 minutes and 20 seconds (20×20×0.5 sec).

In the following, embodiments of the fourth and fifth principles of the present invention will be described with reference to the accompanying drawings.

Figure 28:
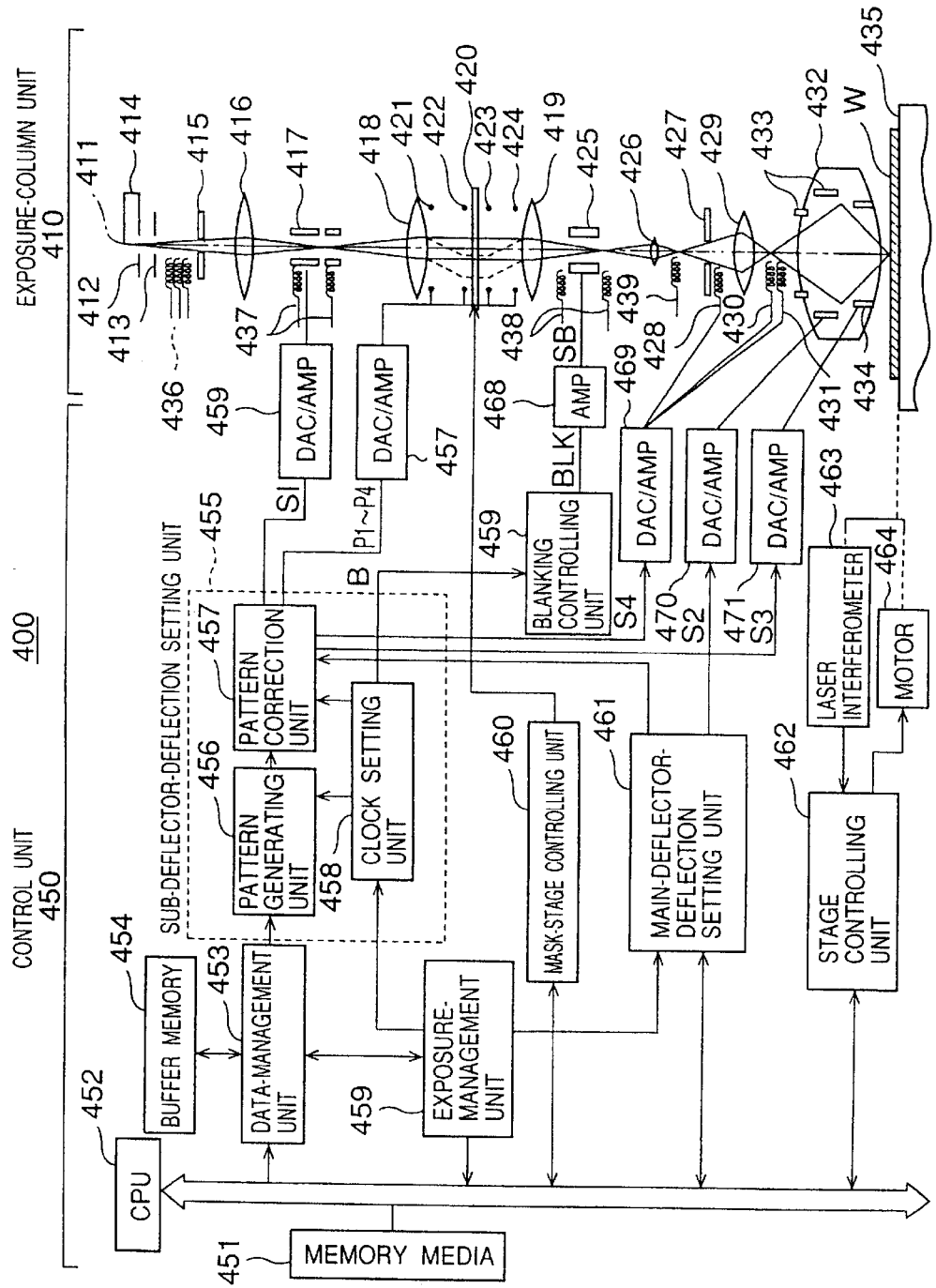
FIG. 28 is a block diagram of an exemplary charged-particle-beam exposure device carrying out a deflection-efficiency correction according to the fourth and fifth principles of the present invention.

FIG. 28 is a block diagram of an exemplary charged-particle-beam exposure device carrying out a deflection-efficiency correction according to the fourth and fifth principles of the present invention.

In FIG. 28, a charged-particle-beam exposure device 400 includes an exposure-column unit 410 and a control unit 450. The exposure-column unit 110 includes a charged-particle-beam generator 414 having a cathode 411, a grid 412, and an anode 413. The exposure-column unit 410 further includes a first slit 415 providing a rectangular shaping of the charged particle beam, a first lens 416 converging the shaped beam, and a slit deflector 417 deflecting a position of the shaped beam on a mask 420 based on a deflection signal S1. The exposure-column unit 410 further includes second and third lenses 418 and 419 opposing each other, the mask 420 mounted movably in a horizontal direction between the second and third lenses 418 and 419, and first-to-fourth deflectors 421 through 424 deflecting the beam between the second and third lenses 418 and 419 based on position information P1 through P4 to select one of a plurality of holes provided through the mask 420. The exposure-column unit 410 further includes a blanking 425 cutting off or passing the beam according to a blanking signal, a fourth lens 426 converging the beam, an aperture 427, a refocus coil 428, and a fifth lens 429. The exposure-column unit 410 further includes a dynamic focus coil 430, a dynamic stigmator coil 431, an objective lens 432 projecting the beam onto a wafer, and a main deflector 433 and a sub-deflector 434 positioning the beam on the wafer according to exposure-position signals S2 and S3. The exposure-column unit 410 further includes a stage 435 carrying the wafer to move it in X–Y directions, and first-to-fourth alignment coils.

The control unit 450 includes a memory media 451 comprising a disk or MT recorder for storing design data of integrated circuits, and a CPU 452 controlling the charged-particle-beam exposure device. The control unit 450 further includes a data-management unit 453, an exposure-management unit 459, a mask-stage controlling unit 460, a main-deflector-deflection setting unit 461, and a stage controlling unit 462, all of which are connected via a data bus (i.e., VME bus). Exposure data includes main-deflector data and sub-deflector data, and is stored in a buffer memory 454 via the data-management unit 453 prior to the exposure process. The buffer memory 454 is used as a high-speed buffer for reading the exposure data, thereby negating an influence of low-speed data reading from the memory media 451.

The main-deflector data is set in the main-deflector-deflection setting unit 461 via the exposure-management unit 459. The exposure-position signal S2 is output after the deflection amount is calculated, and is provided to the main deflector 433 via the DAC/AMP 470. Then, the sub-deflection data for exposing a selected field is read from the data-management unit 453, is broken down into shot data by the pattern generating unit 456, and is corrected by the pattern-correction unit 457. These circuits operates in a pipeline according to a clock signal generated by the clock setting unit 458.

After the processing of the pattern-correction unit 457, a signal S1 for setting a slit size, mask-deflection signals P1 through P4 for determining a deflected position on the mask 420 of the beam deflected according to the signal S1 after passing through the first slit 415, a signal S3 for determining a position on the wafer of the beam shaped by the mask 420, and a signal S4 for correcting distortion and blurring of the beam are obtained. Also, the clock setting unit 458 provides a blanking controlling unit 465 with a B signal for controlling the blanking operation.

An exposure position on the wafer is controlled by the stage controlling unit 462. In doing so, a coordinate position detected by a laser interferometer 463 is supplied to the stage controlling unit 462. Referencing to the coordinate position, the stage controlling unit 462 moves the stage 435 by driving a motor 464.

In this manner, the control unit 450 controls the exposure-column unit 410 such that the charged-particle beam emitted from the charged-particle-beam generator 414 is rectangularly shaped by the first slit 415, converged by the lenses 416 and 418, deflected by the mask deflectors 421 and 422, and directed to the mask 420. The beam having passed through the mask 420 passes through the blanking 425, is converged by the fourth lens 426, is deflected to a center of a sub-field of an about 100-μm square by the main deflector 433, and is deflected within this sub-field by the sub-deflector 434.

Figure 29:
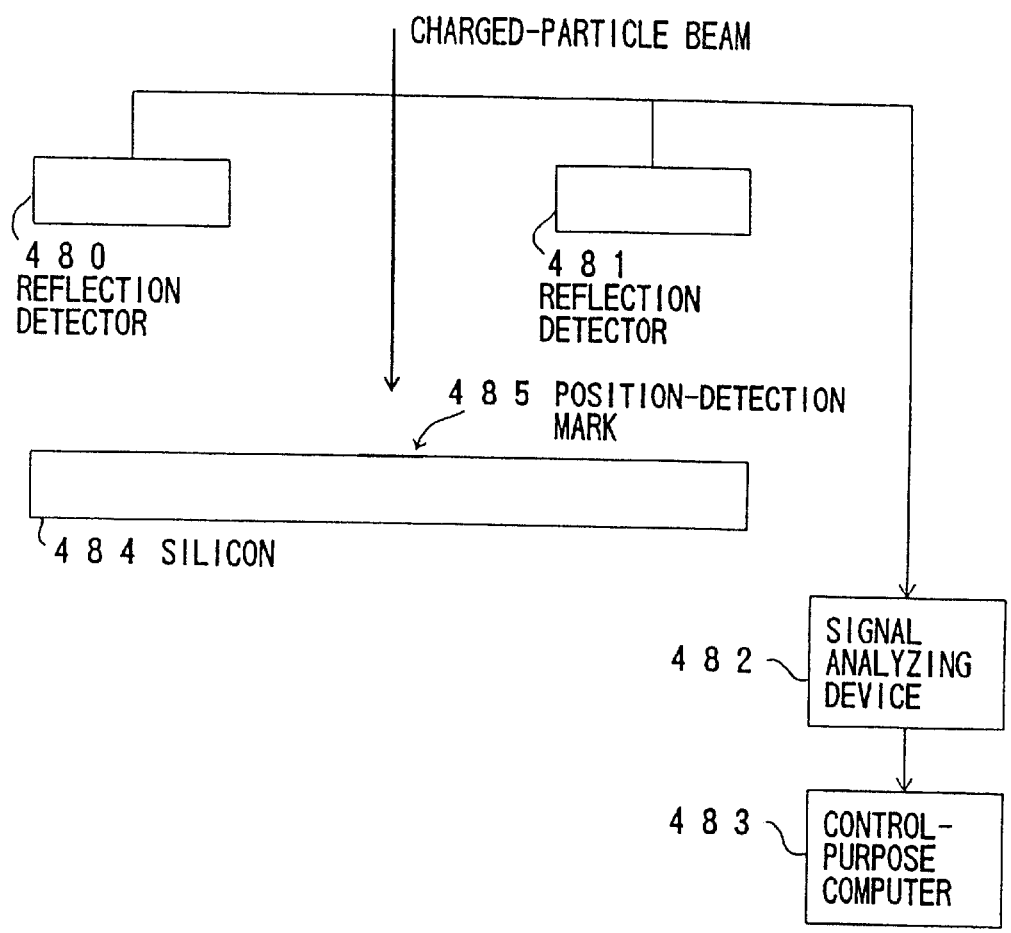
FIG. 29 is an illustrative drawing showing a mark-position detecting portion of a charged-particle-beam exposure device of FIG. 28.

FIG. 29 is an illustrative drawing showing a mark-position detecting portion of the charged-particle-beam exposure device 400. In FIG. 29, the mark-position detecting portion includes reflection detectors 480 and 481, a signal analyzing device 482, and a control-purpose computer 483. The control-purpose computer 483 includes the CPU 452 of FIG. 28, RAM, and ROM.

As shown in FIG. 29, a position-detection mark 485 may be formed from a heavy-metal layer patterned on a silicon 484. The charged-particle-beam exposure device 400 scans the charged-particle beam over the silicon 484 and the position-detection mark 485 in predetermined directions. The reflection detectors 480 and 481 detect charged particles scattered by the silicon 484 or the position-detection mark 485. The signal analyzing device 482 analyzes a reflection signal obtained by scanning the charged-particle beam, and detects a position of the position-detection mark 485 based on a difference in reflection intensities between the position-detection mark 485 and the silicon 484.

Figure 30:
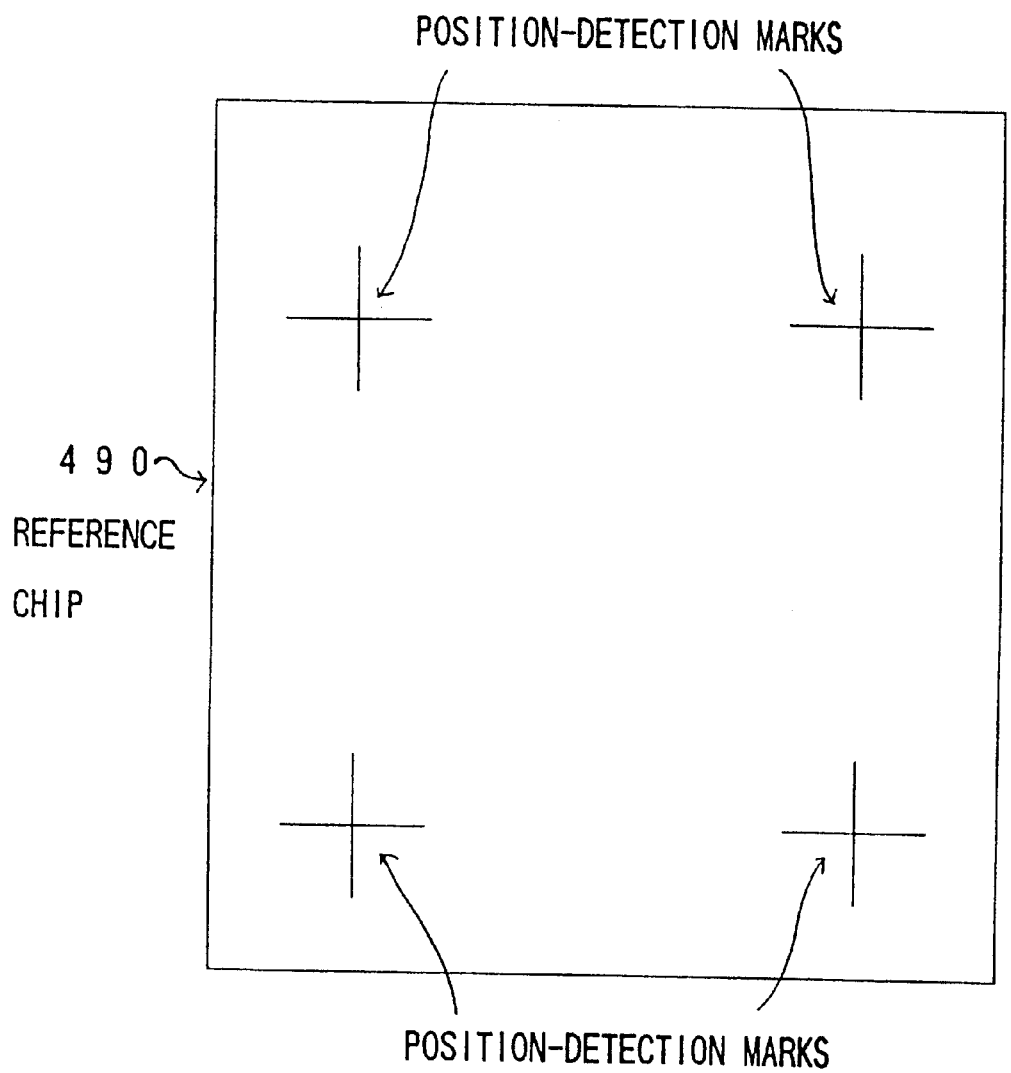
FIG. 30 is an illustrative drawing showing a reference chip provided with four position-detection marks according to the fourth principle of the present invention.

FIG. 30 is an illustrative drawing showing a reference chip 490 provided with four position-detection marks according to the fourth principle of the present invention. The reference chip 490 is placed on the stage 435 of the charged-particle-beam exposure device 400. The reference chip 490 is preferably a heavy-metal layer such as Ta, W, Au, or the like patterned on an S1 wafer.

Figure 31:
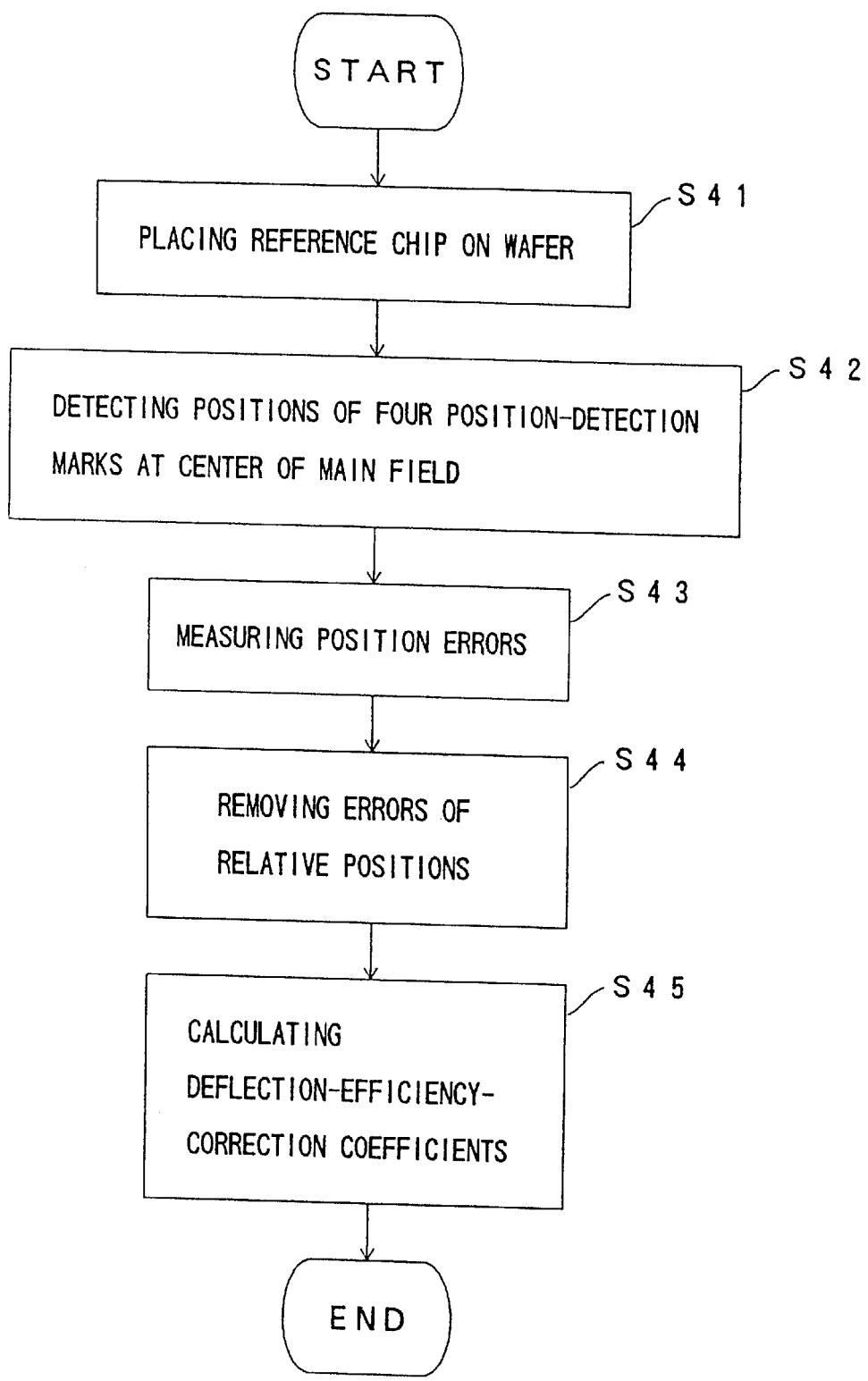
FIG. 31 is a flowchart of a process of correcting a deflection efficiency of a sub-deflector of FIG. 28 according to a first embodiment of the fourth principle.

FIG. 31 is a flowchart of a process of correcting the deflection efficiency of the sub-deflector according to a first embodiment of the fourth principle.

At a step S41, the reference chip 490 is placed on the stage 435 of the charged-particle-beam exposure device 400.

At a step S42, positions of the four position-detection marks are detected at a center of the main field, and errors of the relative positions of the four position-detection marks are stored in a memory of the control-purpose computer 483.

At a step S43, position errors (differences between detected positions and actual positions of the four position-detection marks) are measured. First, a center of the four position-detection marks is moved to a center of a given sub-field, and the charged-particle beam is deflected through the main deflector to the center of the sub-field. Then, the charged-particle beam is successively deflected through the sub-deflector to the four corners to detect positions of the position-detection marks. Finally, the position errors are calculated based on the detected positions of the position-detection marks.

At a step S44, the errors of the relative positions of the four position-detection marks stored in the memory are subtracted from the position errors, so that remaining position errors are calculated.

At a step S45, the deflection-efficiency-correction coefficients are calculated based on the remaining position errors. This ends the procedure.

The calculation of the deflection-efficiency-correction coefficients is carried out as follows.

A correction of the sub-field may be made by using correction coefficients Gx, Gy, Rx, Ry, Hx, and Hy as follows.

$$X'=Gx*X+Rx*Y+Hx*X*Y \tag{7}$$

$$Y'=Ry*X+Gy*Y+Hy*X*Y \tag{8}$$

Here, X' and Y' are voltages applied to the sub-deflector, and X and Y are coordinates to which the charged-particle beam is to be deflected. The correction coefficients Gx, Gy, Rx, Ry, Hx, and Hy are obtained as a map in the main field to carry out the sub-deflector's deflection-efficiency correction.

In order to obtain the correction coefficients Gx, Gy, Rx, Ry, Hx, and Hy, the following calculations are carried out. FIG. 32 is an illustrative drawing for explaining the calculations of the correction coefficients. Position errors detected at four corners A, B, C, and D of a rectangle having a side length L as shown in FIG. 32 are denoted as (δxa, δya), (δxb, δyb), (δxc, δyc), and (δxd, δyd), respectively. The following calculations are carried out first.

$$\delta Gx=(-\delta xa+\delta xb+\delta xc-\delta xd)/2L \tag{9}$$

$$\delta Gy=(-\delta ya-\delta yb+\delta yc+\delta yd)/2L \tag{10}$$

$$\delta Rx=(-\delta xa-\delta xb+\delta xc-\delta xd)/2L \tag{11}$$

$$\delta Ry=(-\delta ya+\delta yb+\delta yc-\delta yd)/2L \tag{12}$$

$$\delta Hx=(\delta xa-\delta xb+\delta xc-\delta xd)/L^2 \quad (13)$$

$$\delta Hy=(\delta ya-\delta yb+\delta yc-\delta yd)/L^2 \quad (14)$$

Here, δGx, δGy, δRx, δRy, δHx, and δHy are differences between the correction coefficients used at present and the correction coefficients which should be used. These differences are added to the correction coefficients used at present as shown in the following equations to update the correction coefficients.

$$Gx_{new}=Gx_{old}+\delta Gx \quad (15)$$

$$Gy_{new}=Gy_{old}+\delta Gy \quad (16)$$

$$Rz_{new}=Rx_{old}+\delta Rx \quad (17)$$

$$Ry_{new}=Ry_{old}+\delta Ry \quad (18)$$

$$Hx_{new}=Hx_{old}+\delta Hx \quad (19)$$

$$Hy_{new}=Hy_{old}+\delta Hy \quad (20)$$

The equations (9) through (14) for obtaining the differences are approximations derived by assuming that L is much greater than δx and δy. Thus, the measurement of the position errors and the updating of the correction coefficients are repeated until the position errors become sufficiently small. Then, the correction coefficients thus obtained are stored as a map.

In the first embodiment of the fourth principle, the reference chip having a plurality of the position-detection marks is used, so that the correction coefficients for the entire main field are obtained through stage movements equal to the number of the sub-fields. Therefore, the correction coefficients for the entire main field are obtained in a short period of time. Also, the errors of the relative positions of the position-detection marks may be measured in advance to cancel these errors at the time of obtaining the deflection efficiency. Thus, the correction coefficients are obtained in a short period of time at high precision.

FIG. 33 is a flowchart of a process of correcting the deflection efficiency of the sub-deflector according to a second embodiment of the fourth principle.

At a step S51, the reference chip 490 is placed on the stage 435 of the charged-particle-beam exposure device 400.

At a step S52, position errors (differences between detected positions and actual positions of the four position-detection marks) are measured. First, a center of the four position-detection marks is moved to a center of a given sub-field, and the charged-particle beam is deflected through the main deflector to the center of the sub-field. Then, the charged-particle beam is successively deflected through the sub-deflector to the four corners to detect positions of the position-detection marks. Finally, the position errors are calculated based on the detected positions of the position-detection marks.

At a step S53, errors of the relative positions of the four position-detection marks are measured by successively shifting the reference chip 490 through stage movement while keeping the charged-particle beam at a fixed position.

At a step S54, the errors of the relative positions of the four position-detection marks are subtracted from the position errors, so that remaining position errors are calculated.

At a step S55, the deflection-efficiency-correction coefficients are calculated based on the remaining position errors. This ends the procedure.

In the second embodiment of the fourth principle, the errors of the relative positions of the four position-detection marks are eliminated by using the position-detection mechanism through the stage movement in the charged-particle-beam exposure device. Thus, the correction coefficients are quickly obtained at a high precision without using another position detecting device.

Figure 34:
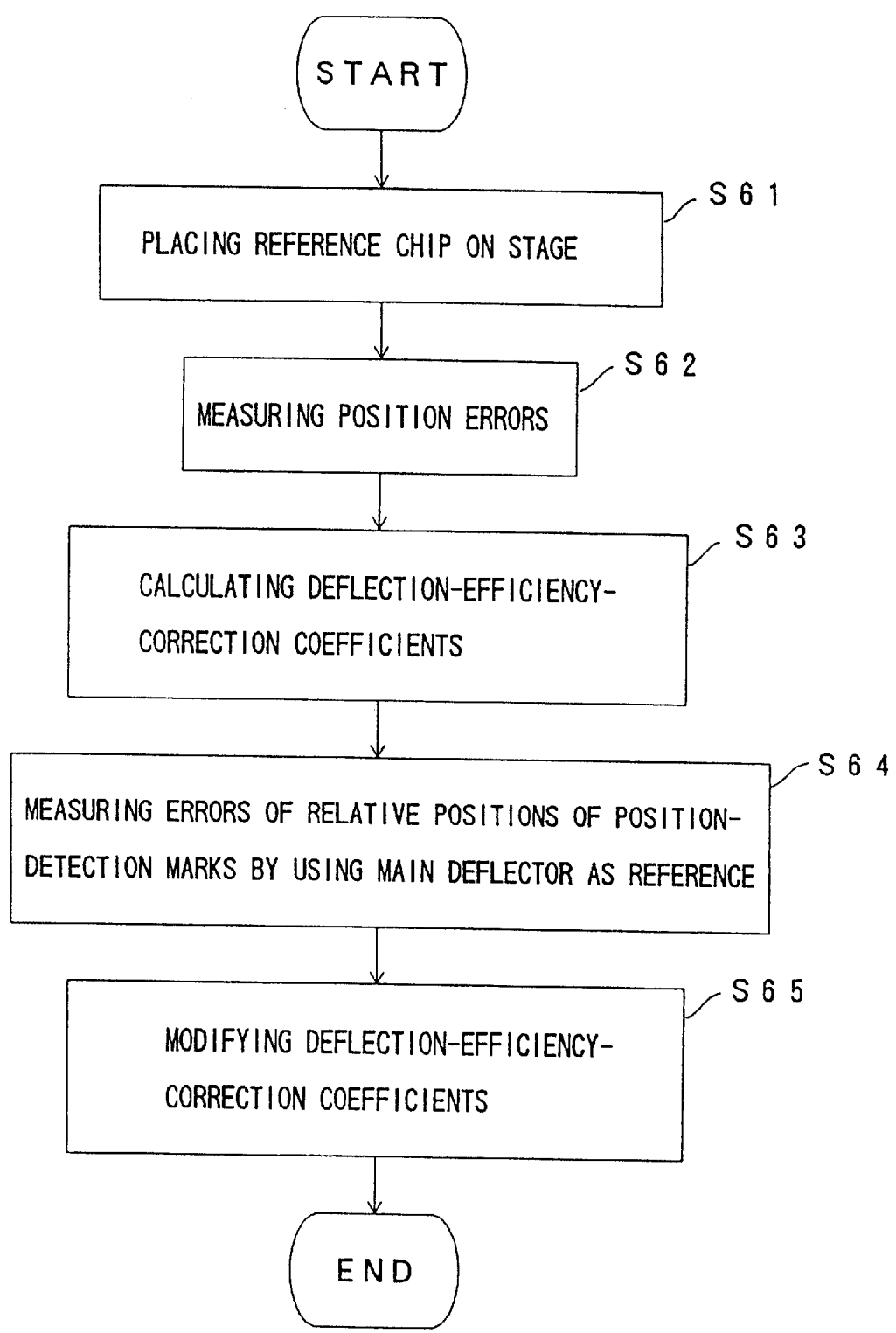
FIG. 34 is a flowchart of a process of correcting the deflection efficiency of the sub-deflector of FIG. 28 according to a third embodiment of the fourth principle.

FIG. 34 is a flowchart of a process of correcting the deflection efficiency of the sub-deflector according to a third embodiment of the fourth principle.

At a step S61, the reference chip 490 is placed on the stage 435 of the charged-particle-beam exposure device 400.

At a step S62, position errors (differences between detected positions and actual positions of the four position-detection marks) are measured. First, a center of the four position-detection marks is moved to a center of a given sub-field, and the charged-particle beam is deflected through the main deflector to the center of the sub-field. Then, the charged-particle beam is successively deflected through the sub-deflector to the four corners to detect positions of the position-detection marks. Finally, the position errors are calculated based on the detected positions of the position-detection marks.

At a step S63, the deflection-efficiency-correction coefficients are calculated from the position errors.

At a step S64, errors of the relative positions of the position-detection marks contained in the obtained deflection-efficiency-correction coefficients are measured by using one position-detection mark. First, the position-detection mark is moved to a center of the main field, and the charged-particle beam is deflected through the main deflector to the center of the main field. Next, the charged-particle beam is deflected through the sub-deflector to a corner of the sub-field, and, then, is deflected back to the center through the main deflector to detect a position of the position-detection mark. The same procedure is carried out for all the four corners of the sub-field. In this manner, the errors of the relative positions of the four position-detection marks contained in the position errors measured at the step S62 are obtained by using the main deflector as a reference.

At a step S65, the deflection-efficiency-correction coefficients are modified based on the errors of the relative positions of the four position-detection marks. This ends the procedure.

In the third embodiment of the fourth principle, the errors of the relative positions of the position-detection marks are eliminated by using one position-detection mark and the deflection amount of the sub-deflector as a reference. Thus, the precise correction coefficients are quickly obtained through a simple method.

Figure 35:
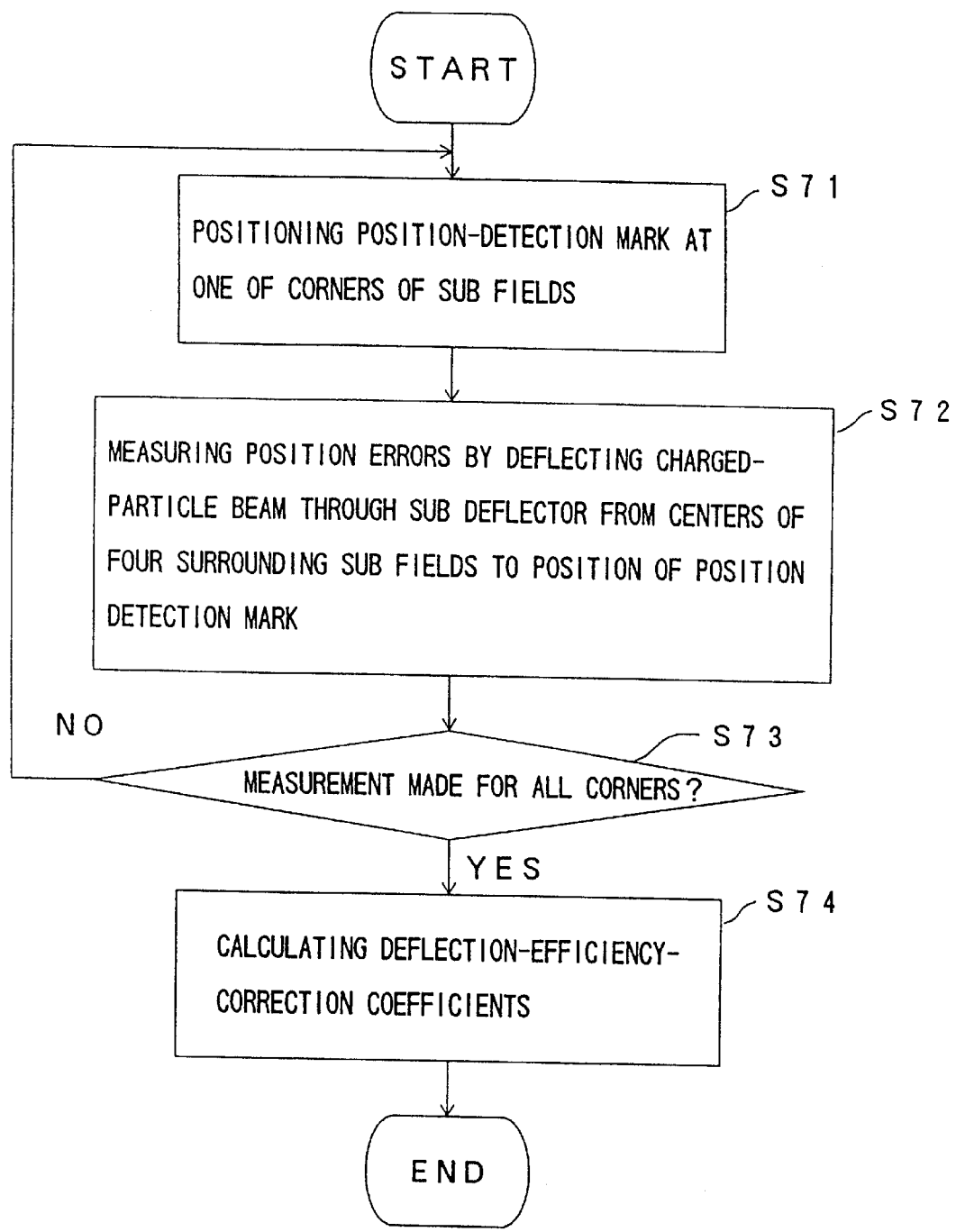
FIG. 35 is a flowchart of a process of correcting the deflection efficiency of the sub-deflector of FIG. 28 according to an embodiment of the fifth principle.

FIG. 35 is a flowchart of a process of correcting the deflection efficiency of the sub-deflector according to an embodiment of the fifth principle.

At a step S71, a position-detection mark is moved through stage movement to one of 21×21 measurement points in the main field having 20×20 sub-fields.

At a step S72, position errors are measured by deflecting the charged-particle beam through the sub-deflector from centers of four surrounding sub-fields to a position of the position-detection mark. First, the charged-particle beam is deflected through the main deflector to a center of one of the four surrounding sub-fields. Then, the charged-particle beam is deflected through the sub-deflector to the position-detection mark to detect the position-detection mark, and a detected position error is recorded. The same procedure is carried out for all the four surrounding sub-fields.

At a step S73, a check is made whether the measurements are made for all the 21×21 measurement points. If there are one or more remaining measurement points to be measured, the procedure goes back to the step S71 to repeat the above steps for the next measurement point. If there is no remaining measurement point, the procedure proceed to a step S74.

At the step S74, the deflection-efficiency-correction coefficients are calculated for all the measurement points based on the position errors. This ends the procedure.

In the embodiment of the fifth principle, the position-detection mark is moved through stage movement only once for each of the measurement points when the correction coefficients are to be obtained for each of the sub-fields. This utilizes the fact that a plurality of sub-fields share the measurement points as corners thereof. Namely, the correction coefficients for the entire main field are obtained through stage movements equal to the number of the measurement points. Thus, the correction coefficients are obtained taking a short period of time.

As described above, according to the fourth principle of the present invention, use of the reference chip having a plurality of position-detection marks makes it possible to collect the correction data for a plurality of points by requiring only one stage movement. Thus, the correction data is obtained in a short period of time.

Also, according to the fourth principle of the present invention, the correction coefficients for the entire main field are obtained through stage movements equal to the number of the sub-fields. Thus, the correction coefficients for the entire main field are obtained taking a short period of time.

Also, according to the fourth principle of the present invention, the errors of the relative positions of the position-detection marks can be eliminated by measuring these errors in advance. Thus, the correction coefficients are obtained at high precision in a short period of time.

Also, according to the fourth principle of the present invention, the errors of the relative positions of the position-detection marks are measured by using the position detecting mechanism of the charged-particle-beam exposure device. Thus, the correction coefficients are obtained at high precision in a short period of time without requiring another position detection device. Here, the position detecting mechanism of the charged-particle-beam exposure device may be a mechanism of the stage movement, which can be used as a measure for detecting the relative positions of the position-detection marks.

Also, according to the fourth principle of the present invention, the correction coefficients may be corrected by using the deflection amount of the main deflector as a reference. Thus, the precise correction coefficients are quickly obtained through a simple method.

Also, according to the fourth principle of the present invention, the errors of the relative positions of the position-detection marks contained in the correction coefficients are eliminated by using one position-detection mark and the deflection amount of the deflector as a reference. Thus, the precise correction coefficients are quickly obtained through a simple method.

Furthermore, according to the fifth principle of the present invention, the position-detection mark is moved through stage movement only once for each of the measurement points when the correction coefficients are to be obtained for each of the sub-fields. This utilizes the fact that a plurality of sub-fields share the measurement points as corners thereof. Namely, the correction coefficients for the entire main field are obtained through stage movements equal to the number of the measurement points. Thus, the correction coefficients are obtained taking a short period of time.

Consequently, according to the fourth and fifth principles of the present invention, highly precise beam calibration is carried out in a short period of time. Thus, the fourth and fifth principles of the present invention can greatly contribute to the development of the semiconductor exposure technology.

Moreover, there are other problems concerning the present invention, and these problems will be described below.

With recent advancement in the circuit density of integrated circuits, there has been a shift in use of technology for patterning semiconductor wafers from the photolithography technique widely used for a long time to the charged-particle-beam exposure technique employing such beam as an electron beam.

The charged-particle-beam exposure technique includes the variable-rectangle technique and the block exposure technique classified according to a pattern shape formed by one beam shot. In the block exposure technique, a charged-particle beam passes through a mask having unit patterns, so that even a complex pattern can be exposed at one shot. These unit patterns are generally the patterns which repeatedly appear on one chip. Thus, the block exposure technique is particularly useful for 256-Mbit DRAM chips, for example, because most areas of the chip has repetitive basic patterns despite micro structure thereof. Also, there is a technique called the BAA (blanking aperture array) technique. The BAA technique uses a BAA having apertures arranged therethrough in a matrix form, apertures being provided with a pair of electrodes. By switching on/off the voltage applied to the electrodes, each of the charged-particle beams passing through the apertures is independently turned on/off to form a pattern.

Figure 36:
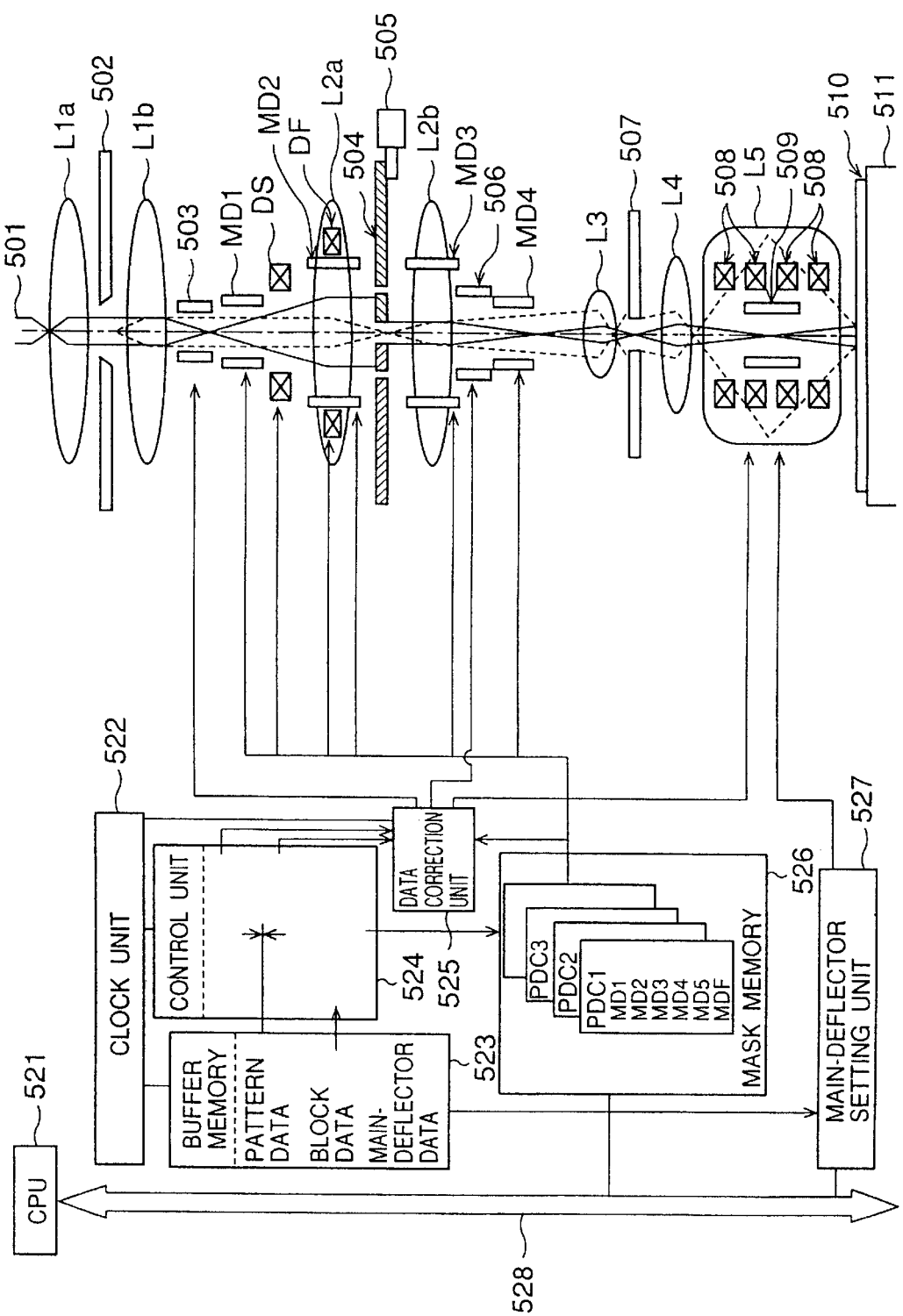
FIG. 36 is an illustrative drawing showing a configuration of an example of a charged-particle-beam exposure device using a block exposure technique.

FIG. 36 is an illustrative drawing showing a configuration of an example of the charged-particle-beam exposure device using the block exposure technique. The electron-beam exposure device includes an electron-beam gun 501, an electron-lens system L1a, a rectangular-hole plate 502, an electron-lens system L1b, a beam shaping deflector 503, a first mask deflector MD1, a dynamic-mask-focus coil DF, an electron-lens system L2a, a mask stage 505 carrying a block mask 504, an electron-lens system L2b, a third mask deflector MD3, a blanking deflector 506, a fourth mask deflector MD4, a convergence-electron-lens system L3, a round aperture 507, a projection-electron-lens system L4, a main deflector 508, a sub-deflector 509, a projection-electron-lens system L5, a wafer stage 511 carrying a wafer 510, and a control system. The control system includes a CPU 521, a clock unit 522 generating various clocks including an exposure clock, a buffer memory 523, a control unit 524, a data-correction unit 525, a mask memory 526, and a main-deflector setting unit 527. The CPU 521 controlling operations of the entire device is connected to a clock unit 522, a mask memory 526, and a main-deflector setting unit 527 via a bus 528. In the figure, the data-correction unit 525 and the main-deflector setting unit 527 are shown as including a digital-to-analog converting function and an amplifying function for convenience. A laser interferometer for measuring a position of the wafer stage 511 and a stage-movement mechanism for shifting the wafer stage 511 are disclosed in U.S. Pat. No. 5,173,582 and U.S. Pat. No. 5,194,741, respectively, for example. Thus, these are not shown in the figure, and a description thereof will be omitted.

An electron beam emitted from the electron-beam gun 501 passes through the rectangular-hole plate 502, and is deflected by the first mask deflector MD1 and the second mask deflector MD2 to a desired pattern on the block mask 504. The electron beam having a cross-sectional shape of the desired pattern is brought back to the optical axis through focusing functions of the electron-lens system L2a and the electron-lens system L2b and through deflection functions of the third mask deflector MD3 and the fourth mask deflector MD4. Then, the electron beam having the cross section converged through the convergence-electron-lens system L3 is directed to the wafer 510 by the projection-electron-lens system L4 and the projection-electron-lens system L5. In this manner, the desired pattern is exposed on the wafer.

The buffer memory 523 stores exposure-pattern data regarding patterns to be exposed on the wafer 510 and block data regarding mask patterns formed through the block mask 504. The exposure-pattern data includes main-deflector data supplied to the main deflector 508. The mask memory 526 includes relations between mask-pattern positions and deflection data measured prior to an exposure process, and includes correction data used for correcting the deflection data supplied to the dynamic-mask stigmator DS and the dynamic-mask-focus coil DF.

The exposure-pattern data stored in the buffer memory 523 after being read by the CPU 521 includes pattern-data codes PDC indicating which one of the mask patterns on the block mask 504 is to be used for an exposure. The control unit 524 uses the pattern-data codes PDC to read from the mask memory 526 the deflection data for deflecting the electron beam to a position of a selected mask pattern, and, then, supplies the deflection data to the first through fourth deflector MD1 through MD4 for selecting the pattern. The deflection data read from the mask memory 526 is also provided for the data-correction unit 525. Here, the reading of the deflection data from the mask memory 526 is carried out based on an exposure clock generated by the clock unit 522.

The main-deflector setting unit 527 reads main-deflector data for the main deflector 508 from the buffer memory 523 based on a clock from the clock unit 522, and supplies the main-deflector data to the main deflector 508. Deflection data for the sub-deflector 509, the beam shaping deflector 503, and the blanking deflector 506 is broken down into shot data by the control unit 524 according to data stored in the buffer memory 523. The shot data is supplied to the sub-deflector 509, the beam shaping deflector 503, and the blanking deflector 506 via the data-correction unit 525. Namely, the control unit 524 determines a size of the electron beam and a position on the block mask 504 of the electron beam according to the data stored in the buffer memory 523 to supply the size and the position to the data-correction unit 525 when the variable-rectangle exposure is used. The data-correction unit 525 corrects the deflection data of the electron beam for a pattern to be exposed based on the correction data read from the mask memory 526. The deflection data of the beam shaping deflector 503 determines the size of the variable rectangle of the electron beam, and the deflection data of the blanking deflector 506 is set for each shot of exposure.

Figure 37:
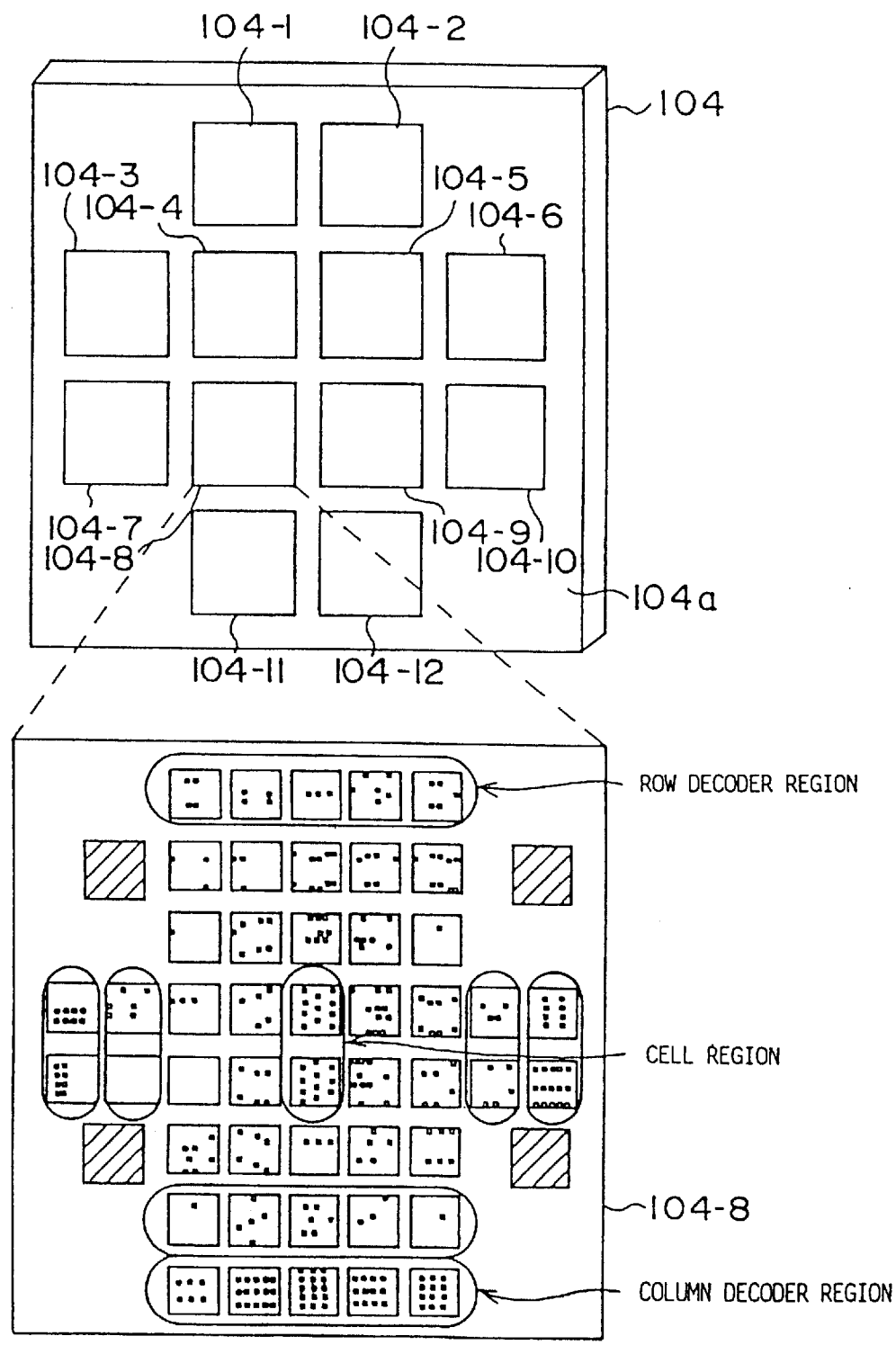
FIG. 37 is an illustrative drawing showing an example of a block mask of FIG. 36.

FIG. 37 is an illustrative drawing showing an example of the block mask 504. In the figure, the block mask 504 includes a substrate 504a made of metal or semiconductor like silicon and deflection areas 504-1 through 504-12 formed on the substrate 504a. Each of the deflection areas 504-1 through 504-12 has a plurality of mask patterns formed therein. In the electron-beam exposure device using the block exposure, an area of the mask patterns which can be selected by deflecting the electron beam from a predetermined position on the mask stage 505 is limited. Each of the deflection areas 504-1 through 504-12 is a 5-mm square, for example, corresponding to this limit. When the mask patterns within the deflection area 504-8 are to be exposed, for example, the mask stage 505 is shifted such that the electron-optical-system axis of the device roughly coincides with a center of the deflection area 504-8.

As shown in an example of FIG. 37, the number of the mask patterns arranged in the deflection area 504-8 is 48. Each of the mask patterns is identified based on the pattern-data codes PDC. Namely, the pattern-data codes PDC are an indicator for reading data corresponding to a given mask pattern from the mask memory 526 by using an exposure clock of maximum 10 MHz, for example, provided from the clock unit 522. As described above, the mask memory 526 stores the relations between the mask-pattern positions and the deflection data and the correction date to be supplied to the dynamic-mask stigmator DS and the dynamic-mask-focus coil DF for deflecting the electron beam to a given mask pattern. The deflection data and the correction data for a given deflection area are obtained by adjusting the electron beam prior to an exposure process, and are stored in the mask memory 526.

In order to conduct an exposure process at higher speed, a waiting time for a shot, i.e., a time period required for deflecting the electron beam, must be reduced. Although an illustrative description is omitted in FIG. 36, the deflection data is provided for the main deflector 508, etc., via amplifiers. Thus, a settling time of such amplifiers (a time period required for the amplifiers to be stable) largely determines the waiting time for a shot. Therefore, it in desirable to reduce the waiting time for a shot by reducing the settling time of such amplifiers, so that a redundant time involved in the drawing of patterns is decreased in the electron-beam exposure device to boost the throughput.

FIG. 38 is a block diagram of an exemplary driving unit of the main deflector 508. In the figure, the deflection data from the main deflector setting unit 527 is supplied to a driving system 610 via a digital-to-analog converter (DAC) 601, a current-to-voltage converter (IV converter) 602, and a resistor 603. The driving system 610 includes a resistor 604, a resistor 605, a differential amplifier 606, and a capacitor 607. The main deflector 508 includes a coil 608 which is an inductor impedance.

In the driving unit of FIG. 29, there is a large delay in the feedback because of the main deflector 508 comprising the coil 608. FIGS. 39A through 39C are time charts showing signals observed at various points of FIG. 38. When an input signal shown in FIG. 39A is applied to a node A of FIG. 39, for example, an output signal appearing at a node B would have a ringing effect as shown in FIG. 39B if the capacitor 607 were not provided In order to shorten the settling time of the output signal, the capacitor 607 for preventing the ringing effect is connected in parallel with the resistor 604 to lower the frequency range of the differential amplifier 606. Namely, the existence of the capacitor 607 lowers a frequency characteristic of the differential amplifier 606 to reduce a through rate.

The existence of the capacitor 607, however, makes a change in the input of the differential amplifier 606 extremely slow, so that a signal as shown in FIG. 39C is observed as the output signal at the node B. This creates a problem of a long settling time of the differential amplifier 606. Because of this, the waiting time for a shot should be set in accordance with this long settling time, thereby hindering an effort to enhance the throughput of the device.

Accordingly, there is a need for a charged-particle exposure device which can shorten the settling time of the amplifier to reduce the waiting time for a shot by suppressing the ringing effect of an amplifier output without lowering the frequency range of the amplifier.

FIG. 40 is an block diagram of a main part of a charged-particle-beam exposure device according to a first embodiment of a sixth principle of the present invention. In FIG. 40, the same elements as those of FIG. 38 are referred to by the same numerals. In this embodiment, the sixth principle of the present invention is applied to an electron-beam exposure device, and a first embodiment of a charged-particle-beam exposure method is used in the device.

FIG. 40 shows a driving unit of the main deflector 508. In the figure, the deflection data from the main-deflector setting unit 527 is supplied to the driving system 610 via the digital-to-analog converter 601, the current-to-voltage converter 602, and the resistor 603. The driving system 610 includes the resistor 504, the resistor 605, and the differential amplifier 606. The main deflector 508 includes the coil 608 which is an inductor impedance. A node N connects the resistor 603, the resistor 604, a resistor 705, and a reverse input node of the differential amplifier 606 together. The other input node of the differential amplifier 606 is connected to a ground. A node D connects the resistor 604 and the resistor 605, and the coil 608 is interposed between the node D and the output node of the differential amplifier 606.

A pulse generating circuit 701 generates a pulse signal having a reversed phase to a first wave of the ringing appearing in the output of the differential amplifier 606 in order to cancel the first wave of the ringing. The generation of the pulse signal is based on the deflection data provided from the main-deflector setting unit 527. The pulse signal is supplied to the differential amplifier 606 via the resistor 705. A pulse length of the pulse signal is shorter than a time period from a start of the first wave of the ringing to a start of the second wave of the ringing. The pulse generating circuit 701 includes a pulse-parameter outputting circuit 702, a DAC 703, and an IV converter 704. The pulse-parameter outputting circuit 702 generates pulse parameters to suppress the ringing appearing at the node D based on the deflection data from the main-deflector setting unit 527. The pulse parameter include a pulse-delay time, a pulse length, a magnitude, etc., of the pulse signal generated by the pulse generating circuit 701. The pulse parameters are applied to a node C via the DAC 703 and the IV converter 704. It is desirable to be able to set at least one of the pulse parameters, and, also, it is desirable to be able to set each of the pulse parameters independently from each other.

FIGS. 41A through 41D are time charts showing signals observed at various points of FIG. 40. FIG. 41A shows an input signal applied to the node A of FIG. 40. FIG. 41B shows an output signal which would appear at the node D if the pulse generating circuit 701 were not provided. FIG. 41C shows a pulse signal generated by the pulse generating circuit 701 and applied to the node C. FIG. 41D shows an output signal appearing at the node D when the pulse generating circuit 701 is provided. In the first embodiment, the pulse signal appearing at the node C is added to a signal applied to the reverse input node of the differential amplifier 606 to cancel the delayed response fed back to the differential amplifier 606, so that the ringing shown in FIG. 41B is suppressed. Therefore, the differential amplifier 606 for an inductor impedance has a shorter settling time without sacrificing the frequency characteristic of the differential amplifier 606.

Figure 42:
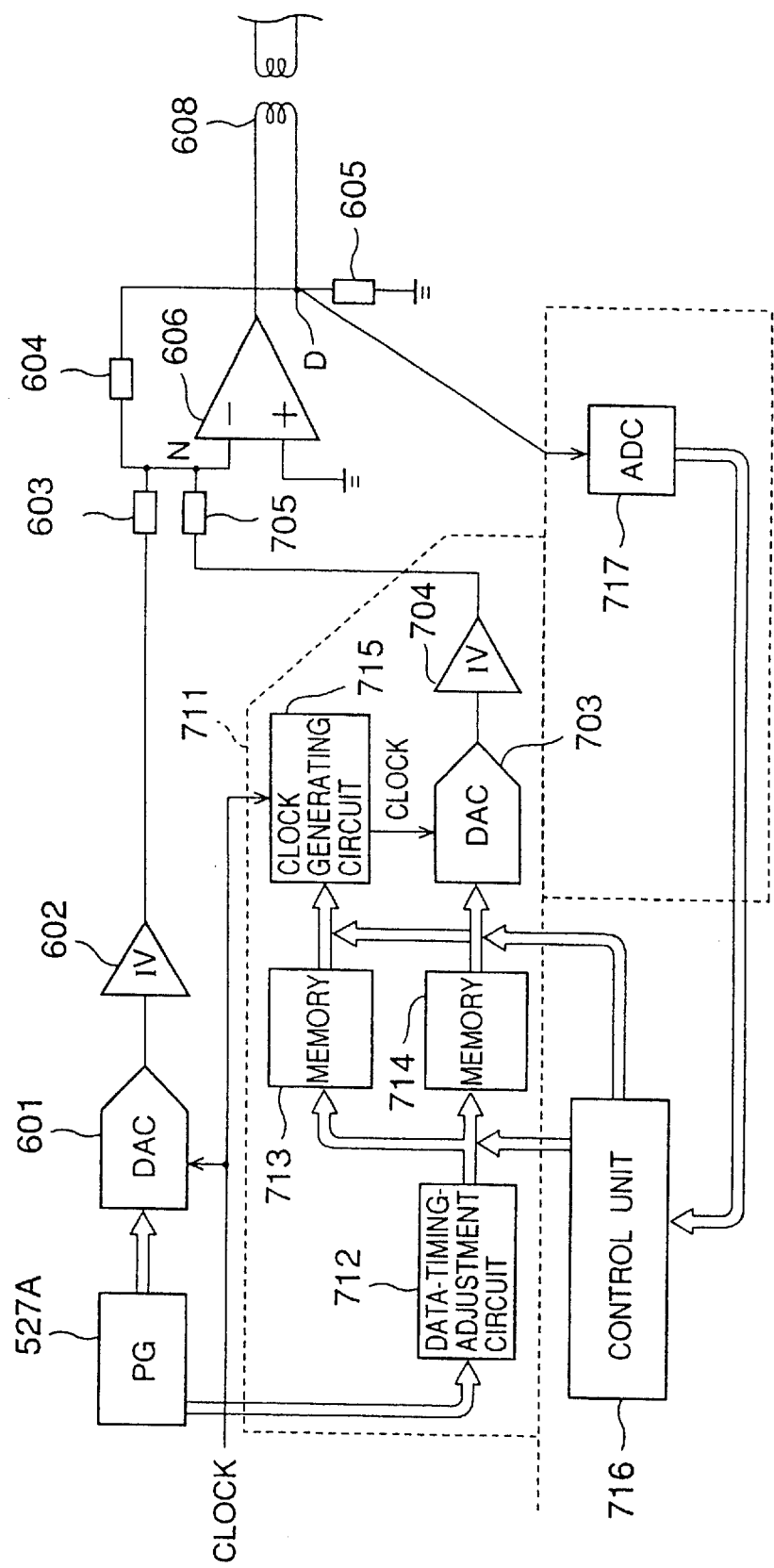
FIG. 42 is a block diagram of a main part of a charged-particle-beam exposure device according to a second embodiment of the sixth principle of the present invention.

FIG. 42 is a block diagram of a main part of a charged-particle-beam exposure device according to a second embodiment of the sixth principle of the present invention. In FIG. 42, the same elements as those of FIG. 40 are referred to by the same numerals. In this embodiment, the sixth principle of the present invention is applied to an electron-beam exposure device, and a second embodiment of a charged-particle-beam exposure method is used in the device.

In FIG. 42, the deflection data is generated by a pattern generating (PG) unit 527A, and is supplied to the digital-to-analog converter 601 and a pulse generating circuit 711. The pulse generating circuit 711 includes a data-timing-adjustment circuit 712, a memory 713, a memory 714, a clock generating circuit 715, the DAC 703, and the IV converter 704. A clock supplied to the digital-to-analog converter 601 and the clock generating circuit 715 is provided from the clock unit 522 of FIG. 36, for example. The DAC 703 is provided with a clock from the clock generating circuit 715. An output signal at the node D is supplied to a control unit 716 via a analog-to-digital converter (ADC) 717 constituting a feedback-adjustment system. The control unit 716 corresponds to the control unit 524 of FIG. 36, for example.

A change in the data from the pattern generating unit 527A from n-th data to n+1-th data appears as a change in the output of the differential amplifier 606. The feedback of the voltage change at the node D to the control unit 716 via the analog-to-digital converter 717 makes it possible for the analog-to-digital converter 717 to monitor the output change of the differential amplifier 606. The control unit 716 takes a derivation of the data fed back via the analog-to-digital converter 717, and obtains pulse parameters which make the derivation become zero in the shortest period of time. That is, the pulse parameters for suppressing the first wave of the ringing appearing at the node D are obtained. In practice, the control unit 716 calculates derivations of the data provided from the analog-to-digital converter 717 while changing the pulse parameters, and obtains optimal values of the pulse parameters with which the derivation becomes zero the fastest. When obtaining the optimal values of the pulse parameters, the control unit 716 supplies pulse parameters regarding the pulse delay and the pulse length to the clock generating circuit 715, and supplies a pulse parameter concerning the pulse magnitude to the DAC 703.

The optimal pulse parameters obtained by the control unit 716 are stored in the memories 713 and 714 at addresses indicated by the data change from the n-th data to the n+1-th data provided from the pattern generating unit 527A. Here, the optimal pulse parameters regarding the pulse delay and the pulse length are stored in the memory 713, and the optimal pulse parameter regarding the pulse magnitude is stored in the memory 714. The storing of the optimal pulse parameters in the memories 713 and 714 is carried out for three types of data changes. The optimal pulse parameters for other data changes are obtained based on an approximation function $\delta_{para}$ derived from the optimal pulse parameters for the three types of data changes.

$$\delta_{para}=P(X_{n+1}-X_n)\times Q(X_n) \quad (21)$$

In the equation (21), P is a function of a jump amount of the data, and Q is a linear interpolation function.

Namely, the pulse parameters are proportional to a change in the input data, i.e., a difference in the data or the jump amount of the data, and receives an effect of the jump-start point $X_n$ as a correction by a multiplication form. $Q(X_n)$ is a linear interpolation function having values equal to monitored values at points monitored by the control unit 716. Based on the approximation function $\delta_{para}$, the optimal pulse parameters are obtained for every possible input-data change, i.e., every possible jump amount. Then, the optimal pulse parameters are finely adjusted by repeating the same procedure as that of having obtained the optimal pulse parameters the first time. Therefore, the optimal pulse parameters for every possible input-data change are obtained in a relatively short period of time.

An operation at a time of exposure will be described below. The deflection data provided from the pattern generating unit 527A for the n+1-th pattern data is supplied as a data change from the n-th data to the n+1-th data to the differential amplifier 606 via the digital-to-analog converter 601, the current-to-voltage converter 602, and the resistor 603. The data-timing-adjustment circuit 712 adjusts the data timing of the n-th data and the n+1-th data to provide them simultaneously for the memories 713 and 714 as addresses thereof. In this manner, the pulse parameters regarding the pulse delay and the pulse length are read from the memory 713 to be supplied to the clock generating circuit 715. Also, the pulse parameter regarding the pulse magnitude is read from the memory 714 to be supplied to the DAC 703.

Figure 43:
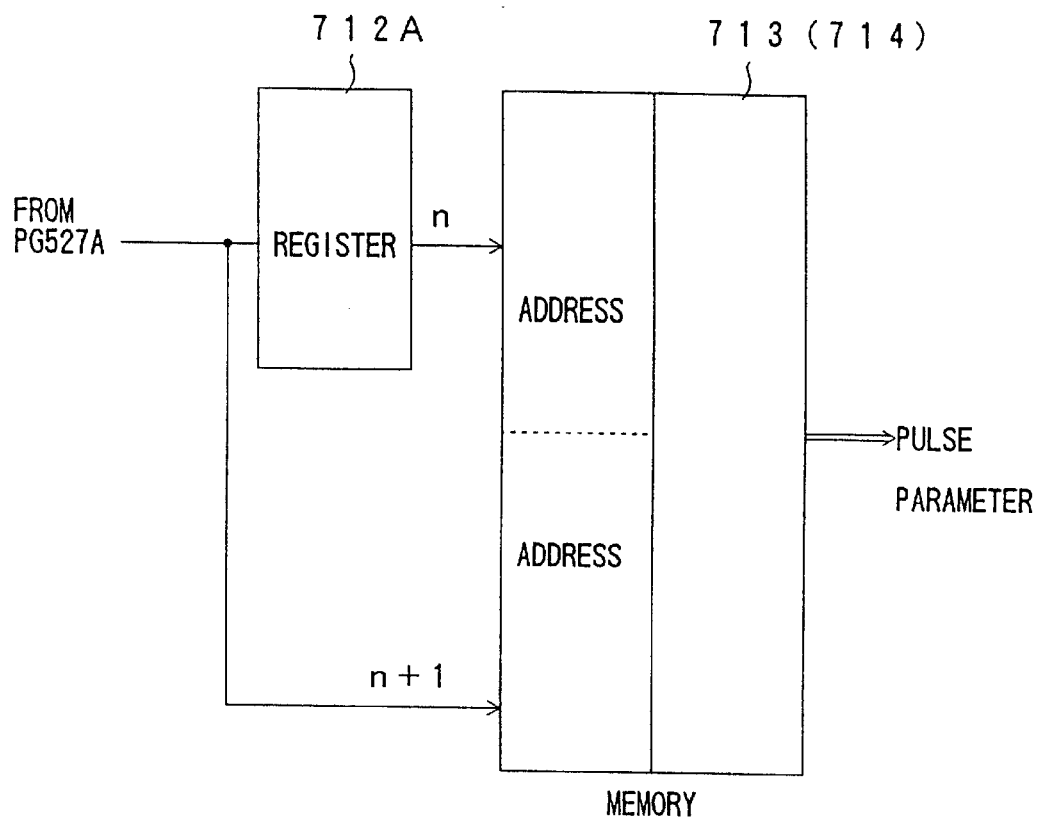
FIG. 43 is a block diagram of an example of a data-timing-adjustment circuit of FIG. 42 shown with memories.

FIG. 43 is a block diagram of an example of the data-timing-adjustment circuit 712 shown with the memory 713 and the memory 714. In the figure, the memory 713 and the memory 714 are shown as one memory for convenience of explanation. The data-timing-adjustment circuit 712 includes a register 712A, so that the n-th data temporarily stored in the register 712A is supplied to the memory at the same time as the n+1-th data is supplied.

The clock generating circuit 715 generates a clock in response to a clock synchronizing with the n+1-th data from the clock unit 522 based on the pulse parameters regarding the pulse delay and the pulse length read from the memory 713. The generated clock is sent to the DAC 703. The pulse parameter regarding the pulse magnitude read from the memory 714 is supplied to the DAC 703 as weighting data. An output of the DAC 703 is provided for the node N via the IV converter 704 and the resistor 705 to be added to an output of the digital-to-analog converter 601 provided via the current-to-voltage converter 602 and the resistor 603. A signal after the addition is supplied to the reverse input node of the differential amplifier 606.

FIG. 44A is a time chart showing a clock provided from the clock unit 522 to the digital-to-analog converter 601 and the clock generating circuit 715. FIG. 44B is a time chart showing an output signal observed at the node D when the pulse generating circuit 711 is not provided. FIG. 44C is a time chart showing a clock provided from the clock generating circuit 715 to the DAC 703. FIG. 44D is a time chart showing a correction pulse signal output from the IV converter 704.

FIGS. 45A and 45B are time charts showing output voltages obtained through a simulation. FIG. 45A shows an output voltage obtained at the node D when the pulse generating circuit 711 for applying the correction pulse signal to the node N is not provided. FIG. 45B shows an output voltage obtained at the node D when the pulse generating circuit 711 is provided to apply the correction pulse signal to the node N. As shown in FIGS. 45A and 45B, the ringing of the output voltage is suppressed according to the second embodiment of the sixth principle of the present invention.

Figure 46:
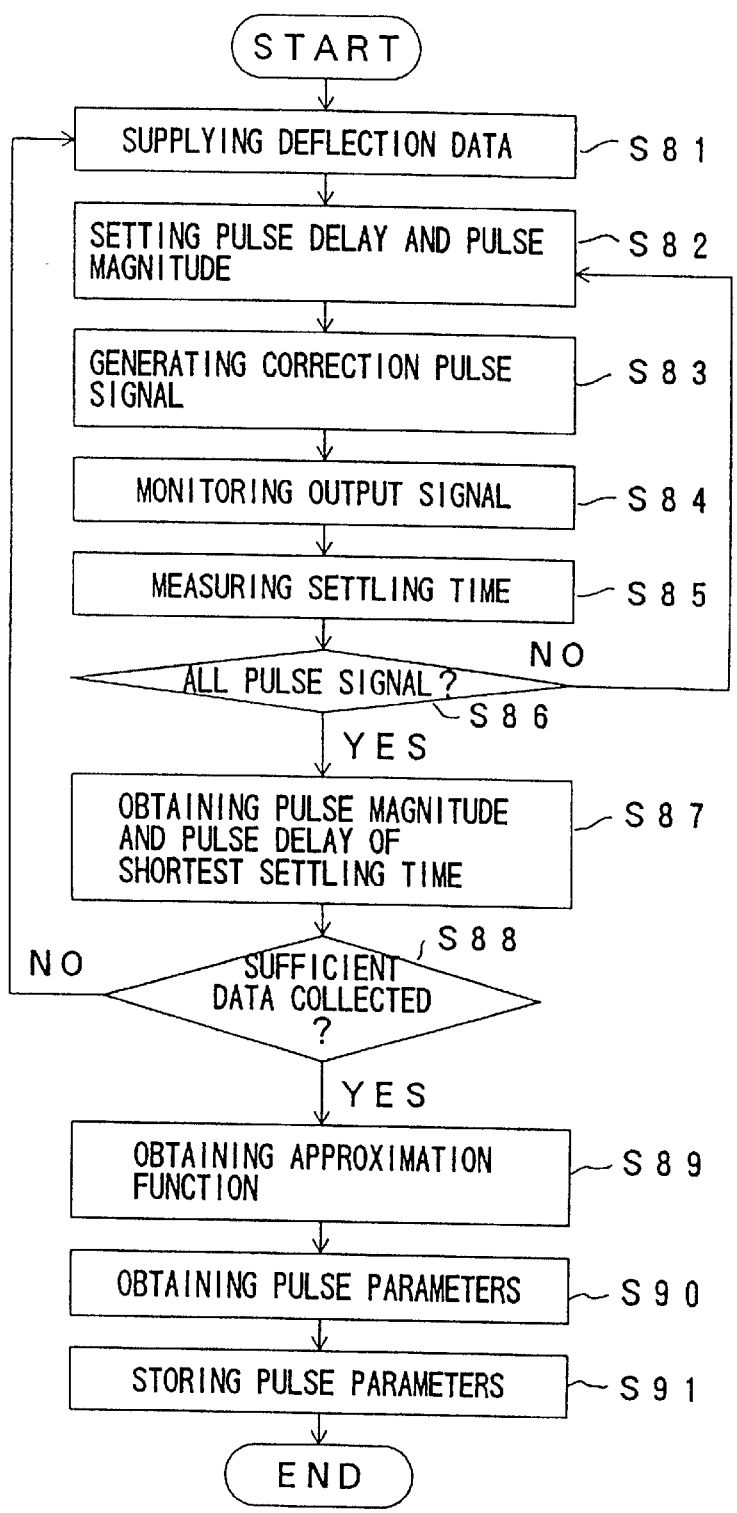
FIG. 46 is a flowchart of a process of obtaining optimal pulse parameters.

FIG. 46 is a flowchart of a process of obtaining the optimal pulse parameters. The process of obtaining the optimal pulse parameters will be described with reference to FIG. 46 and FIG. 42.

At a step S81, the deflection data generated by the pattern generating unit 527A is supplied to the differential amplifier 606 via the digital-to-analog converter 601, the current-to-voltage converter 602, and the resistor 603.

At a step S82, the pulse delay and the pulse magnitude are set in the pulse generating circuit 711 by the control unit 716.

At a step S83, the pulse generating circuit 711 generates a correction pulse signal based on the pulse parameters set at the step S82.

At a step S84, the control unit 716 monitors an output signal appearing at the node D via the analog-to-digital converter 717.

At a step S85, the control unit 716 measures the settling time of the monitored output signal.

At a step S86, the control unit 716 checks whether the correction pulse signal is generated by the pulse generating circuit 711 for all the pulse magnitudes and the pulse delays. If the answer is yes, the procedure goes to a step S87. Otherwise, the procedure goes back to the step S82.

At the step S87, the control unit 716 obtains the pulse magnitude and the pulse delay of the shortest settling time.

At a step S88, the control unit 716 checks whether sufficient data for obtaining the approximation function $\delta_{para}$ is collected. If it is not, the procedure goes back to the step S81. Otherwise, the procedure goes to a step S89.

At the step S89, the control unit 716 obtains the approximation function $\delta_{para}$ by using the collected data.

At a step S90, the control unit 716 obtains pulse parameters regarding the pulse magnitude, the pulse delay, and the pulse length for all the deflection data (deflection pattern).

At a step S91, the control unit 716 stores the obtained pulse parameters in the memories 713 and 714. This ends the procedure.

Figure 47:
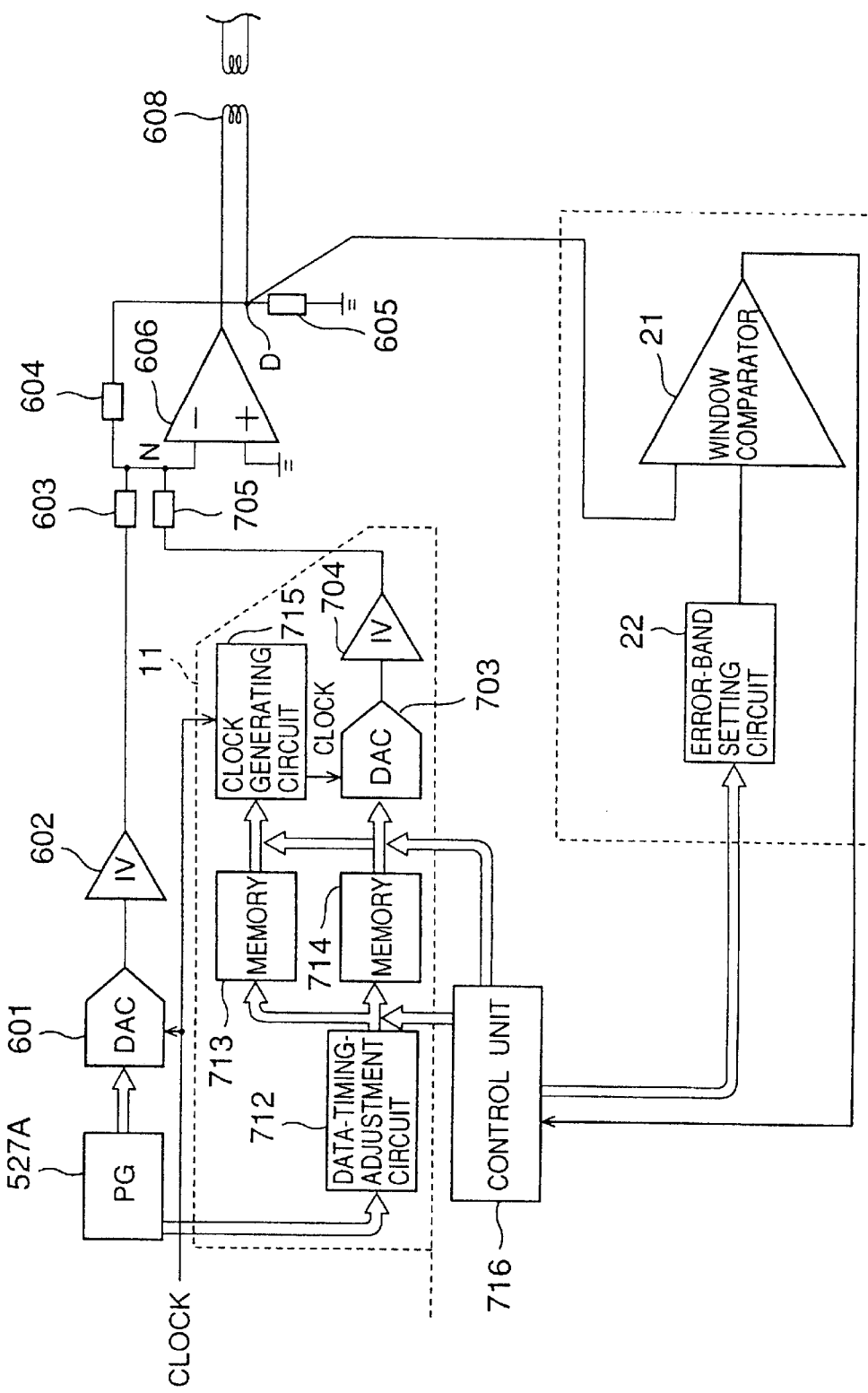
FIG. 47 is a block diagram of a main part of a charged-particle-beam exposure device according to a third embodiment of the sixth principle of the present invention.

FIG. 47 is a block diagram of a main part of a charged-particle-beam exposure device according to a third embodiment of the sixth principle of the present invention. In FIG. 47, the same elements as those of FIG. 42 are referred to by the same numerals, and a description thereof will be omitted. In this embodiment, the sixth principle of the present invention is applied to an electron-beam exposure device, and a third embodiment of a charged-particle-beam exposure method is used in the device.

In FIG. 47, the feedback adjustment system includes a error-band setting circuit 722 for setting an error-band width based on an instruction given by the control unit 716, and, also, includes a window comparator 721. The window comparator 721 compares the output signal obtained from the node D with the error-band width obtained from the error-band setting circuit 722 to generate a signal indicating whether the output signal falls in the error-band width. This signal is supplied to the control unit 716. The control unit 716 changes the pulse parameters to obtain the shortest time period from a start of a change in the output signal (voltage) at the node D to a time when the output signal falls within the error-band width. At the same time, the control unit 716 continues the feedback operation through the window comparator 721 to obtain the optimal pulse parameters. Other operations are the same as those of the second embodiment of the sixth principle described with reference to FIG. 42.

Figure 48:
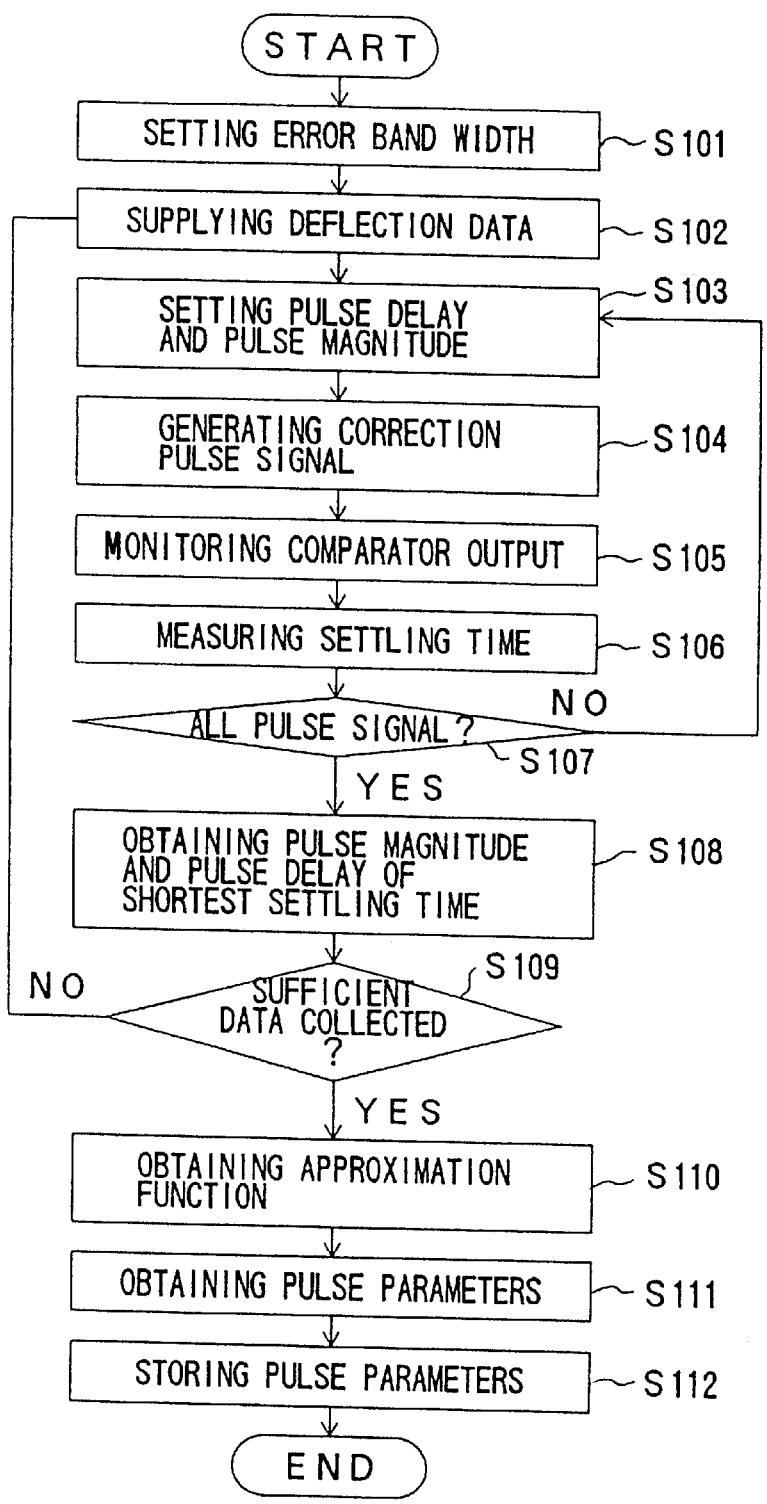
FIG. 48 is a flowchart of a process of obtaining the optimal pulse parameters according to the third embodiment of the sixth principle.

FIG. 48 is a flowchart of a process of obtaining the optimal pulse parameters according to the third embodiment of the sixth principle. This process of obtaining the optimal pulse parameters will be described with reference to FIG. 48 and FIG. 47.

At a step S101, the control unit 716 sends an instruction to the error-band setting circuit 722 to set an error-band width.

At a step S102, the deflection data generated by the pattern generating unit 527A is supplied to the differential amplifier 606 via the digital-to-analog converter 601, the current-to-voltage converter 602, and the resistor 603.

At a step S103, the pulse delay and the pulse magnitude are set in the pulse generating circuit 711 by the control unit 716.

At a step S104, the pulse generating circuit 711 generates a correction pulse signal based on the pulse parameters set at the step S103.

At a step S105, the control unit 716 monitors a signal obtained from the window comparator 721.

At a step S106, the control unit 716 measures the settling time of the monitored signal, i.e., measures a time period passing before the output signal at the node D falls within the error-band width.

At a step S107, the control unit 716 checks whether the correction pulse signal is generated by the pulse generating circuit 711 for all the pulse magnitudes and the pulse delays. If the answer is yes, the procedure goes to a step S108. Otherwise, the procedure goes back to the step S103.

At the step S108, the control unit 716 obtains the pulse magnitude and the pulse delay of the shortest settling time.

At a step S109, the control unit 716 checks whether sufficient data for obtaining the approximation function $\delta_{para}$ is collected. If it is not, the procedure goes back to the step S102. Otherwise, the procedure goes to a step S110.

At the step S110, the control unit 716 obtains the approximation function $\delta_{para}$ by using the collected data.

At a step S111, the control unit 716 obtains pulse parameters regarding the pulse magnitude, the pulse delay, and the pulse length for all the deflection data (deflection pattern).

At a step S112, the control unit 716 stores the obtained pulse parameters in the memories 713 and 714. This ends the procedure.

Figure 49:
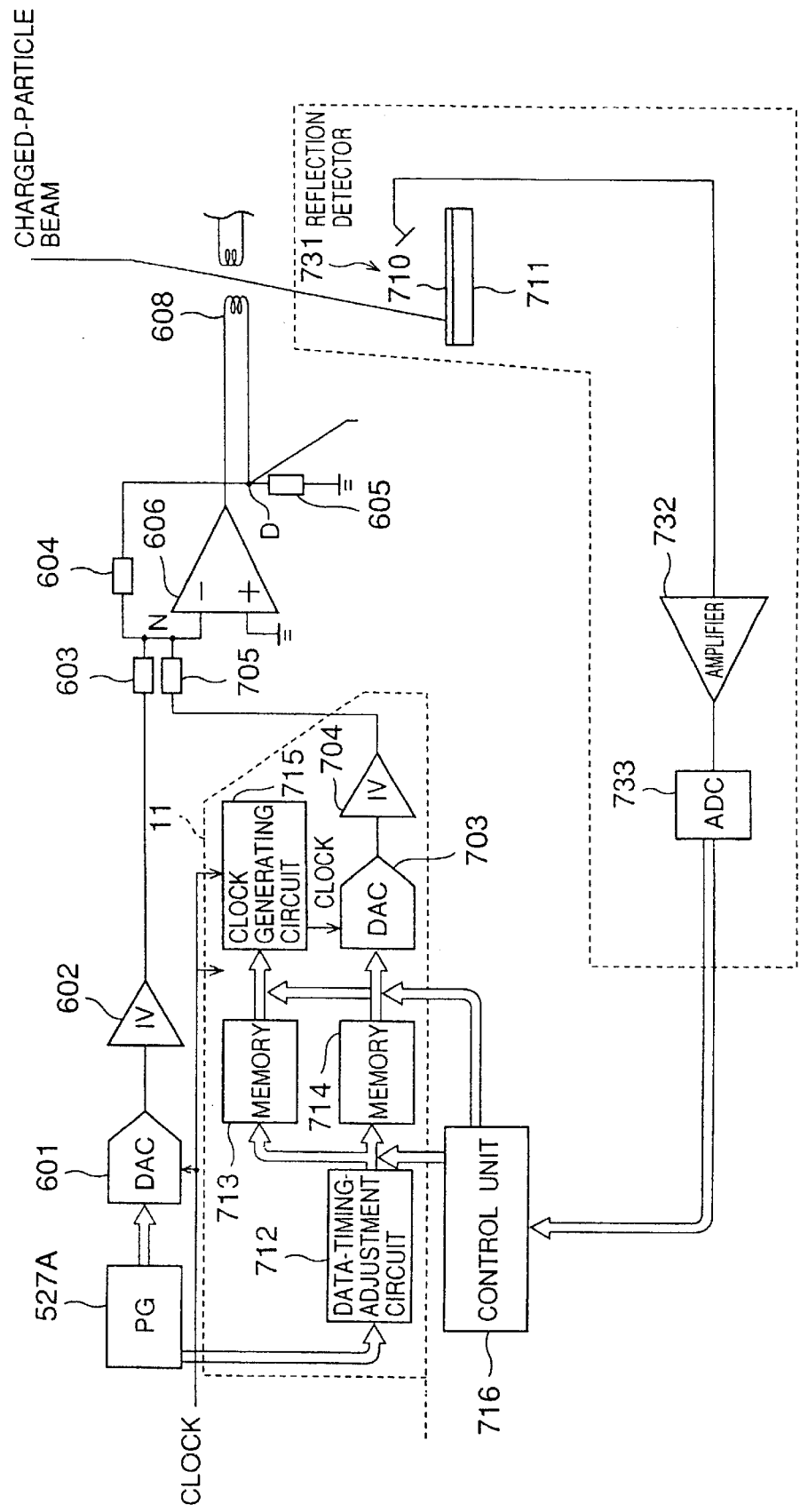
FIG. 49 is a block diagram of a main part of a charged-particle-beam exposure device according to a fourth embodiment of the sixth principle of the present invention.

FIG. 49 is a block diagram of a main part of a charged-particle-beam exposure device according to a fourth embodiment of the sixth principle of the present invention. In FIG. 49, the same elements as those of FIG. 42 are referred to by the same numerals, and a description thereof will be omitted. In this embodiment, the sixth principle of the present invention is applied to an electron-beam exposure device, and a fourth embodiment of a charged-particle-beam exposure method is used in the device.

In FIG. 49, the feedback adjustment system includes a reflection detector 731 detecting electrons of the electron beam scattered by the wafer 510, an amplifier 732 amplifies a detected signal of the reflection detector 731, and an ADC 733 converting an output of the amplifier 732 to digital data to be supplied to the control unit 716. The control unit 716 monitors movement of the electron beam based on the digital data provided from the ADC 733. In the same manner as in the second embodiment of the sixth principle, the control unit 716 takes a derivation of the digital data sent from the ADC 733 while changing a position of the electron beam, so as to obtain the optimal pulse parameters with which the derivation becomes zero in the shortest period of time. When obtaining the optimal pulse parameters, the control unit 716 supplies the pulse parameters regarding the pulse delay and the pulse length to the clock generating circuit 715, and supplies the pulse parameter regarding the pulse magnitude to the DAC 703. Other operations are the same as those of the second embodiment of the sixth principle described with reference to FIG. 42.

Figure 50:
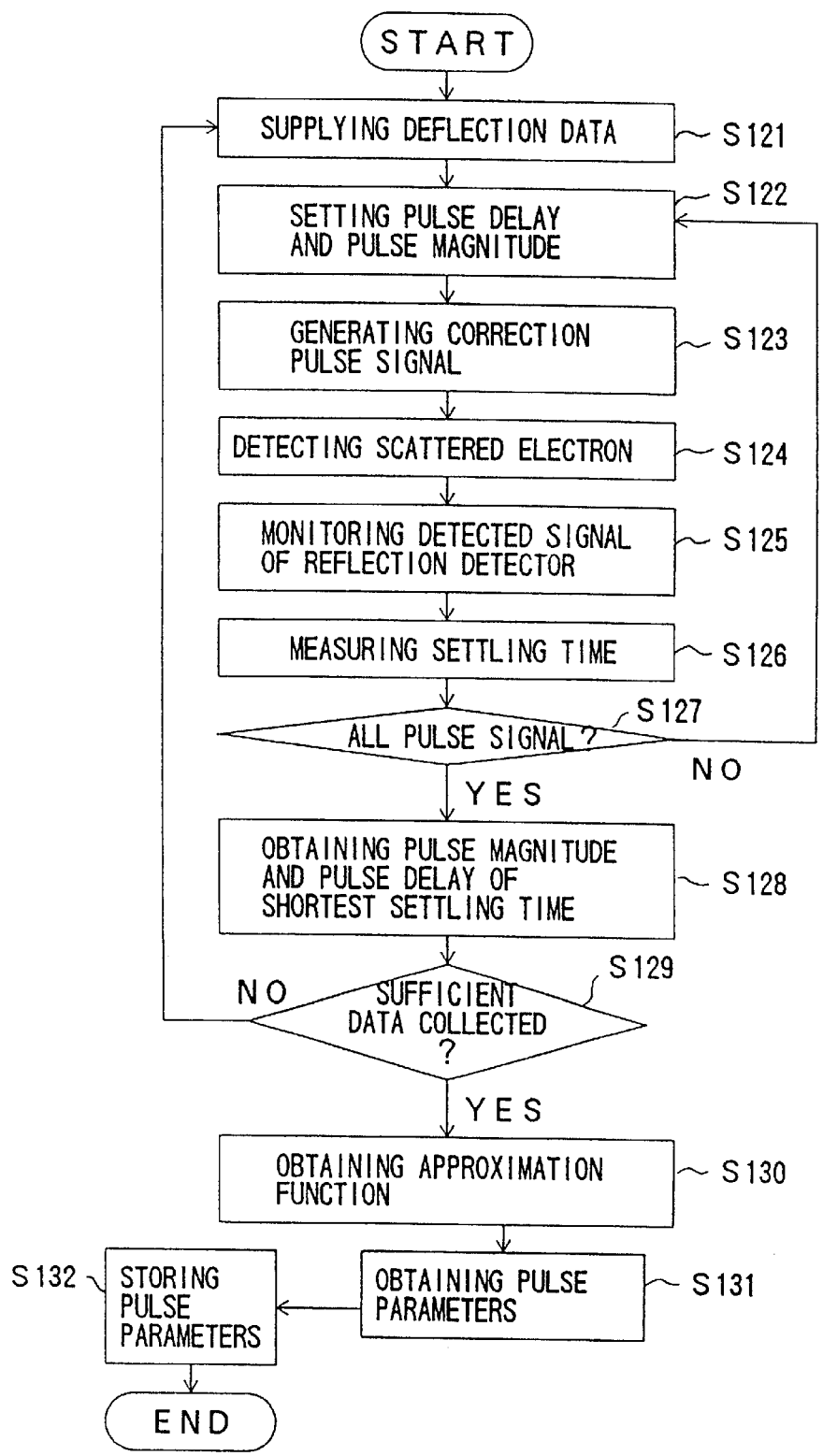
FIG. 50 is a flowchart of a process of obtaining the optimal pulse parameters according to the fourth embodiment of the sixth principle.

FIG. 50 is a flowchart of a process of obtaining the optimal pulse parameters according to the fourth embodiment of the sixth principle. This process of obtaining the optimal pulse parameters will be described with reference to FIG. 50 and FIG. 49.

At a step S121, the deflection data generated by the pattern generating unit 527A is supplied to the differential amplifier 606 via the digital-to-analog converter 601, the current-to-voltage converter 602, and the resistor 603.

At a step S122, the pulse delay and the pulse magnitude are set in the pulse generating circuit 711 by the control unit 716.

At a step S123, the pulse generating circuit 711 generates a correction pulse signal based on the pulse parameters set at the step S122.

At a step S124, the control unit 716 uses the reflection detector 731 to detect the scattered electrons while changing a position of the electron beam.

At a step S125, the control unit 716 monitors a detected signal of the reflection detector 731 via the amplifier 732 and the ADC 733.

At a step S126, the control unit 716 measures the settling time of the monitored detected signal.

At a step S127, the control unit 716 checks whether the correction pulse signal is generated by the pulse generating circuit 711 for all the pulse magnitudes and the pulse delays. If the answer is yes, the procedure goes to a step S128. Otherwise, the procedure goes back to the step S122.

At the step S128, the control unit 716 obtains the pulse magnitude and the pulse delay of the shortest settling time.

At a step S129, the control unit 716 checks whether sufficient data for obtaining the approximation function $\delta_{para}$ is collected. If it is not, the procedure goes back to the step S121. Otherwise, the procedure goes to a step S130.

At the step S130, the control unit 716 obtains the approximation function $\delta_{para}$ by using the collected data.

At a step S131, the control unit 716 obtains pulse parameters regarding the pulse magnitude, the pulse delay, and the pulse length for all the deflection data (deflection pattern).

At a step S132, the control unit 716 stores the obtained pulse parameters in the memories 713 and 714. This ends the procedure.

The above description of the sixth principle has been provided through an example in which the deflector is an electromagnetic deflector such as a main deflector. However, the sixth principle of the present invention can be applied to any types of deflectors as well as an electromagnetic deflector and a main deflector.

Figure 51A:
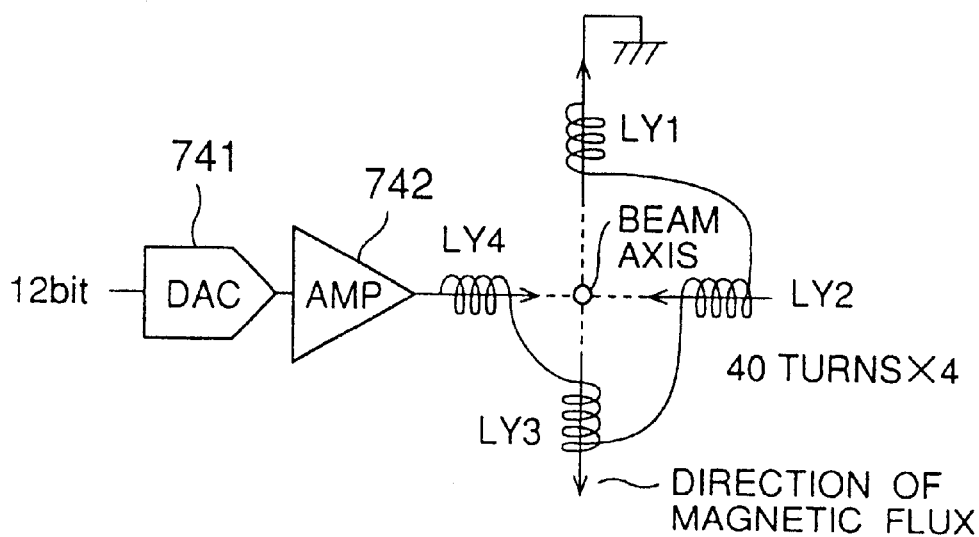
FIGS. 51A and 51B are circuit diagrams showing configurations of the dynamic-mask stigmator DS of FIG. 36.
Figure 51B:
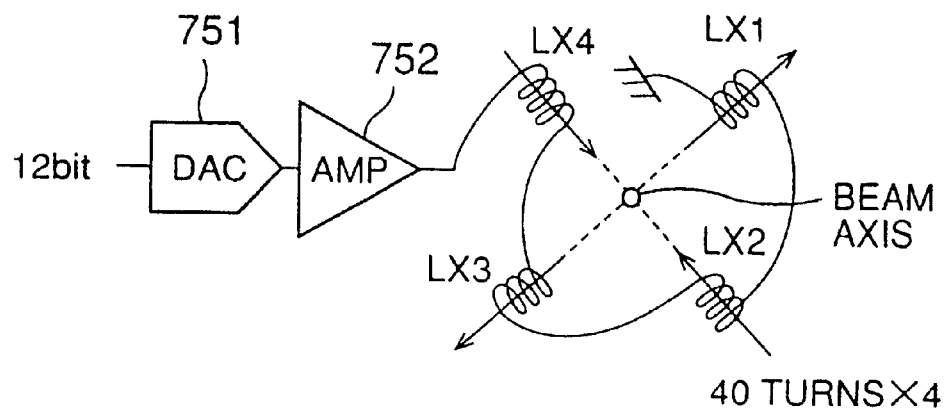

FIGS. 51A and 51B are circuit diagrams showing configurations of the dynamic-mask stigmator DS of FIG. 36. FIG. 51A shows a configuration of an X-axis portion of the dynamic-mask stigmator DS, and FIG. 51B shows a configuration of a Y-axis portion of the dynamic-mask stigmator DS.

In FIG. 51A, the X-axis portion of the dynamic-mask stigmator DS has a stigmator coil portion including coils LX1 through LX4, each comprising 40 turns, for example. The data having 12 bits, for example, is supplied via a DAC 741 and an amplifier 742 to the coils LX1 through LX4 connected in a series. In FIG. 51B, the Y-axis portion of the dynamic-mask stigmator DS has a stigmator coil portion including coils LY1 through LY4, each comprising 40 turns, for example. The data having 12 bits, for example, is supplied via a DAC 751 and an amplifier 752 to the coils LY1 through LY4 connected in a series. Settling times of the amplifiers 742 and 752 supplying the data to the dynamic-mask stigmator DS are mainly determined by the load of the dynamic-mask stigmator DS. Namely, the settling time of the amplifiers 742 and 752 are dependent on various parameters of the coils LX1 through LX4 and the coils LY1 through LY4 such as the diameter, the number of turns (laps) determining the self-inductance, and a mutual inductance determining a mutual dependency between the coils.

The load amount of the coils is basically determined by configurations of the beam-deflection system and the lens system, so that the load amount cannot be freely reduced to shorten the settling time of the amplifiers 742 and 752.

Figure 52A:
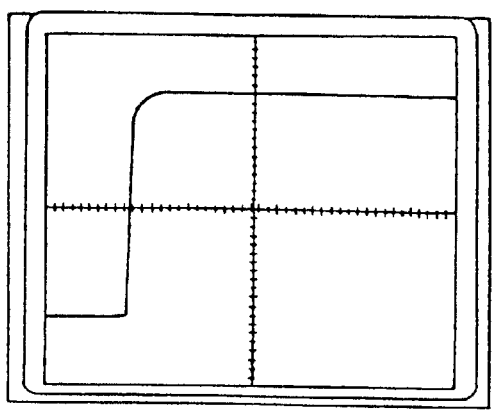
FIGS. 52A through 52D are charts showing the ringing of an output signal of an amplifier of FIG. 51A for various turn numbers of the coils LX1 through LX4 of FIG. 51A.
Figure 52B:
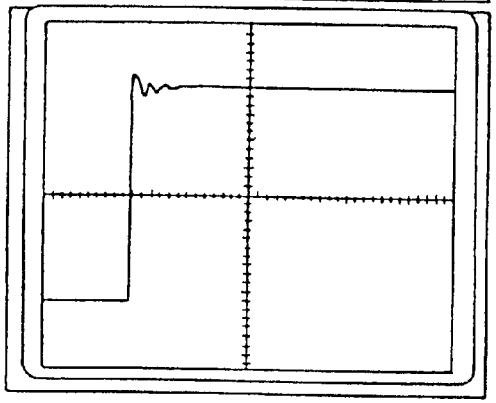
Figure 52C:
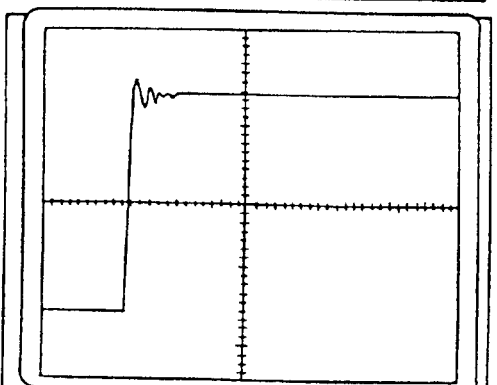
Figure 52D:
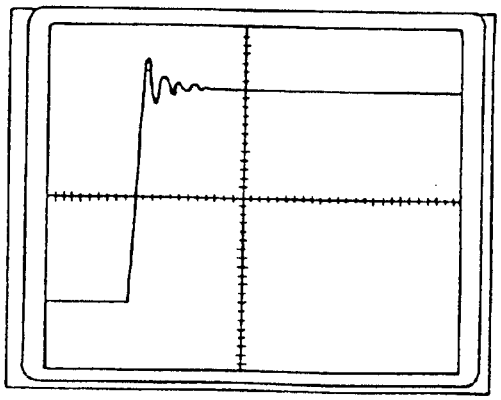

FIGS. 52A through 52D are charts showing the ringing of the output signal of the amplifier 742 for various turn numbers of the coils LX1 through LX4. FIG. 52A shows the output signal of the amplifier 742 when the turn number is 0, i.e., the coils are short-circuited. FIGS. 52B through 52D show cases in which the turn number is 20, 30, and 40, respectively. As shown in the figures, the ringing of the output signal of the amplifier 742 increases as the turn number increases to raise the load amount.

Figure 53:
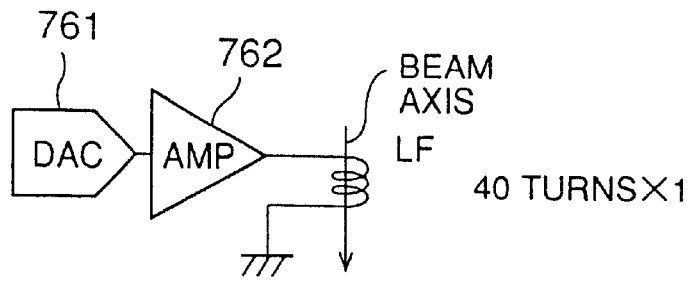
FIG. 53 is a circuit diagram of the dynamic-mask-focus coil DF of FIG. 36.

FIG. 53 is a circuit diagram of the dynamic-mask-focus coil DF of FIG. 36.

In FIG. 53, a focus coil portion of the dynamic-mask-focus coil DF include a coil LF having 40 turns, for example. The data having 12 bits, for example, is supplied via a DAC 761 and an amplifier 762 to the coil LF. A settling time of the amplifier 762 supplying the data to the dynamic-mask-focus coil DF is mainly determined by the load of the dynamic-mask-focus coil DF. Namely, the settling time of the amplifier 762 is dependent on various parameters of the coil LF such as the diameter, the number of turns (laps) determining the self-inductance, and a mutual inductance determining a mutual dependency between the coils.

The load amount of the coils is basically determined by configurations of the beam-deflection system and the lens system, so that the load amount cannot be freely reduced to shorten the settling time of the amplifier 762.

However, it is possible to add the correction pulse signal of the above embodiments of the sixth principle to the input of the amplifiers so that the ringing of the output signals of the amplifiers 742, 752, and 762 is suppressed to shorten the settling time.

Also, in order to shorten the settling time of the amplifiers, the effective load of the coils can be suppressed as shown in the following embodiments.

Figure 54:
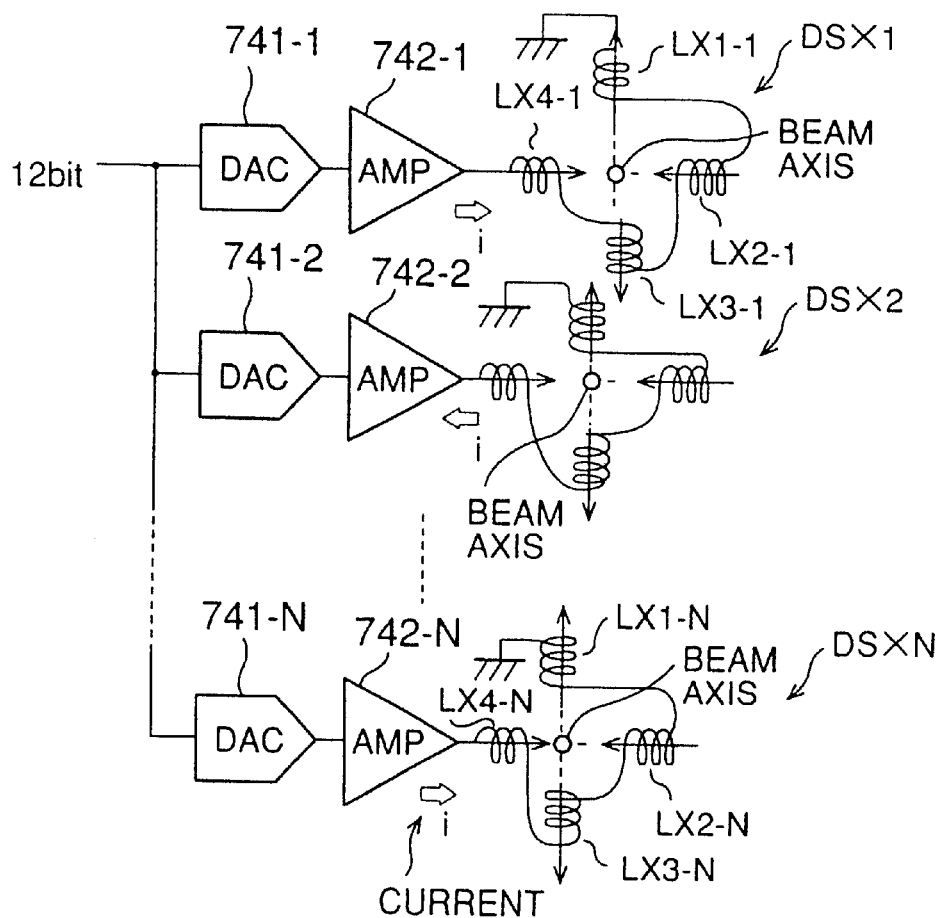
FIG. 54 is a circuit diagram of a main part of a charged-particle-beam exposure device according to a first embodiment of a seventh principle.

FIG. 54 is a circuit diagram of a main part of a charged-particle-beam exposure device according to a first embodiment of a seventh principle. In FIG. 54, the same elements as those of FIGS. 51A and 51B are referred by the same numerals, and a description thereof will be omitted. In this embodiment, the seventh principle is applied to an electron-beam exposure device, and a first embodiment of a charged-particle-beam exposure method is used in the device.

FIG. 54 shows a stigmator-coil portion DSx1 through DSxN for the X axis of the dynamic-mask stigmator DS. A drawing for a stigmator-coil portion DSy1 through DSyN for the Y axis of the dynamic-mask stigmator DS is the same as FIG. 52, and is thus omitted. The stigmator-coil portion DSx1 for the X axis of the dynamic-mask stigmator DS includes coils LX1-1 through LX4-1, each comprising 40 turns, for example. Data having 12 bits, for example, is supplied via a DAC 741-1 and a amplifier 742-1 to the coils LX1-2 through LX4-1 arranged in a series. In the same manner, data having 12 bits is supplied via a DAC 741-2 and a amplifier 742-2 to coils LX1-2 through LX4-2 arranged in a series. The coils LX1-2 through LX4-2 constitute the stigmator-coil portion DSx2. Also, data having 12 bits is supplied via a DAC 741-N and a amplifier 742-N to coils LX1-N through LX4-N arranged in a series. The coils LX1-N through LX4-N constitute the stigmator-coil portion DSx2.

In FIG. 54, even when the same amplifiers are used for the amplifiers 742-1 through 742-N of different stages, an output of each amplifier will have some drift depending on temperature. Namely, because of thermal-condition changes and the like caused by changes in the ambient temperature and heat generation of the amplifiers, outputs of the amplifiers have some drift. Therefore, when a plurality of stages of the stigmator-coil portions are arranged along the axis of the electron beam, the electron beam passing through the round aperture 507 will have a variation in the current density and will be blurred.

Figure 55:
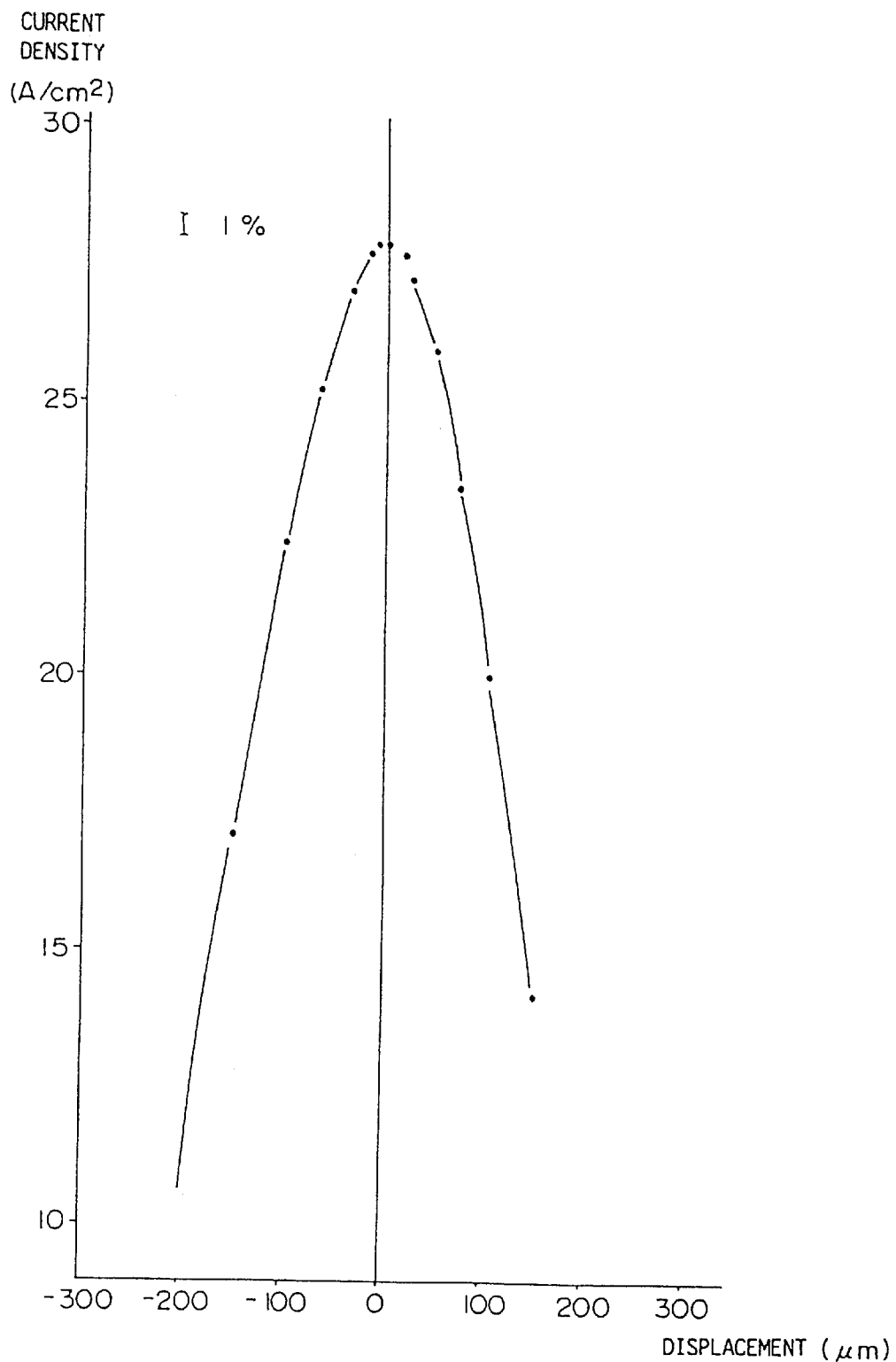
FIG. 55 is a chart showing a variation in a current density of the electron beam passing through a round aperture of FIG. 36 when a position of the electron beam is displaced by a drift in an output of amplifiers.

FIG. 55 is a chart showing a variation in the current density of the electron beam passing through the round aperture 507 when a position of the electron beam is displaced by the drift in the output of the amplifiers. As shown in FIG. 55, in order to keep the variation of the current density within a 1–% range, the electron beam must be positioned with an extreme precision. In this embodiment, thus, two stigmator-coil portions adjacent to each other (e.g, DSx1 and DSx2) are driven by electric currents of opposite directions, as shown by arrows in FIG. 54.

Figure 56:
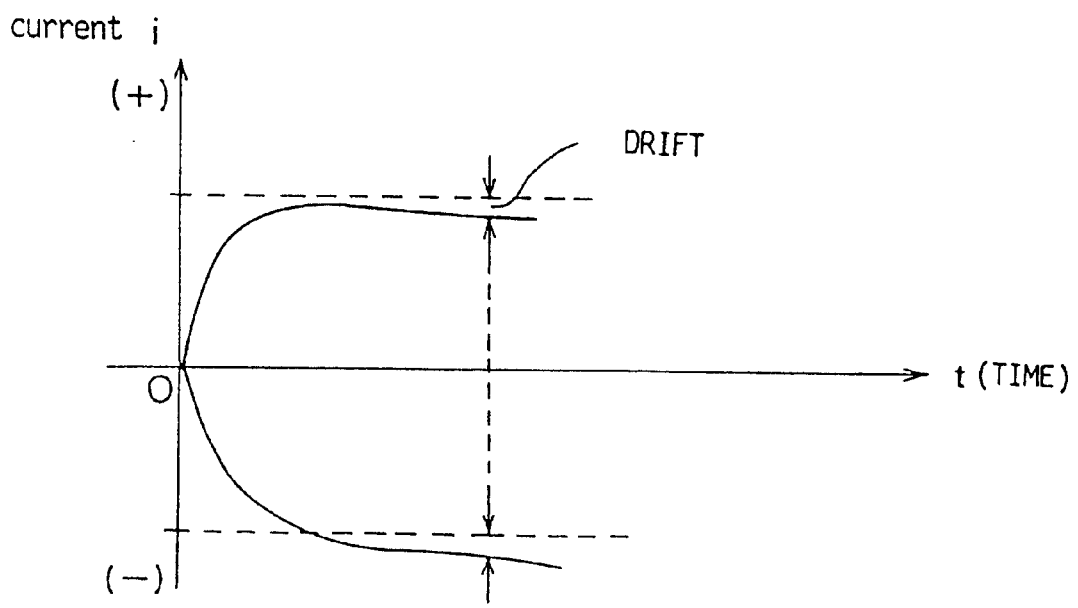
FIG. 56 is a chart showing the drift in the output of the amplifier.

FIG. 56 is a chart showing a drift in an output of an amplifier. As shown in the figure, the drift increases over time in a negative direction when a current of a positive direction is applied. When a current of a negative direction is applied, the drift increases over time in a negative direction as well. Therefore, when every two stigmator-coil portions adjacent to each other are driven by electric currents of opposite directions, the drifts in the outputs of the amplifiers are canceled with each other.

Figure 57:
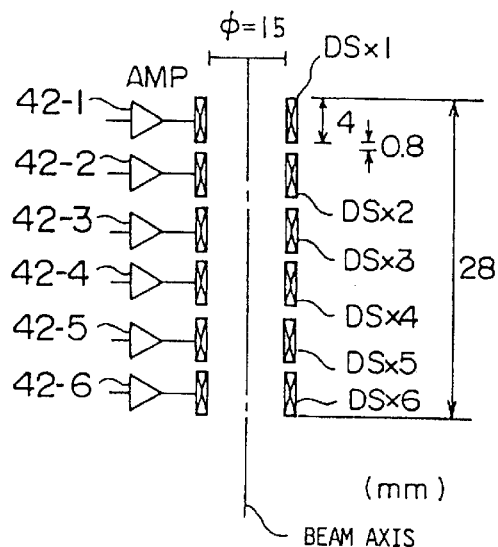
FIG. 57 is an illustrative drawing showing an example of a configuration of stigmator-coil portions of FIG. 54 when six are provided.

FIG. 57 is an illustrative drawing showing an example of a configuration of the stigmator-coil portions when six of them are provided. Each of the stigmator-coil portions DSx1 through DSx6 has a diameter of 15 mm and a length of 4 mm along the electron-beam axis, and is arranged at a 0.8-mm interval. A total length from the stigmator-coil portion DSx1 to the stigmator-coil portion DSx6 along the electron-beam axis is 28 mm.

A configuration of the stigmator-coil portions DSy1 through DSyN for the Y axis of the dynamic-mask stigmator DS is the same as that of FIG. 57, except that they are arranged with a phase displacement of 45° relative to the stigmator-coil portions DSx1 through DSxN around the electron-beam axis.

In the first embodiment of the seventh principle, four coils are provided. However, the number of coils can be 2 or more than 4, as long as the coils are arranged such that magnetic fields generated by the coils are canceled at a center position between the coils.

Figure 58:
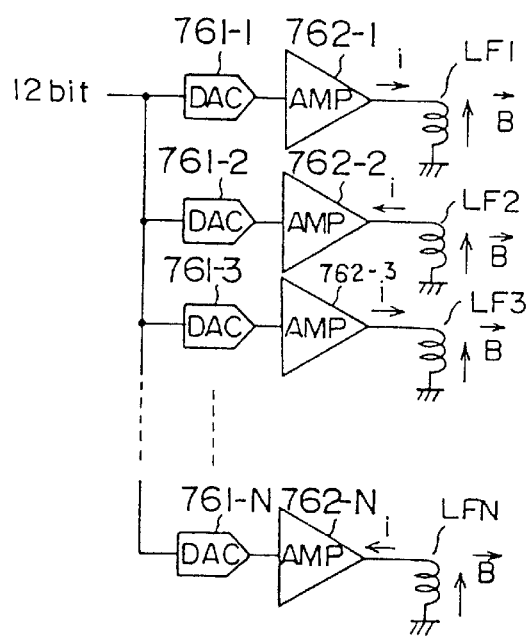
FIG. 58 is a circuit diagram of a main part of a charged-particle-beam exposure device according to a second embodiment of the seventh principle.

FIG. 58 is a circuit diagram of a main part of a charged-particle-beam exposure device according to a second embodiment of the seventh principle. In FIG. 58, the same elements as those of FIG. 53 are referred by the same numerals, and a description thereof will be omitted. In this embodiment, the seventh principle is applied to an electron-beam exposure device, and a second embodiment of a charged-particle-beam exposure method is used in the device.

FIG. 58 shows a focus-coil portion of the dynamic-mask-focus coil DF. The focus-coil portion of the dynamic-mask-focus coil DF includes coils LF1 through LFN, each comprising 40 turns, for example. Data having 12 bits, for example, is supplied via a DAC 761-1 and an amplifier 762-1 to the coil LF1. In the same manner, data having 12 bits is supplied via a DAC 761-2 and an amplifier 762-2 to the coil LF2. The coil LF2 constitutes the focus-coil portion. Also, data having 12 bits is supplied via a DAC 761-N and an amplifier 762-N to the coil LFN. The coil LFN constitutes the focus-coil portion.

In FIG. 58, even when the same amplifiers are used for the amplifiers 762-1 through 762-N of different stages, an output of each amplifier will have some drift depending on temperature. Namely, because of thermal-condition changes and the like caused by changes in the ambient temperature and heat generation of the amplifiers, outputs of the amplifiers have some drift. Therefore, when a plurality of stages of the focus-coil portions are arranged along the axis of the electron beam, the electron beam passing through the round aperture 507 will have a variation in the current density and will be blurred.

Figure 59:
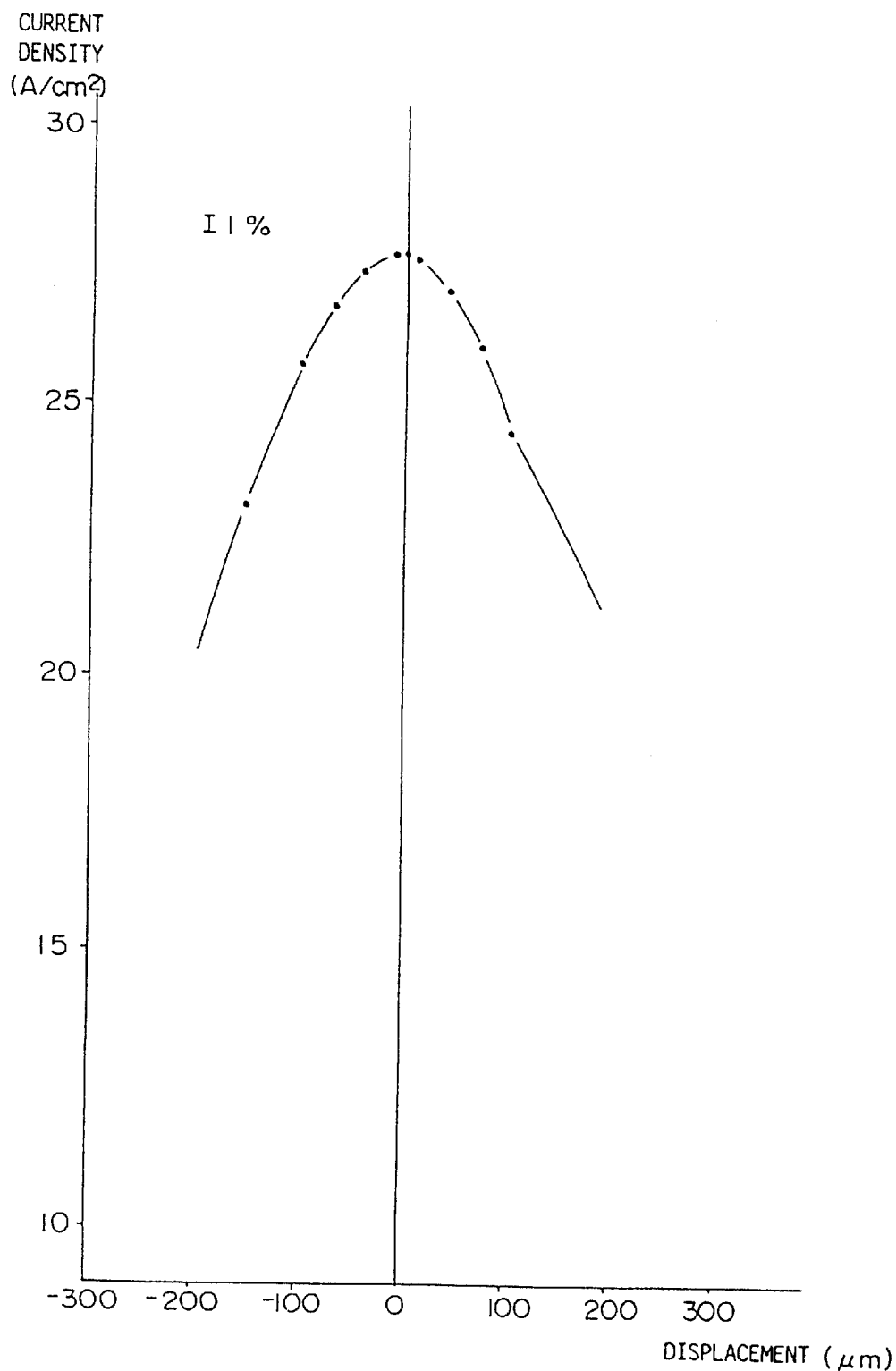
FIG. 59 is a chart showing a variation in the current density of the electron beam passing through the round aperture when a position of the electron beam is displaced by a drift in an output of amplifiers.

FIG. 59 is a chart showing a variation in the current density of the electron beam passing through the round aperture 507 when a position of the electron beam is displaced by the drift in the output of the amplifiers. As shown in FIG. 59, in order to keep the variation of the current density within a 1–% range, the electron beam must be positioned with an extreme precision. In this embodiment, thus, two focus-coil portions adjacent with each other (e.g, LF1 and LF2) are driven by electric currents of opposite directions, as shown by arrows in FIG. 59.

Figure 60A:
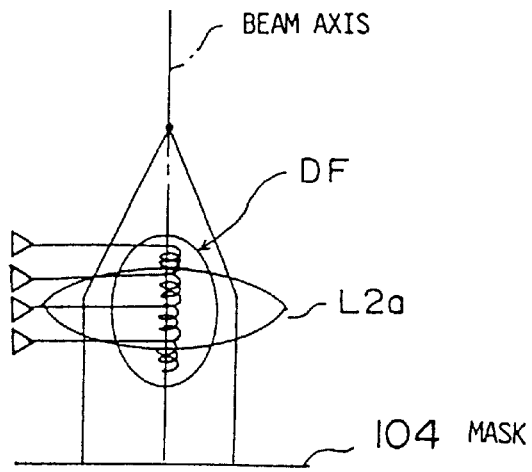
FIGS. 60A and 60B are illustrative drawings showing an example of a configuration of the focus-coil portions of FIG. 58 when five are provided.
Figure 60B:
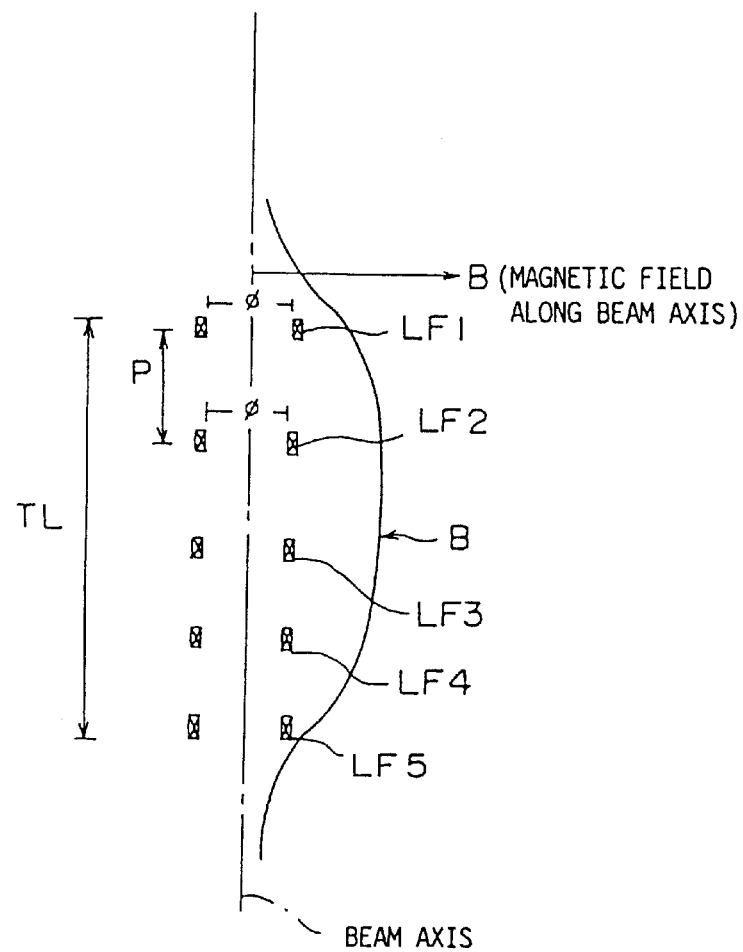

FIGS. 60A and 60B are illustrative drawings showing an example of a configuration of the focus-coil portions when five of them are provided. FIG. 60A shows the focus-coil portion of the dynamic-mask-focus coil DF of the electron-beam exposure device, and FIG. 60B shows an enlarged view of the configuration of the focus-coil portions of the dynamic-mask-focus coil DF. FIG. 60B also shows a magnetic field B distributed along the electron-beam axis of the electron-lens system L2a. Each of focus coils LF1 through LF5 has a 5-mm diameter ϕ, and is arranged at a 5-mm interval P. A total length TL from the focus coil LF1 to the focus coil LF5 along the electron-beam axis of the electron-beam exposure device is 20 mm. In this configuration, the interval P must be larger than or equal to the diameter ϕ.

In the first and second embodiments of the seventh principle of the present invention, the correction pulse signal may be added to the input of each amplifier as in the first through fourth embodiments of the sixth principle. In this case, an adverse effect of the drift in the output of the amplifier is reduced, and, at the same time, an adverse effect of the ringing of the output of the amplifier is alleviated.

Applications of the sixth and seventh principles of the present invention are not limited only to electron-beam exposure devices. The sixth and seventh principles of the present invention can be applied to any charged-particle-beam exposure devices.

According to the sixth principle of the present invention, the pulse signal is added to the input of the amplifier to cancel the delayed response fed back to the amplifier, thereby suppressing the ringing. Therefore, an amplifier having a short settling time used for inductor impedance is provided without sacrificing the frequency characteristics of the amplifier.

According to the sixth principle of the present invention, the optimal pulse parameters for the correction pulse signal are stored in memories, and the pulse signal is generated based on the optimal pulse parameters. Therefore the ringing is suppressed by using a simple circuit structure.

According to the seventh principle of the present invention, the use of a plurality of stages of coils enables a reduction in the effective load of the coils, and enables a cancellation of the drift in the output of the amplifier. Therefore, the settling time of the amplifier is shortened.

Accordingly, the charged-particle-beam exposure device according to the sixth and seventh principles of the present invention can shorten the settling time of the amplifier to reduce the waiting time for a shot by suppressing the ringing effect of an amplifier output without lowering the frequency range of the amplifier.

Moreover, there are other problems of concern to the present invention, and these problems will be described below.

Figure 61:
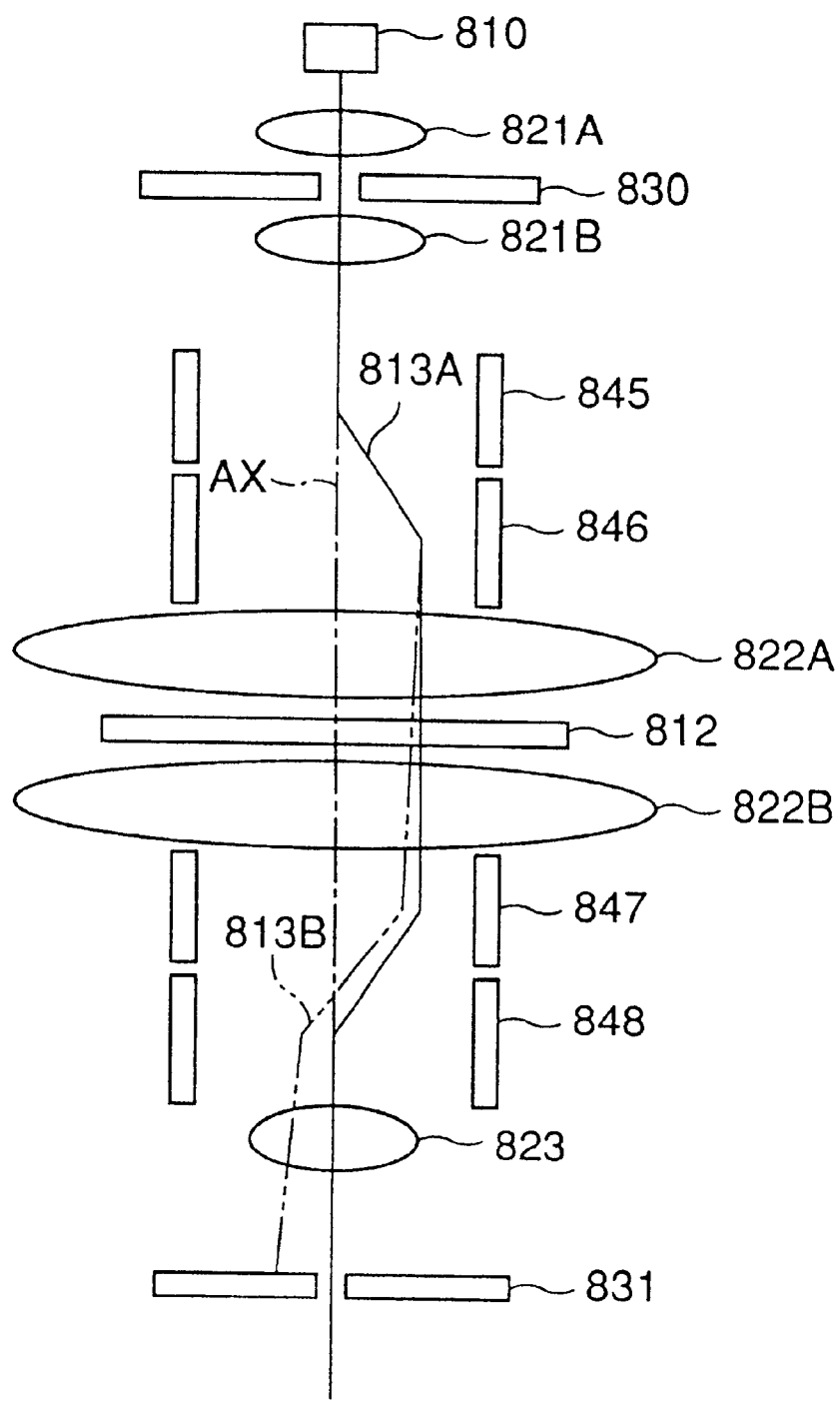
FIG. 61 is an illustrative drawing showing a configuration of a charged-particle-beam exposure device of the related art using a stencil mask.

FIG. 61 is an illustrative drawing showing a configuration of a charged-particle-beam exposure device of the related art using a stencil mask.

A charged-particle beam (e.g., electron beam) emitted from a charged-particle gun 810 passes through a selected hole pattern formed through a stencil mask. 812 so that a cross section of the beam is shaped in a selected pattern. The beam having the shaped cross section is converged and positioned on a wafer (not shown). FIG. 61 shows a beam axis AX and a beam trajectory 813A. The charged-particle-beam exposure device of FIG. 61 also includes electromagnetic lenses 821A, 821B, 822A, 822B, and 823 and aperture plates 830 and 831.

The charged-particle beam passing through electromagnetic lens 821B along the beam axis AX is deflected by a deflector 845, and, then, bent by a deflector 846 to become parallel to the beam axis AX. In this manner, the charged-particle beam runs in a vertical direction when it passes through the selected hole pattern of the stencil mask 812. The charged-particle beam having passed through the stencil mask 812 is deflected by a deflector 847 and bent by a deflector 848 to be placed along the beam axis AX.

In the charged-particle-beam exposure device of this configuration, the charged-particle beam is incident to the stencil mask 812 from a normal direction, so that the cross section of the beam is shaped with high precision. Also, a hole pattern of the stencil mask 812 can be selected from a wide-range area.

However, when a deflection amount of any of the deflectors 845 through 848 is changed, there is a huge positional displacement of the charged-particle beam on the aperture plate 831 and on the wafer. This crates a problem when a hole pattern of the stencil mask 812 is selected. When the deflection amount of the deflector 846 is slightly increased, for example, the charged-particle beam has a beam trajectory 813B as shown in FIG. 61. A high precision such as within a range of 0.01 μm, for example, is required for the positioning of the charged-particle beam on the wafer. When a hole pattern is selected, the deflectors 845 through 848 receive driving voltages having a step change. In this case, a long settling time is required.

In order to precisely direct the charged-particle beam at a target position on the wafer, the charged-particle beam is blanked during the settling time by a blanking deflector (not shown) and the aperture plate 831. A beam exposure on the wafer should wait until the settling time lapses, thereby creating a dead time to reduce throughput of the exposure process.

Figure 62:
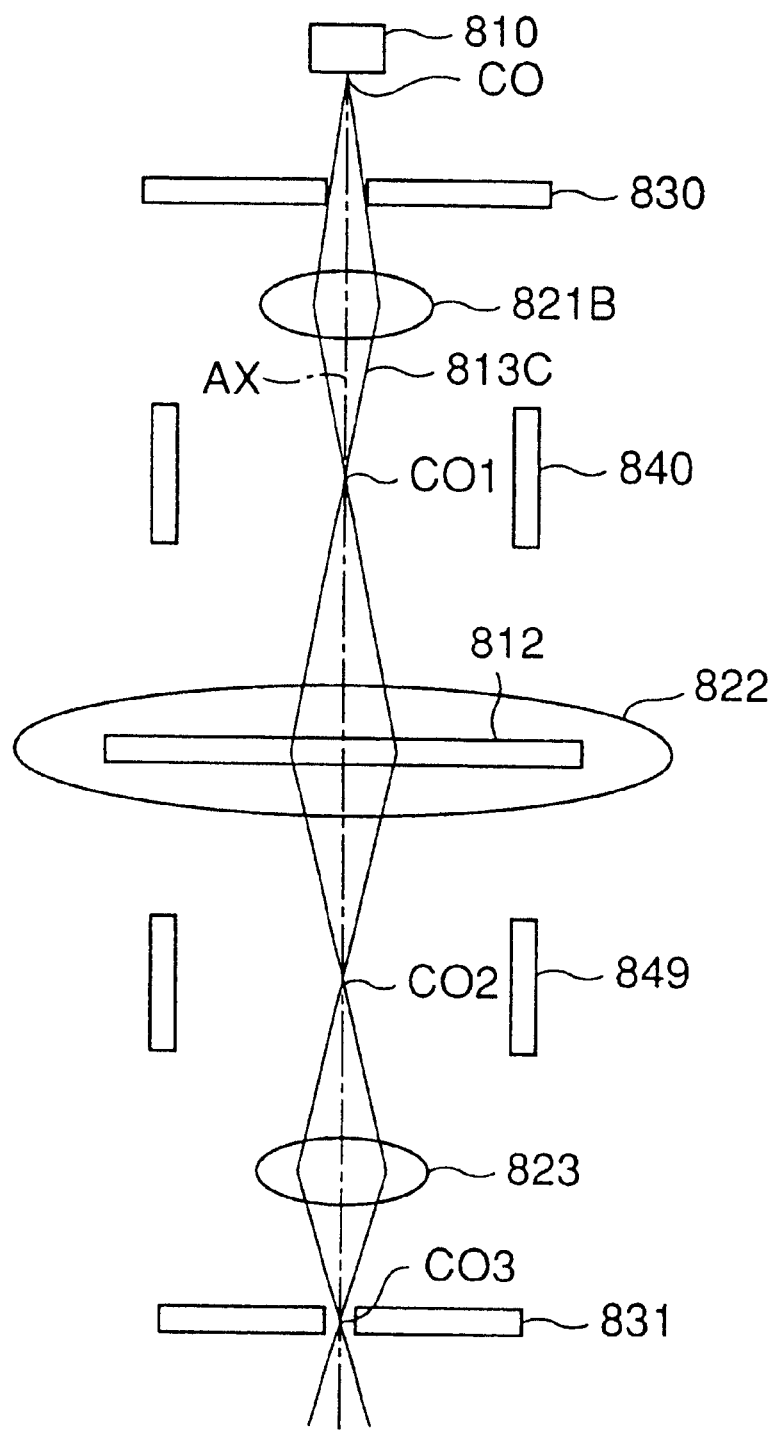
FIG. 62 is an illustrative drawing showing a configuration of another charged-particle-beam exposure device of the related art.

FIG. 62 is an illustrative drawing showing a configuration of a charged-particle-beam exposure device disclosed in Japanese Patent Laid-Open Application No.62-206828.

In the device of FIG. 62, cross-over images CO1 and CO2 of a gun cross over CO of the charged-particle gun 810 are positioned between the electromagnetic lens 821B and an electromagnetic lens 822 and positioned between the electromagnetic lens 822 and the electromagnetic lens 823. A deflector 840 is arranged such that a center point thereof is positioned at a position of the cross-over image CO1. Also, a deflector 849 is arranged such that a center point thereof is positioned at a position of the cross-over image CO2. A path 813C shows an extent of the charged-particle beam, enlarged in a direction perpendicular to the beam axis AX, passing through the electromagnetic lenses 821B, 822, and 823 when the deflection amount of the deflectors 840 and 849 is zero.

The charged-particle beam deflected by the deflector 840 to pass through a selected hole pattern of the stencil mask 812 is focused at a position of the cross-over image CO2 through a convergence effect of the electromagnetic lens 822. The charged-particle beam is then deflected by the deflector 849 to run along the beam axis AX.

In the charged-particle-beam exposure device of FIG. 62, deflectors functionally equivalent to the deflectors 846 and 847 are not provided. Thus, a range in which a hole pattern of the stencil mask 812 can be selected becomes narrower than that of FIG. 61.

In FIG. 62, the cross-over image CO2 is positioned several millimeters from the top of the electromagnetic lens 823. Because of such a short distance, the center point of the deflector 849 cannot be positioned at the position of the cross-over image CO2. Then, the charged-particle beam deflected by the deflector 849 deviates from the beam axis AX to deteriorate positional accuracy of the charged-particle beam on the wafer. Also, deflection efficiencies of the deflectors 840 and 849 on the aperture plate 831 and the wafer become larger than those of FIG. 61, thereby lengthening the setting time.

Figure 63:
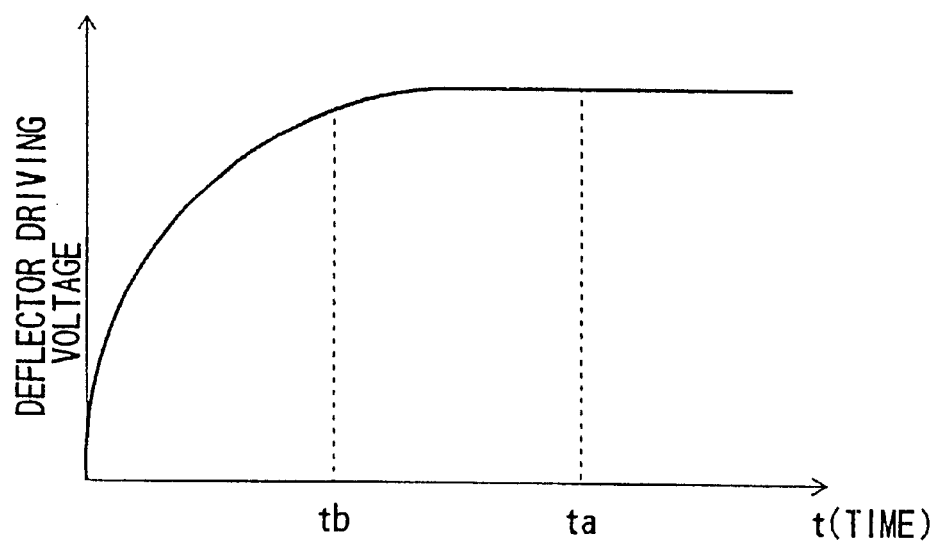
FIG. 63 is a chart for showing a temporal change in a driving voltage of deflectors of FIG. 61 and FIG. 62 and for showing a settling time of the deflectors.

FIG. 63 is a chart of a temporal change in a driving voltage of a deflector for showing a settling time of the deflector. In FIG. 63, a time position ta indicates a settling time required for the device of FIG. 61, and a time position tb indicates a settling time required for the device of FIG. 62.

Accordingly, there is a need for a charged-particle-beam exposure device and a charged-particle-beam exposure method which can improve the positional accuracy of the charged-particle beam on a wafer, and which can shorten the settling time required when there is a step change in a driving voltage of a deflector.

In the following, embodiments of an eighth principle of the present invention will be described with reference to the accompanying drawings.

Figure 64:
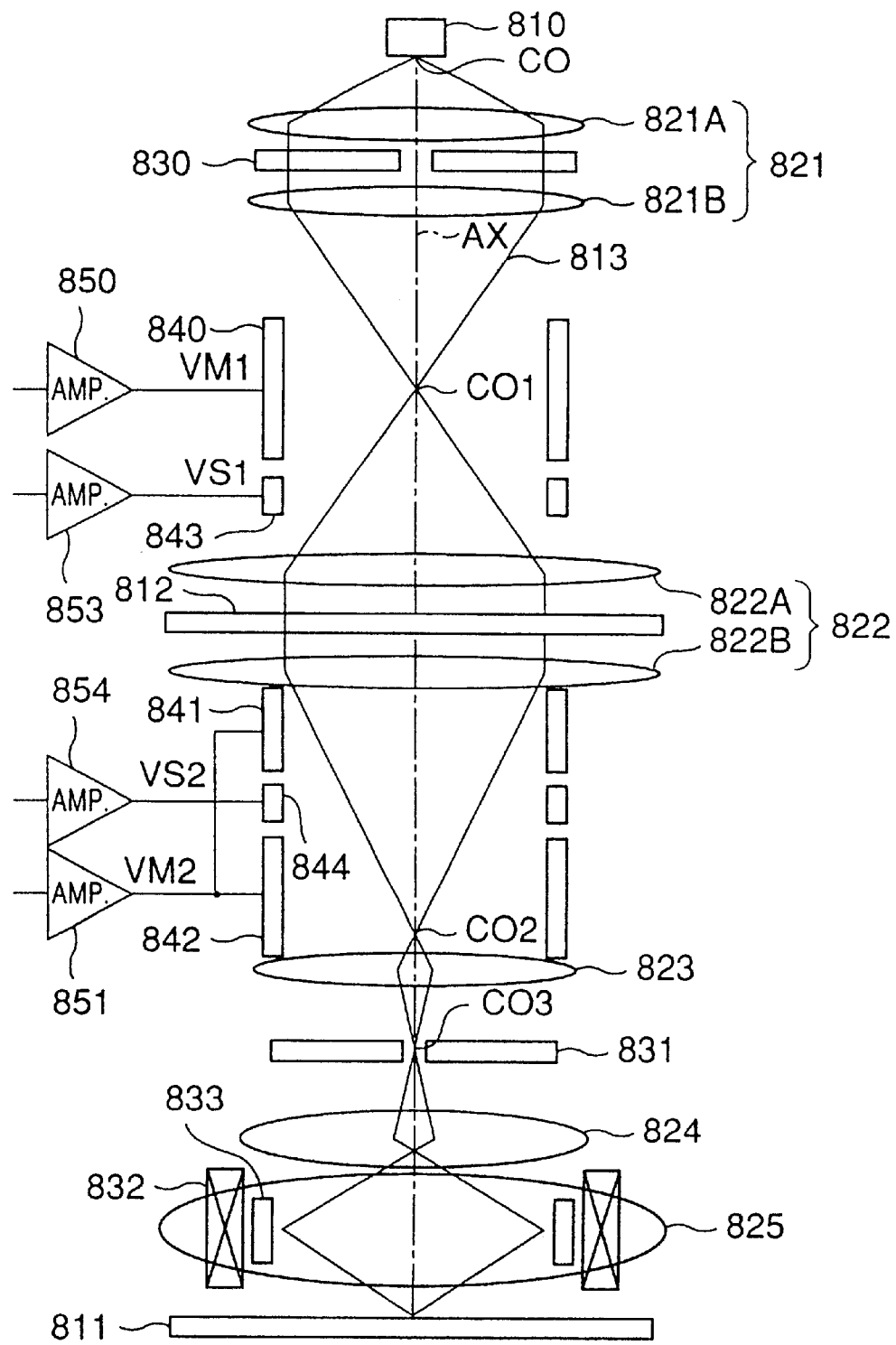
FIG. 64 is an illustrative drawing of a configuration of a charged-particle-beam exposure device according to a first embodiment of the eighth principle of the present invention.

FIG. 64 is an illustrative drawing of a configuration of a charged-particle-beam exposure device according to a first embodiment of the eighth principle of the present invention. A charged-particle beam (e.g., electron beam) emitted from the charged-particle gun 810 exposes a resist layer on a wafer 811. The stencil mask 812 has a plurality of hole patterns frequently used in exposure processes. The charged-particle beam passes through a selected hole pattern so that a cross section of the charged-particle beam is shaped into a desired pattern. This pattern is converged and projected to the wafer 811.

A beam trajectory 813 shows an extent of the charged-particle beam passing through electromagnetic lenses 821 through 825, and is shown enlarged in a direction perpendicular to the beam axis AX. The electromagnetic lens 821 includes the electromagnetic lens 821A and the electromagnetic lens 821B, and the aperture plate 830 is placed between the electromagnetic lenses 821A and 821B. The charged-particle beam deflected parallel to the beam axis AX by the electromagnetic lens 821A passes through a square hole of the aperture plate 830 such that the charged-particle beam has a cross-sectional size covering only one hole pattern of the stencil mask 812. The electromagnetic lens 822 includes the electromagnetic lens 822A and the electromagnetic lens 822B, and the stencil mask 812 is placed between the electromagnetic lenses 822A and 822B. The charged-particle beam deflected parallel to the beam axis AX by the electromagnetic lens 822A passes through a selected hole pattern of the stencil mask 812. The electromagnetic lenses 823 and 824 are used for a reduction projection of the charged-particle beam, and the aperture plate 831 having a round aperture is placed between the electromagnetic lens 823 and the electromagnetic lens 824. The electromagnetic lens 825 is an objective lens, and converges the charged-particle beam on the wafer 811.

A main deflector 832 and a sub-deflector 833 deflect the charged-particle beam to a target position on the wafer 811.

The cross-over image CO1 of the gun cross over CO is positioned between the electromagnetic lens 821B and the electromagnetic lens 822A. The cross-over image CO2 of the gun cross over CO is positioned between the electromagnetic lens 822B and the electromagnetic lens 823. Also, a cross-over image CO3 of the gun cross over CO is located between the electromagnetic lens 823 and the electromagnetic lens 824.

In order to deflect the charged-particle beam from the beam axis AX to a selected hole pattern of the stencil mask 812, the deflector 840 is placed between the electromagnetic lens 821B and the electromagnetic lens 822A. Here, a center point of the deflector 840 is positioned at a position of the cross-over image CO. In order to deflect the charged-particle beam having passed through the electromagnetic lens 822B back to the beam axis AX, deflectors 841 and 842 are situated between the electromagnetic lens 822B and the electromagnetic lens 823. The deflector 842 is situated nearer to the electromagnetic lens 823. However, since the cross-over image CO2 is positioned only several millimeter from the top of the electromagnetic lens 823, a center point of the deflector 842 cannot be located at a position of the cross-over image CO2. Because of this reason, the deflector 841 is situated nearer to the electromagnetic lens 822B.

The aperture plate 831 is situated such that a center of the round aperture coincides with a position of the cross-over image CO3.

Because of a variation in a thermal expansion due to ambient-temperature changes and a variation in the atmospheric pressure, the electromagnetic lenses are subjected to varying stresses. Also, as electrodes of the charged-particle gun 810 are worn over a long time, the positions of the cross-over images CO1 and CO2 vary slightly. Because of these factors and deviations from design specifications, the charged-particle beam having passed through the electromagnetic lens 823 is displaced from the beam axis AX. In order to correct this displacement, a correction deflector 843 is provided between the deflector 840 and electromagnetic lens 822A, and a correction deflector 844 is provided between the deflector 841 and the deflector 842.

An output of an amplifier 850 is connected to the deflector 840, and an output of an amplifier 851 is connected to the deflector 841 and the deflector 842. Also, outputs of amplifiers 853 and 854 are connected to the correction deflectors 843 and 844, respectively. The deflectors 840 through 844 are static-charge-type deflectors, each having opposing electrodes. The opposing electrodes receive voltages having the same magnitude and a reversed phase. Since each of the deflectors 840 through 844 generates only a small deflection angle, a trajectory of the charged-particle beam keeps a linear relation with the voltage applied to a deflector. Voltage ratios between the deflectors 840 through 844 are kept constant irrespective of a position of a selected pattern of the stencil mask 812.

Figure 65:
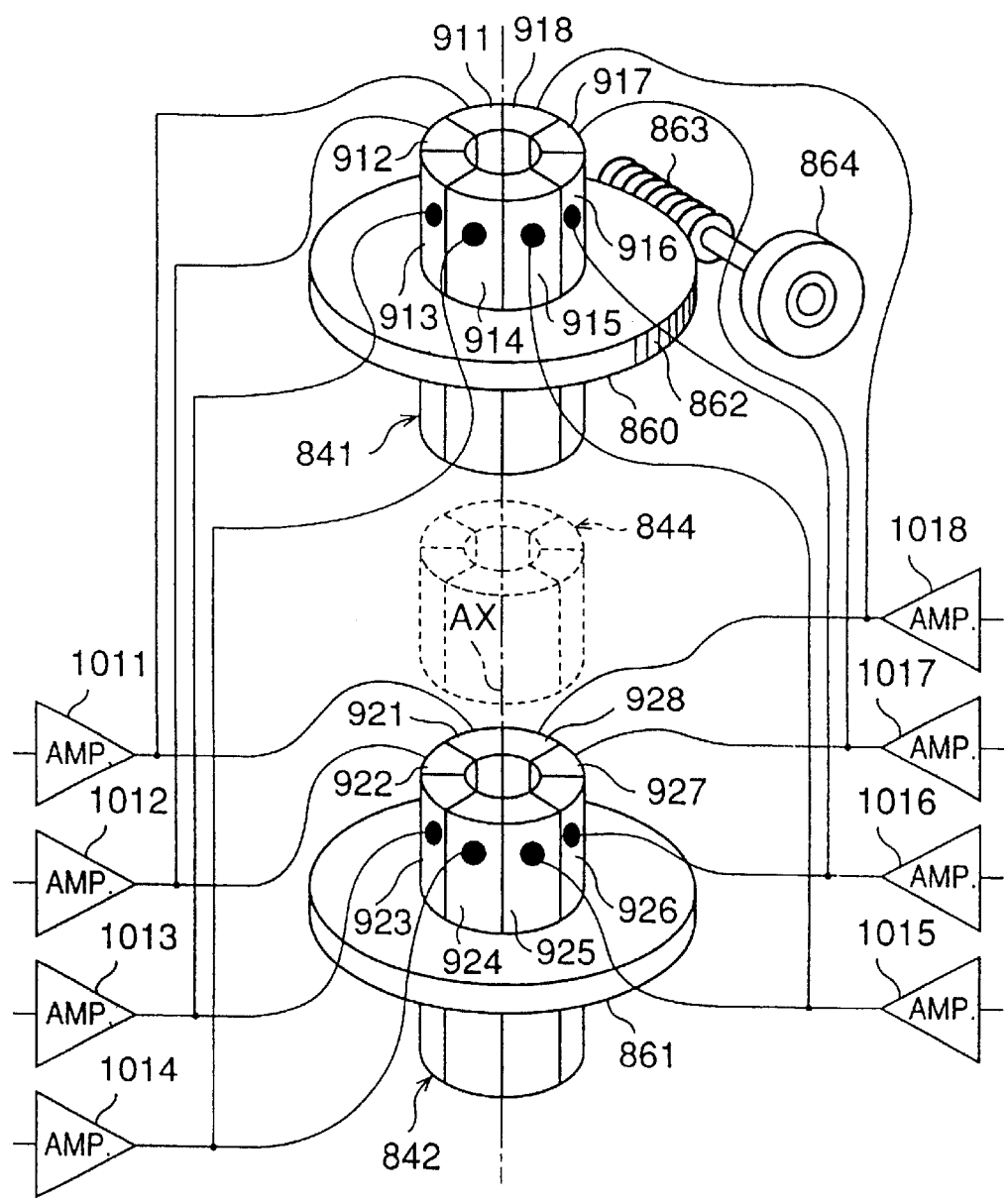
FIG. 65 is an illustrative drawing showing a configuration of the deflectors of FIG. 64.

FIG. 65 is an illustrative drawing showing a configuration of the deflectors 841, 842, and 844.

Each of the deflectors 841, 842, and 844 are comprised of eight electrodes in order to have a uniform distribution of the electric field. (The deflector 840 and the correction deflector 843 also have the same configuration.) Because of these eight electrodes, the amplifier 851 of FIG. 64 includes amplifiers 1011 through 1018. Outputs of the amplifiers 1011 through 1018 are connected to electrodes 911 through 918 of the deflector 841, respectively, and are also connected to electrodes 921 through 928 of the deflector 842, respectively.

The deflector 841 and the deflector 842 are supported by a supporter 860 and a supporter 861, respectively. Center axes of the deflectors 841, 842, and 844 are positioned at the beam axis AX. (The deflector 840 and the correction deflector 843 of FIG. 64 also have the same configuration.) Rotation errors of the deflectors 841 and 842 around the beam axis AX are electrically corrected by applying a coordinate transformation to signals suppled to the amplifiers 1011 through 1018. However, since the same output of the same amplifier is applied to a respective electrode of the deflector 841 and the deflector 842, the electrical correction is effective only for one of the deflector 841 and the deflector 842. In response, teeth 862 are formed on part of the side surface of the supporter 860, and a worm 863 is fitted to the teeth 862. The worm 863 has a wheel 864 attached thereto, and rotation of the wheel 864 allows a mechanical correction of the deflector 841.

FIGS. 66A and 66B are illustrative drawings for explaining trajectories of the charged-particle beam deflected by the deflectors.

In FIG. 66A, the deflectors 841 through 843 receive a zero voltage. When the charged-particle beam is deflected by the deflector 840, a linearly approximated trajectory 813D of the charged-particle beam is obtained as shown in FIG. 66A. Namely, since the center point of the deflector 840 is positioned at the position of the cross-over image CO, the charged-particle beam deflected by the deflector 840 becomes parallel to the beam axis AX after passing through the electromagnetic lens 822A. Also, after passing through the electromagnetic lens 822B, the charged-particle beam reaches the position of the cross-over image CO2, and, then, reaches the position of the cross-over image CO3.

In FIG. 66B, voltages applied to the deflectors 840, 843, and 844 are zero. Also, it is assumed that a charged-particle beam is directed upward along the beam axis AX from a point below the aperture plate 831 and that the charged-particle beam is deflected by the deflector 841 and the deflector 842. In this case, a linearly approximated trajectory 813E as shown in FIG. 66B is obtained. Here, a deflection by the deflector 841 is set to such an amount that a dotted line running through points P3 and P4 and extended upstream runs through the position of the cross-over image CO2. If setting is made to satisfy this condition when the same voltage is applied to the deflector 841 and the deflector 842, this condition will be satisfied for any voltages as long as these voltages are within a range allowing the linear approximation. The charged-particle beam having passed through the electromagnetic lens 822B is paralleled to the beam axis AX. After passing through the electromagnetic lens 822A, the charged-particle beam runs through the position of the cross-over image CO1.

Assume that when a voltage VM1 is applied to the deflector 840 in FIG. 66A and a voltage VM2 is applied to the deflectors 841 and 842 in FIG. 66B, a point P3 of FIG. 66A is at the same position as a point P3 of FIG. 66B. This condition is satisfied even when the voltages VM1 and VM2 are changed, as long as a ratio between VM1 and VM2 is kept constant.

When the voltage VM1 is applied to the deflector 840 and the voltage VM2 is applied to the deflectors 841 and 842, a charged-particle beam directed downward along the beam axis AX above the deflector 840 will have a linearly approximated trajectory running through points P1, CO1, P2, and P3 of FIG. 66A and through points P4, P5, and P6 of FIG. 66B.

The deflectors 841 and 842 are designed such that when the same voltage is applied, the charged-particle beam is deflected as described above. A deviation from the design specification can be corrected by adjusting an interval between the deflector 841 and the deflector 842.

In FIG. 64, when there is no positional error of the cross-over images CO1 and CO2, changes in the voltages VM1 and VM2 will not bring about a change in the position of the charged-particle beam on the aperture plate 831 and the wafer 811 (the deflection efficiency is zero). On the other hand, changes in voltages VS1 and VS2 (shown in FIG. 64) result in the position of the charged-particle beam being changed on the aperture plate 831 and the wafer 811. As for the deflectors 840 through 844, they have following characteristics.

(1) Even when the cross-over images CO1 and CO2 have positional errors, the deflection efficiency on the aperture plate 831 and the wafer 811 is larger for the correction deflectors 843 and 844 than for the deflectors 840 through 842. Also, the correction deflectors 843 and 844 are used for correcting small errors. Thus, lengths of the correction deflectors 843 and 844 along the beam axis AX can be set much shorter than those of the deflectors 840 through 842.

(2) The length of the correction deflector 843 along the beam axis AX is much shorter than that of the deflector 840, and the cross-over image CO1 is distanced from the correction deflector 843. Thus, the deflector 840 has much larger deflection efficiency on the stencil mask 812 than does the correction deflector 843. The fact that an effect of the correction deflector 843 on a beam position on the stencil mask 812 is small is quite favorable.

Positional errors of the cross-over images CO1 and CO2 can be corrected by using the electromagnetic lens 821B, the correction deflector 843, and the correction deflector 844. This will be described below.

Figures 67A, 67B, 67C:
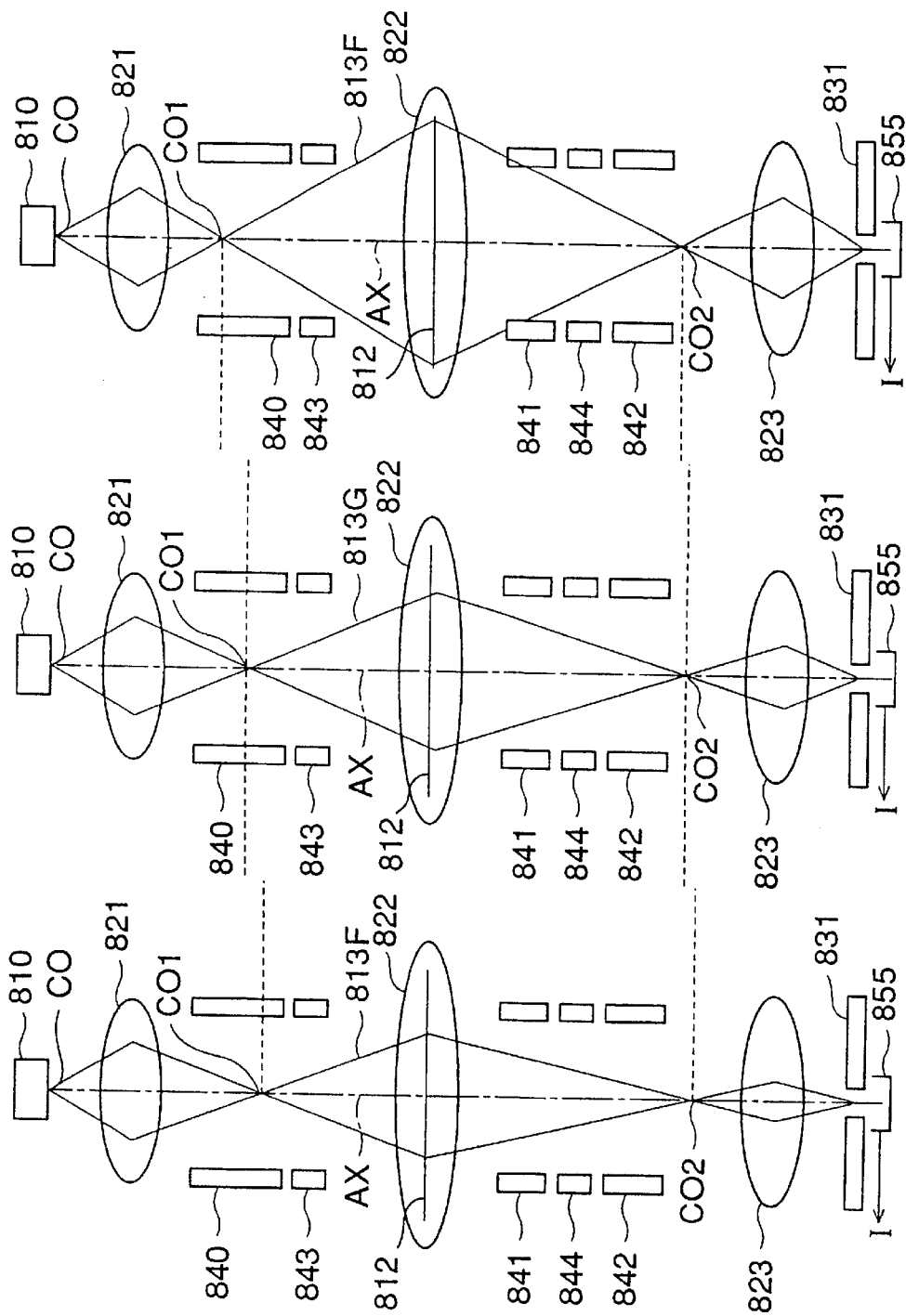
FIGS. 67A through 67C are illustrative drawings showing an extent of the charged-particle beam passing through electromagnetic lenses of FIG. 64 with an enlargement of this extent in a direction perpendicular to a beam axis.

FIGS. 67A through 67C are illustrative drawings showing an extent of the charged-particle beam passing through the electromagnetic lenses 821 through 823 with an enlargement of this extent in a direction perpendicular to the beam axis AX. Beam extents 13F through 13H are shown in FIGS. 67A through 67C, respectively, when voltages applied to the deflectors 840 through 844 are zero.

A current I passing through the aperture of the aperture plate 831 is measured by a Faraday cup 855 placed under the aperture.

FIGS. 67A and 67C show cases when the position of the cross-over image CO1 is displaced from the center point of the deflector 840. In these cases, when the deflector 840 deflects the charged-particle beam while no voltage is applied to the deflectors 841 through 844, the current I changes according to the deflection amount. Then, a current applied to the electromagnetic lens 821 (electromagnetic lens 821B of FIG. 64 to be exact) is changed to shift the focusing thereof, so that the position of the cross-over image CO1 is changed along the beam axis AX. When the position of the cross-over image CO1 coincides with the center point of the deflector 840 as shown in FIG. 67B, a change in the deflection amount of the deflector 840 will not affect the current I.

In order to correct the position of the cross-over image CO1, voltages applied to the deflectors 841 through 844 are set to zero, and the focusing of the electromagnetic lens 821 is changed step by step. For each step of the focusing, a change in the current I in response to a change in the deflection amount of the deflector 840 is measured. Then, the focusing A1 of the electromagnetic lens 821 when the change in the current I is the smallest is obtained.

In order to correct the position of the cross-over image CO2, voltages applied to the deflectors 840, 843, and 844 are set to zero, and the focusing of the electromagnetic lens 821 is changed step by step. For each step of the focusing, a change in the current I in response to changes in the deflection amounts of the deflectors 841 and 842 is measured. Then, the focusing A2 of the electromagnetic lens 821 when the change in the current I is the smallest is obtained.

When the focusing of the electromagnetic lens 821 is A1, the cross-over image CO1 does not have a positional error, but the cross-over image CO2 does. On the other hand, when the focusing of the electromagnetic lens 821 is A2, the cross-over image CO1 has a positional error, but the cross-over image CO2 does not. That is, desirable focusing of the electromagnetic lens 821 is not A1 nor A2. Assuming that the desirable focusing is L, the focusing of the electromagnetic lens 821 is set to L.

Then, voltages applied to the deflectors 841, 842, and 844 are set to zero. The voltage VS1, K1 times as large as the voltage VM1 for the deflector 840 is applied to the correction deflector 843. Then, the factor K1 is changed step by step. For each step of the factor K1, a change in the current I in response to a change in the deflection amount of the deflector 840 is measured. The factor K1 for the smallest change in the current I is then determined. Then, voltages applied to the deflectors 840 and 843 are set to zero. The voltage VS2, K2 times as large as the voltages VM2 for the deflectors 841 and 842 is applied to the correction deflector 844. Then, the factor K2 is changed step by step. For each step of the factor K2, a change in the current I in response to changes in the deflection amounts of the deflectors 841 and 842 is measured. The factor K2 for the smallest change in the current I is then determined. Based on the factors K1 and K2, a ratio M:N (=VS1:VS2) is calculated. The ratio M:N is constant irrespective of the beam position on the stencil mask 812.

An analysis of a relation between the desirable focusing L of the electromagnetic lens 821 and the ratio M:N will be provided below. If M/(M+N) is larger than N/(M+N), the focusing L is expected to be nearer to A1 than to A2. On the other hand, if M/(M+N) is smaller than N/(M+N), the focusing L is expected to be nearer to A2 than to A1.

Voltages applied to the deflectors 841 through 844 are set to zero, and the focusing of the electromagnetic lens 821 is changed step by step. For each step of the focusing, a change in the current I in response to a change in the deflection amount of the deflector 840 is measured. Then, the focusing A1 of the electromagnetic lens 821 when the change in the current I is the smallest is obtained.

Voltages applied to the deflectors 840, 843, and 844 are set to zero, and the focusing of the electromagnetic lens 821 is changed step by step. For each step of the focusing, a change in the current I in response to changes in the deflection amounts of the deflectors 841 and 842 is measured. Then, the focusing A2 of the electromagnetic lens 821 when the change in the current I is the smallest is obtained.

Then, the desirable focusing L is determined as:

$$L = (M \cdot A1 + N \cdot A2)/(M+N) \quad (22)$$

The ratio M:N has an initial value 1:1, for example, and the focusing L is obtained for this initial value by using the equation (22). Then, the ratio M:N is obtained as described above by using the focusing L. Such a process is carried out one or more times to move the ratio M:N closer to an optimal ratio.

FIG. 68 is a flowchart of the above-described process of determining the focusing A1 to correct the position of the cross-over image CO. The process of determining the focusing A2 is almost the same as the process of determining the focusing A1 except for the selection of the deflectors, and a flowchart thereof will be omitted.

At a step S201, voltages applied to irrelevant deflectors are set to zero.

At a step S202, the focusing of the electromagnetic lens 821 is changed step by step, and a change in the current I in response to a change in the deflection amount of a relevant deflector is measured for each step of the focusing.

At a step S203, the focusing A1 of the electromagnetic lens 821 for the smallest change in the current I is obtained. This ends the procedure.

Figure 69:
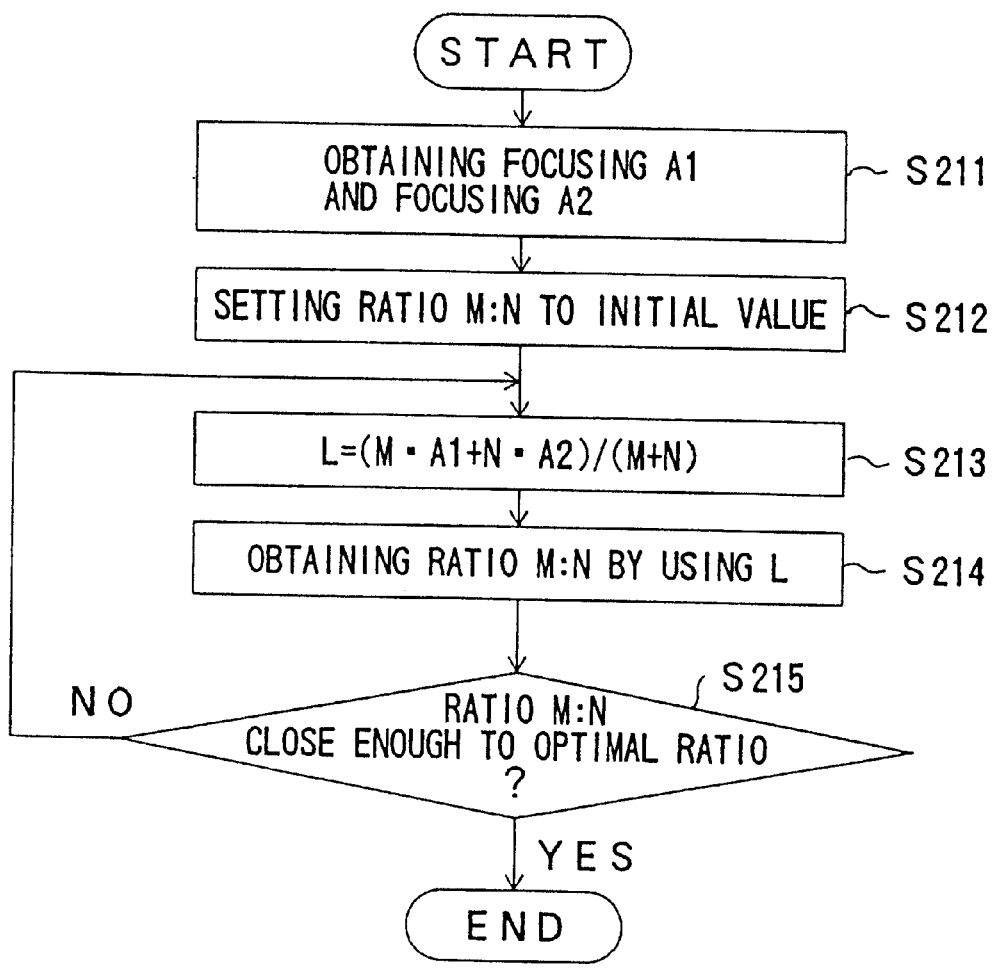
FIG. 69 is a flowchart of a process of obtaining desirable focusing L and an optimal value of a ratio in FIG. 64.

FIG. 69 is a flowchart of the above-described process of obtaining the desirable focusing L and the optimal value of the ratio M:N.

At a step S211, the focusing A1 and the focusing A2 are obtained.

At a step S212, the ratio M:N is set to an initial value.

At a step S213, the focusing L is obtained by using the equation (22).

At a step S214, the ratio M:N is obtained as described above by using the focusing L.

At a step S215, a check is made whether the ratio M:N is close enough to an optimal ratio. If it is not, the procedure goes back to the step S213 to repeat the steps S213 through S215. If the ratio M:N is close enough to an optimal ratio, the procedure ends.

Alternately, the ratio M:N may be obtained as follows.

When the Faraday cup 855 is removed, a position P of the charged-particle beam on the wafer 811 varies depending on the voltages VS1 and VS2. First, the ratio M:N is set to 1:1, for example, and the focusing L is obtained by using the equation (22). Then, an equation representing a relation between the voltages VS1 and VS2, the current I, and the position P is obtained experimentally. Then, the ratio M:N when the current I is maximum and the position P is on the beam axis AX is obtained. Such a process is carried out one or more times to make the ratio M:N closer to an optimal ratio.

The determination of the factors K1 and K2 and the focusing L as described above is carried out when the charged-particle-beam exposure device is calibrated.

In the first embodiment of the eighth principle of the present invention, not only the correction deflectors 843 and 844 but also the electromagnetic lens 821B are corrected in relation with the current I, so that the correction of the device is precise.

A relation between this correction and the settling time when the voltages VM1 and VM2 show a step change will be explained below.

In selecting a hole pattern of the stencil mask 812, the voltages VM1 and VM2 are changed by a given step voltage. A precision required for positioning the charged-particle beam on the wafer 811 is within a range of 0.01 μm. As previously described, the charged-particle beam should be blanked out until this level of precision is guaranteed. Since the charged-particle beam is continuously emitted, the blanking of the beam is carried out by using the aperture plate 831 and a deflector placed above the aperture plate 831. Even if the step change is the same between the voltages VM1 and VM2, the larger the changes in the position of the charged-particle beam (i.e., deflection efficiency) on the wafer 811 with respect to changes in the voltages VM1 and VM2, the longer the settling time (blanking time) is.

Figure 70:
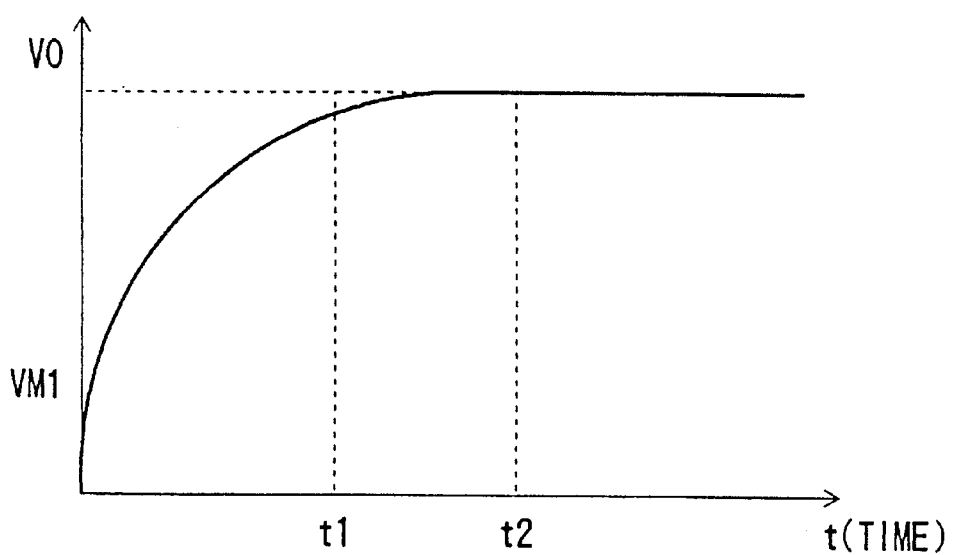
FIG. 70 is a chart showing a settling time shortened by a correction process.

Without the correction described above, the deflection efficiency is large so that the settling time is long. FIG. 70 is a chart showing a shortening of the settling time because of the correction. Without the correction, the settling time of the voltage VM1, for example, is lengthy as shown by t2 in FIG. 70. When the correction is conducted, the deflection efficiency is decreased, so that the settling time becomes shorter as shown by t1 in FIG. 70. The settling time t1 in this case may be 500 ns, for example. In this manner, throughput of the exposure process is enhanced. Since the correction is accurate as described above, the reduction in the settling time is significant.

Figure 71:
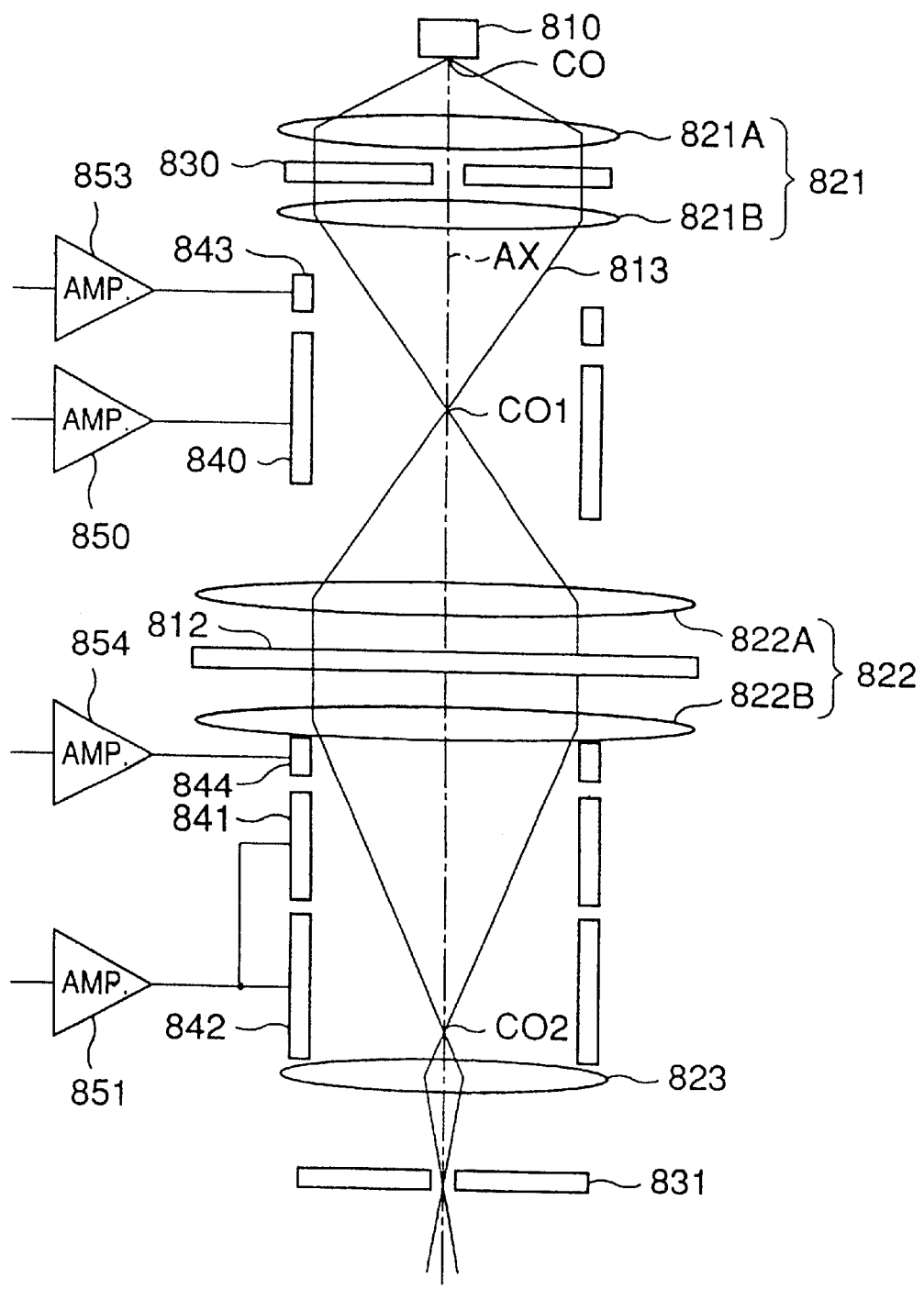
FIG. 71 is an illustrative drawing of a configuration of a charged-particle-beam exposure device according to a second embodiment of the eighth principle of the present invention.

FIG. 71 is an illustrative drawing of a configuration of a charged-particle-beam exposure device according to a second embodiment of the eighth principle of the present invention.

In the device of FIG. 71, the correction deflector 843 is placed between the electromagnetic lens 821B and the deflector 840. Except for this change, the device of FIG. 71 is the same as that of FIG. 64.

In the second embodiment of the eighth principle, the characteristics (1) and (2) described in the first embodiment of the eighth principle are upheld. Thus, what has been described for the first embodiment of the eighth principle can also be applied to the configuration of the second embodiment. To avoid repetition, a description of the second embodiment the same as that of the first embodiment will be omitted.

Figure 72:
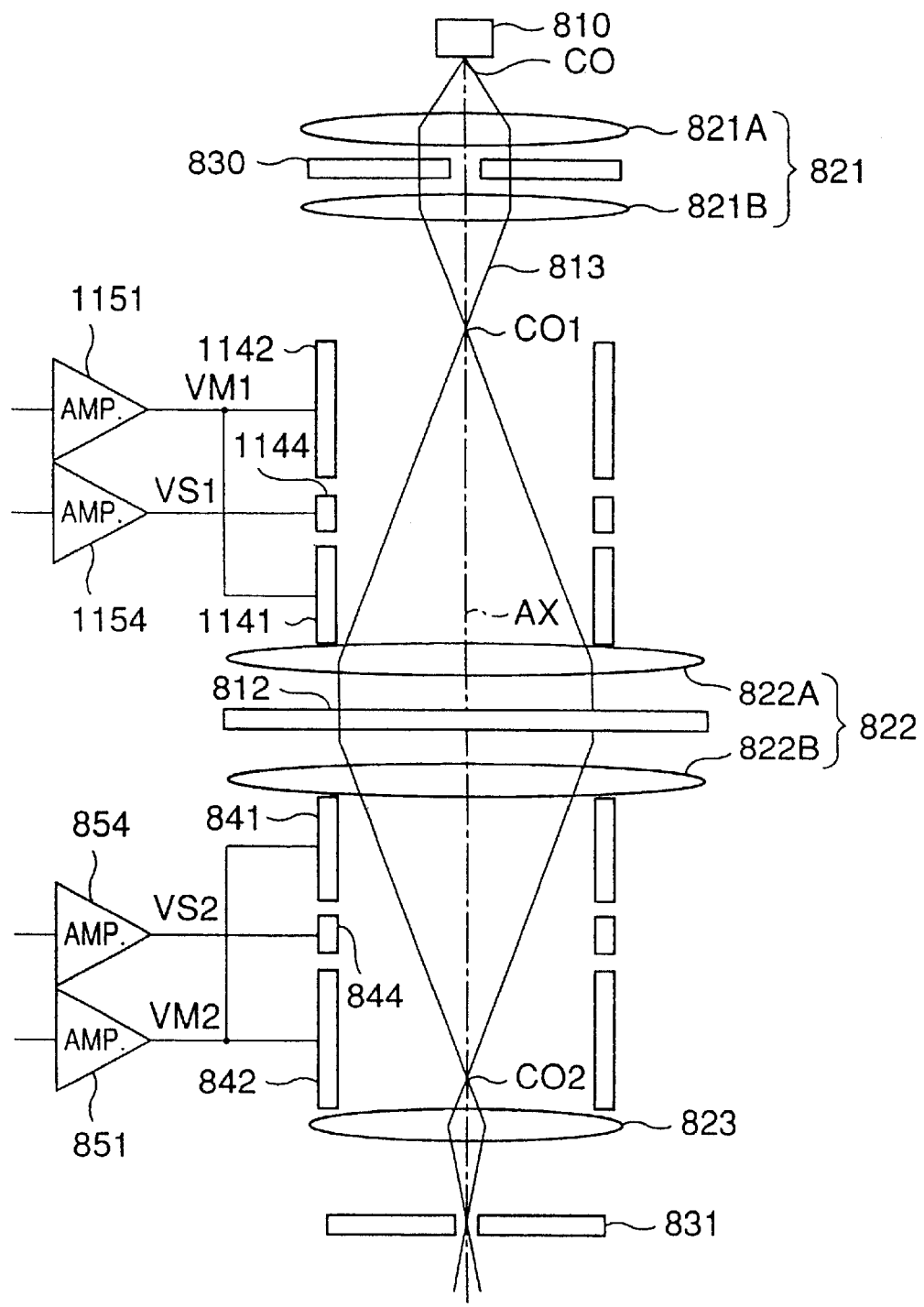
FIG. 72 is an illustrative drawing of a configuration of a charged-particle-beam exposure device according to a third embodiment of the eighth principle of the present invention.

FIG. 72 is an illustrative drawing of a configuration of a charged-particle-beam exposure device according to a third embodiment of the eighth principle of the present invention.

In the device of FIG. 72, deflectors similar to the deflectors 841, 842, and 844 of FIG. 64 are arranged to replace the deflectors 840 and 843 of FIG. 64. Namely, deflectors 1141, 1142, and 1144 are situated between the electromagnetic lens 821B and the electromagnetic lens 822A in a mirror-image configuration to the deflectors 841, 842, and 844. A voltage VM1 output from an amplifier 1151 is applied to the deflectors 1141 and 1142, and a voltage VS1 output from an amplifier 1154 is applied to the correction deflector 1144. The cross-over image CO1 is positioned between the electromagnetic lens 821B and a contour point of the deflector 1142. Other elements have the same configuration as those of FIG. 64.

Figure 73A:
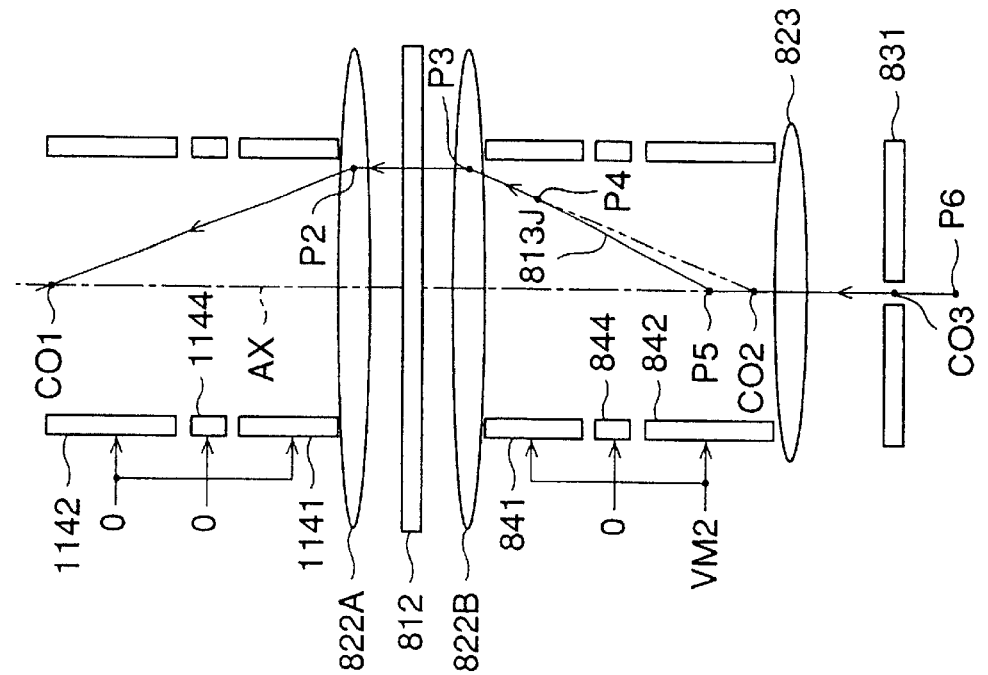
FIGS. 73A and 73B are illustrative drawings for explaining trajectories of the charged-particle beam deflected by deflectors of FIG. 72.
Figure 73B:
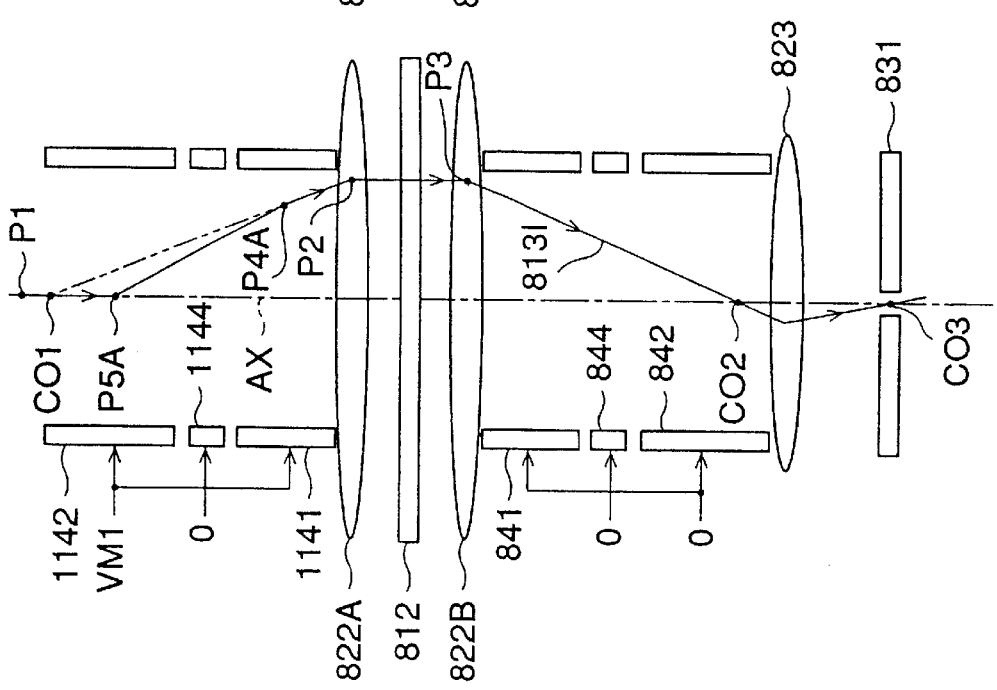

FIGS. 73A and 73B are illustrative drawings for explaining trajectories of the charged-particle beam deflected by the deflectors. FIGS. 73A and 73B correspond to FIGS. 66A and 66B, respectively.

In FIG. 73A, the deflectors 1144, 841, 842, and 844 receive a zero voltage. When the charged-particle beam running downward along the beam axis AX is deflected by the deflectors 1142 and 1141, a linearly approximated trajectory 813I of the charged-particle beam is obtained as shown in FIG. 73A.

In FIG. 73B, voltages applied to the deflectors 1141, 1142, 1144, and 844 are zero. Also, it is assumed that a charged-particle beam is directed upward along the beam axis AX from a point below the aperture plate 831 and that the charged-particle beam is deflected by the deflector 841 and the deflector 842. In this case, a linearly approximated trajectory 813J as shown in FIG. 73B is obtained.

Assume that when a voltage VM1 is applied to the deflectors 1141 and 1142 in FIG. 73A and a voltage VM2 is applied to the deflectors 841 and 842 in FIG. 73B, a point P3 of FIG. 73A is at the same position as a point P3 of FIG. 73B. This condition is satisfied even when the voltages VM1 and VM2 are changed, as long as a ratio between VM1 and VM2 is kept constant.

When the voltage VM1 is applied to the deflectors 1141 and 1142 and the voltage VM2 is applied to the deflectors 841 and 842, a charged-particle beam directed downward along the beam axis AX above the deflector 1142 will have a linearly approximated trajectory running through points P1, P5A, P4A, P2 and P3 of FIG. 73A and through points P4, P5, and P6 of FIG. 73B.

Other than what has been described above, the same thing as the first embodiment can be applied to the third embodiment of the eighth principle of the present invention.

Figure 74:
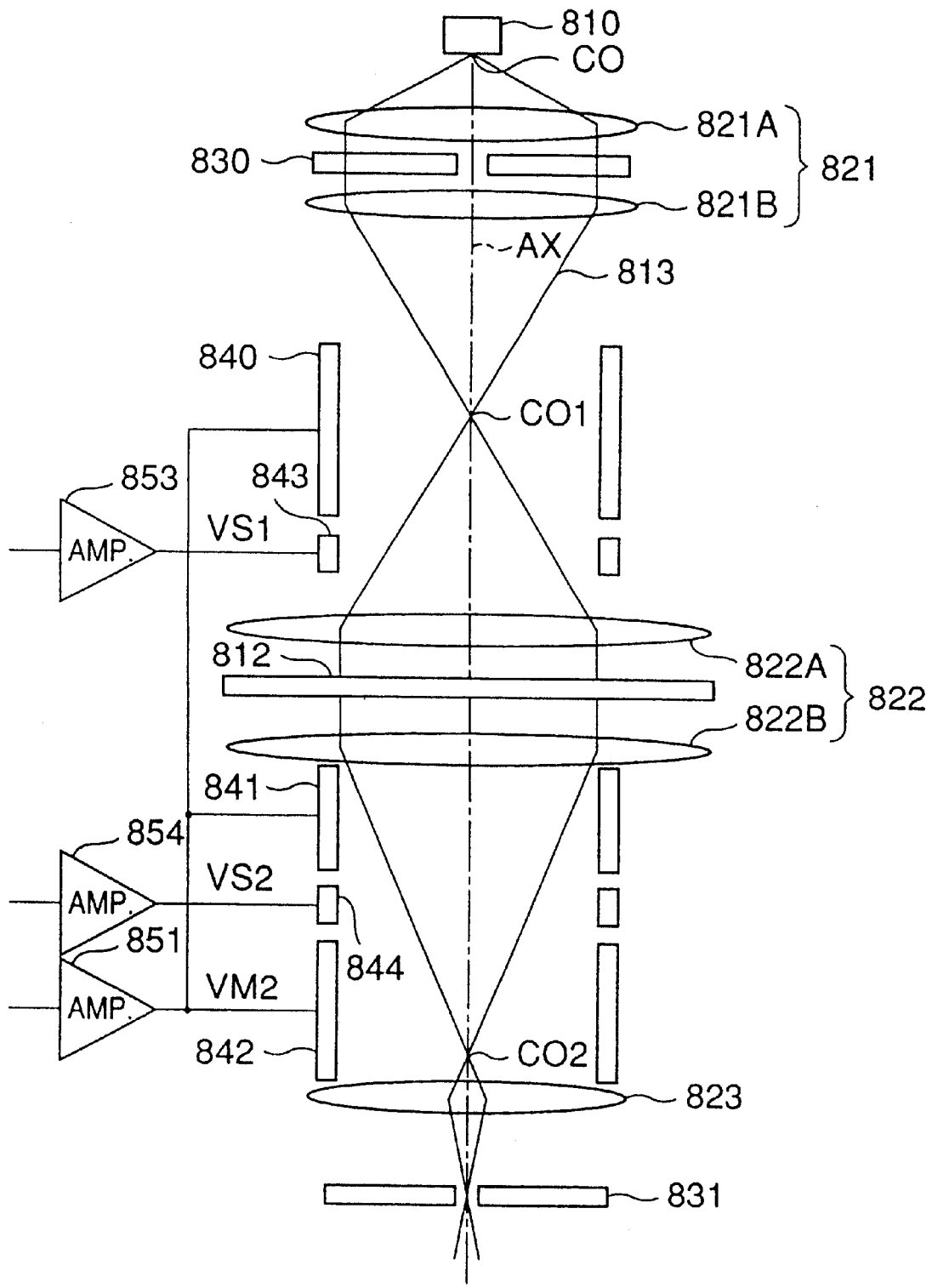
FIG. 74 is an illustrative drawing of a configuration of a charged-particle-beam exposure device according to a fourth embodiment of the eighth principle of the present invention.

FIG. 74 is an illustrative drawing of a configuration of a charged-particle-beam exposure device according to a fourth embodiment of the eighth principle of the present invention.

The configuration of FIG. 74 differs from that of FIG. 64 only in that the amplifier 850 of FIG. 64 is removed. Since the voltage applied to the deflector 840 is in proportion to the voltage applied to the deflectors 841 and 842, the deflector 840 in FIG. 74 is designed such that this proportion factor is equal to 1. Then, the voltage VM2 output from the amplifier 851 is applied to the deflector 840. One of the deflectors 840, 841, and 842 allows an electrical adjustment of a rotation angle around the beam axis AX. The other two of them are mechanically adjustable in the same manner as shown in FIG. 65.

In the fourth embodiment of the eighth principle of the present invention, the voltage VM2 output from the amplifier 851 is applied to the deflectors 841, 842, and 840. Thus, when the voltage VM2 of the amplifier 851 has a step change, transient characteristics of the electric fields generated by the deflector 841, 842, and 840 become the same with each other, so that determination of the settling time becomes easier. If different amplifiers are used for the deflector 840 and the deflectors 841 and 842, transient characteristics of the deflectors are different. In this case, the settling time should be determined by selecting the longest settling time, thereby complicating a process of determining the settling time. In the fourth embodiment of the eighth principle, it is easier to determine the settling time without going through a complicated process.

Figure 75:
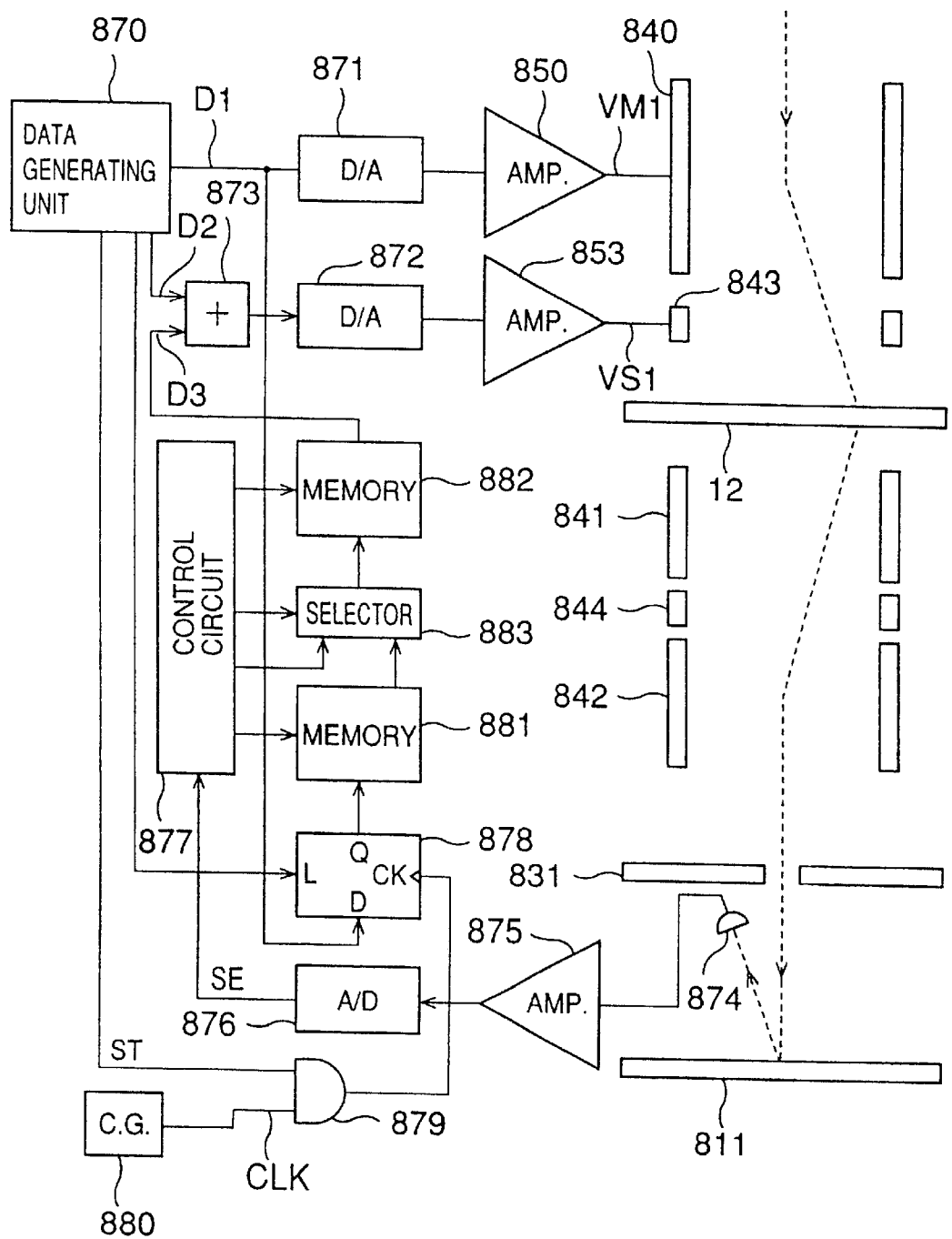
FIG. 75 is an illustrative drawing of a configuration of a charged-particle-beam exposure device according to a fifth embodiment of the eighth principle of the present invention.

FIG. 75 is an illustrative drawing of a configuration of a charged-particle-beam exposure device according to a fifth embodiment of the eighth principle of the present invention.

As described in the first embodiment of the eighth principle, a trajectory of the charged-particle beam can be expressed by a linear approximation with respect to the voltages applied to the deflectors 840 through 843. This is because the deflection amount is small. Second orders of the applied voltages can be a cause of an aberration, but does not have any effect on the trajectory of the charged-particle beam along the beam axis. However, third orders of the applied voltages affects the trajectory of the charged-particle beam along the beam axis. Thus, when the applied voltages have step changes, a position of the charged-particle beam at the aperture plate 831 fluctuates. In this case, the amount of current passing through the aperture plate 831 is generally proportional to the third power of the applied voltage. Although a fluctuation in a position of the charged-particle beam on the wafer 811 can be ignored, the fluctuation of the current amount cannot. Therefore, there is a need to take into account the third orders of the applied voltages with respect to the settling time.

Assume that a precision required for positioning the charged-particle beam on the wafer 811 is 0.01 $\mu$m, that a maximum amount of deflection (distance from the beam axis AX) of the charged-particle beam on the stencil mask 812 is 5 mm, and that a reduction rate of a hole pattern of the stencil mask 812 when projected on the wafer 811 is 1/100. In this case, a 5-mm step change at the stencil mask 812 corresponds to a 50-μm step change on the wafer 811. Thus, in order to keep a step change on the wafer 811 within a range of 0.01 μm, a difference dV between the voltage VM1 and a stable voltage V0 should satisfy the following inequality:

$$dV/V0 \leq 0.01/50 = 1/5000 \qquad (23)$$

Figure 76A:
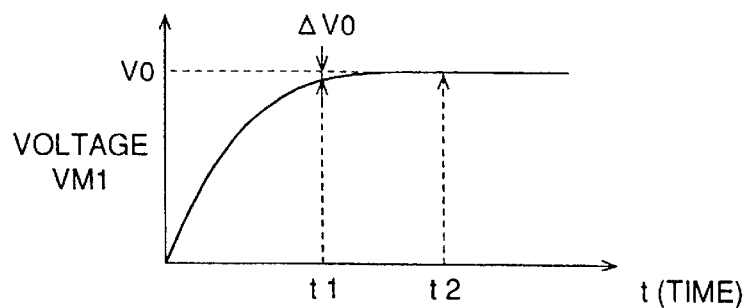
FIG. 76A is a chart for explaining a relation between a difference dV and a settling time of VM1 in FIG. 75.

FIG. 76A is a chart for explaining a relation between the difference dV and the settling time. In the figure, the settling time is t1, at which dV/V should be equal to or smaller than 1/5000. In practice, t1 is about 500 nsec.

If a temporal change of VM1 is approximated to by $$VM1(t) = V0\{1 - \exp(-t/a)\}, \qquad (24)$$

and dV/V0 becomes equal to 1/5000 within 500 nsec, a constant a is 60.3 nsec.

A current I(t) passing through the aperture of the aperture plate 831 is proportional to $\{VM1(t)\}^3$. Thus, I(t) is approximated to by $$I(t) = I0\{1 - \exp(-t/a)\}^3, \qquad (24)$$

Assume that, in order to have an accurate exposure amount, the charged-particle beam should be blanked out until the current amount of the charged-particle beam on the wafer 811 reaches approximately 99% of the stable current amount. In consideration of the reduction rate of 1/100, a difference dI0 between the current I(t) and a stable current I0 should satisfy the following inequality:

$$dI0/I0 \leq (1/100)(1/100) = 1/10000 \qquad (25)$$

Figure 76B:
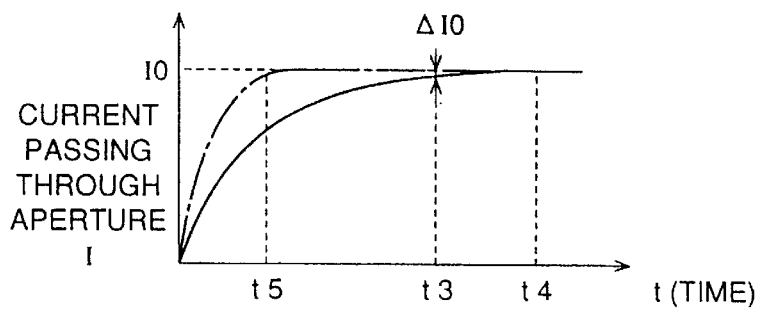
FIG. 76B is a chart for explaining a relation between a difference dIO and a settling time of I in FIG. 75.

FIG. 76B is a chart for explaining a relation between the difference dI0 and the settling time. In the figure, the settling time is t3, at which dI0/I0 should be equal to or smaller than 1/10000. In practice, t3 is about 620 nsec. In this case, the settling time is determined not by the equation (23) but by the equation (25).

The settling time t3 of FIG. 76B is compared with a settling time t2 of FIG. 76A, for which no correction described in the first embodiment of the eighth principle is carried out. Because of no correction, the fluctuation in the position of the charged-particle beam at the aperture plate 831 is large so that the settling time t2 is longer than the settling time t3.

Figure 76C:
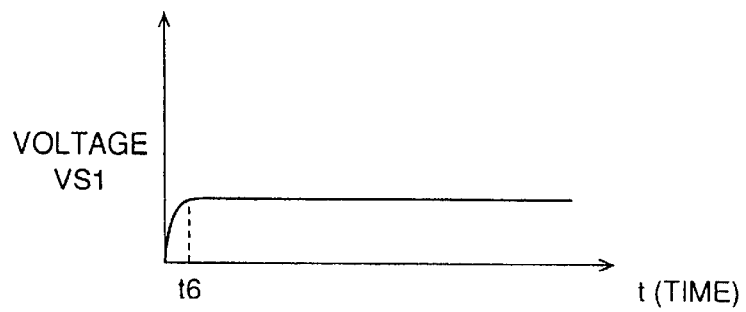
FIG. 76C is a chart showing a change of a voltage VS1 and a settling time of VS1 in FIG. 75.

The deflection efficiencies on the aperture plate 831 and the wafer 811 are greater for the correction deflector 843 than for the deflector 840. Since the correction deflector 843 is used for correction of small errors, the voltage VS1 of the amplifier 853 is much smaller than the voltage VM1 of the amplifier 850. Thus, the voltage VS1 output from the amplifier 853 has a settling time much shorter than that of the voltage VM1. FIG. 76C is a chart showing a change of the voltage VS1 and a settling time t6 thereof. Because t6 is much shorter than t1, the correction of the fluctuation of the charged-particle-beam position on the aperture plate 831 can be carried out by using the correction deflector 843.

In the device of FIG. 75, the correction deflector 843 is used for correcting the fluctuation in the position of the charged-particle beam at the aperture plate 831 when the voltages applied to the deflectors 840 through 844 have step changes to cause the fluctuation through the third order of the applied voltages. The configuration of FIG. 75 includes elements 870 through 884 in addition to the configuration of FIG. 64.

Data D1 for selecting a hole pattern of the stencil mask 812 is stored in a data generating unit 870. This pattern-selection data D1 sequentially read from the data generating unit 870 is converted to analog data by a D/A converter 871, and, then, amplified by the amplifier 850 to become the voltage VM1 applied to the deflector 840. The voltage VS1 generated through a D/A conversion by a D/A converter 872 and the amplification by the amplifier 853 is supplied to the correction deflector 843. The D/A converter 872 receives an output of an adder 873 adding correction values D2 and D3 together. The correction value D2 is equal to K1•D1, where K1 is the proportion factor previously described.

When creating a correction value for the correction deflector 843, the correction value D3 is first set to zero. The pattern-selection data D1 is changed by a step, and a value proportional to the current I passing through the aperture of the aperture plate 831 is detected by a scattered-particle detector 874. A detected signal is amplified by an amplifier 875 and converted to a digital value SE by a D/A converter 876. The digital value SE is provided for a control circuit 877. Since the deflectors 841 through 843 receive voltages proportional to that of deflector 840, the voltages input to the deflectors 841 through 843 have step changes as does the voltage applied to the deflector 840.

At a time when the step change of the pattern-selection data D1 starts, a load signal supplied from the data generating unit 870 to a load-control-input node L of a counter 878 is activated. The pattern-selection data D1 is supplied to a data-input node D of the counter 878. Immediately after these operations, the data generating unit 870 turns a start signal ST to a high level to open an AND gate 879. Then, a clock CLK from a clock generator 880 is supplied to a clock-input node of the counter 878 via the AND gate 879. A count supplied from a data-output node Q of the counter 878 serves as an address of a memory 881, and the control circuit 877 writes the scattered-particle amount (digital value) SE in this address of the memory 881. The writing of the data is carried out from data D1 corresponding to each hole pattern of the stencil mask 812.

A memory 882 stores the correction value D3 which maximizes the scattered-particle amount SE for each data D1 corresponding to a respective hole pattern of the stencil mask 812. The correction value D3 is obtained as follows.

The correction value D3 is changed for given pattern-selection data D1 and given scattered-particle amount SE without correction. Then, the scattered-particle amount SE is measured for each correction value D3 to obtain a function of D3 for representing the scattered-particle amount SE. Then, the correction value D3 for the maximum scattered-particle amount SE is determined. The same procedure is conducted for a plurality of scattered-particle amounts SE without correction. Then, the correction value D3 for every scattered-particle amount SE without correction is obtained. The same procedure is carried out for each data D1 corresponding to a respective hole pattern of the stencil mask 812.

The correction values D3(D1, SE) (function of the data D1 and the scattered-particle amount SE) thus obtained are supplied to the control circuit 877. The control circuit 877 provides the memory 882 with an address (D1, SE) via a selector 883 to write a correction value D3 at an indicated address.

At a time of exposure, an output of the memory 881 instead of an output of D/A converter 876 is used. This is because the output of the D/A converter 876 obtained from the output of scattered-particle detector 874 varies depending on a surface structure of the wafer 811. Namely, it is preferable to use the scattered-particle amounts SE detected for a flat surface of the wafer 811 and stored in the memory 881.

At a time of exposure, the memory 881 and the memory 882 are set to a read state, and the selector 883 is set to select an address from the memory 881. When the data D1 is changed by a step to select a hole pattern of the stencil mask 812, the load-control-input node L of the counter 878 is activated so that the counter 878 reads the pattern-selection data D1. Immediately after these operations, the start signal ST is turned to the high level, so that the clock CLK from the clock generator 880 is counted by the counter 878. A count obtained by the counter 878 is used for indicating an address of the memory 881 to read the scattered-particle amount SE from the memory 881. This scattered-particle amount SE is provided for the memory 882 as an address, so that the correction value D3 is read from the memory 882 to be supplied to the adder 873.

Figure 76D:
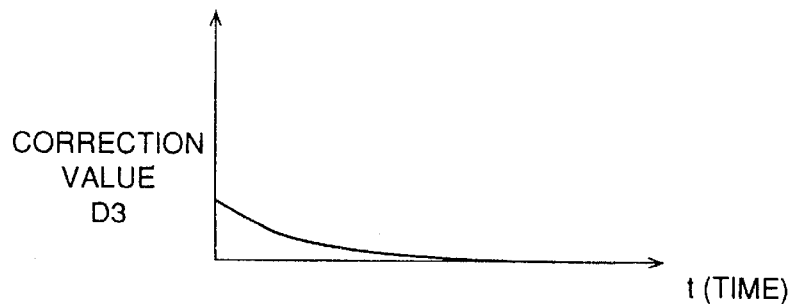
FIG. 76D is a chart showing an example of a correction value D3 for given pattern-selection data D1 in FIG. 75.

FIG. 76D is a chart showing an example of the correction value D3 for given pattern-selection data D1. Use of the correction value D3 as shown in FIG. 76D results in the current I passing through the aperture being changed as shown by a dotted line in FIG. 76B. Thus, the settling time is shortened from t3 to t5, which is shorter than tl of FIG. 76A. Then, the settling time required for selecting a hole pattern of the stencil mask 812 becomes t1, thereby enhancing throughput of the exposure.

It is possible for the counter 878 to directly provide an address of the memory 882. Since the memory 881 storing the scattered-particle amounts SE is used in the fifth embodiment of the eighth principle, a relation between the scattered-particle amounts SE and the correction values D3 can be inspected at any time. Thus, it is easier to modify the correction values D3 to more appropriate values.

Further, the present invention is not limited to these embodiments, but variations and modifications may be made without departing from the scope of the present invention.

What is claimed is:

1. A device exposing a wafer, supported on a stage, to a charged-particle beam deflected by a deflector, each of plural frames defined on said wafer being successively exposed to said charged-particle beam while said wafer is shifted relative to the beam by movement of the stage, said device comprising:
   a measuring unit obtaining data regarding correction of said deflector in order to correctly position said charged-particle beam to produce a precise exposure of said wafer;
   a data storing unit storing said data;
   a coefficient calculating unit calculating, based on said data stored in said data storing unit, correction coefficients of said correction of said deflector for a first frame of said plural frames prior to an exposure, and calculating, based on said data stored in said data storing unit, said correction coefficients of said correction for an (n+1-th) frame of said plural frames during a period when an (n-th) frame of said plural frames is being exposed;
   a coefficient storing unit storing said correction coefficients; and
   a correction calculating unit correcting said charged-particle beam, to expose one of said plural frames, based on said correction coefficients calculated while an immediately preceding one of said plural frames is being exposed.

2. The device as claimed in claim 1, wherein said coefficient storing unit comprises a first unit storing said correction coefficients for two of said frames.

3. The device as claimed in claim 2, wherein said coefficient storing unit further comprises a second unit reading said correction coefficients for one of said frames from said first unit, and, at the same time, writing said correction coefficients for a next successive one of said frames in said first unit.

4. The device as claimed in claim 3, wherein said first unit comprises one of a buffer memory, a FIFO memory, a dual-port memory and a combination thereof.

5. The device as claimed in claim 3, wherein said first unit comprises a dual-port memory, a most significant bit of an address of said dual-port memory being a frame-control flag reversing for each of said frames, a first half of a memory space of said dual-port memory storing said correction coefficients for one of said frames and a second half of said memory space of said dual-port memory storing said correction coefficients for a next successive one of said frames.

6. The device as claimed in claim 1, further comprising an exposure controlling unit monitoring an exposure position in said frames to provide a timing signal, based on said exposure position, to said correction calculating unit, said correction calculating unit reading only some of said correction coefficients from said coefficient storing unit based on said timing signal, said some of said correction coefficients, only being needed to be updated during an exposure.

7. The device as claimed in claim 6, further comprising a pattern storing unit storing a pattern of said correction coefficients used for an exposure of said wafer and providing said pattern of said correction coefficients to said correction calculating unit based on said timing signal, said correction calculating unit reading only said some of said correction coefficients from said coefficient storing unit based on said pattern of said correction coefficients.

8. The device as claimed in claim 7, wherein said pattern storing unit comprises one of a buffer memory, a FIFO memory, a dual-port memory, and a combination thereof.

9. The device as claimed in claim 6, further comprising a pattern storing unit storing information about which correction coefficients need not be updated, said correction calculating unit reading only said some of said correction coefficients from said coefficient storing unit, based on said information stored in said pattern storing unit.

10. The device as claimed in claim 1,
   wherein said deflector comprises a main deflector and a sub-deflector, said main deflector deflecting said charged-particle beam within a first area and said sub deflector deflecting said charged-particle beam within a second area smaller than said first area; said coefficient calculating unit comprises a first coefficient calculating unit for said main deflector and a second coefficient calculating unit for said sub-deflector;
   said coefficient storing unit comprises a first coefficient storing unit for said main deflector and a second coefficient storing unit for said sub-deflector; and
   said correction calculating unit comprises a first correction calculating unit said main deflector and a second correction calculating unit for said sub-deflector.

11. A method of exposing a wafer, supported on a stage, to a charged-particle beam in a charged-particle beam exposure device having a main deflector deflecting said charged-particle beam within a first area and a sub-deflector deflecting said charged-particle beam within a second area, smaller than said first area, an exposed surface of said wafer being divided into areas, each of said areas being divided into cell fields, each of said cell fields corresponding to said first area and being divided into sub-fields, each of said sub-fields corresponding to said second area, said cell fields being arranged in a plurality of lines defining frames on said wafer, each of said frames being successively exposed to said charged-particle beam by moving said stage, and thereby said wafer, relatively to said charged particle beam, said method comprising the steps of:

a) obtaining data regarding corrections of said main deflector and said sub-deflector, prior to an exposure of said wafer, in order to correct positioning of said charged-particle beam for precise exposure of said wafer;

b) calculating correction coefficients of said corrections for a first frame of said frames based on said data prior to said exposure of said wafer;

c) calculating said correction coefficients for a given frame of said frames based on said data while a frame, immediately before said given frame, is being exposed; and d) correcting said charged-particle beam to expose one of said frames, based on said correction coefficients calculated while a frame, immediately before said one of said frames, is being exposed.

12. The method as claimed in claim 11, wherein said step d) further comprises a step of e) updating said correction coefficients at borders between said cell fields and between said first areas while said one of said frames is being exposed.

13. The method as claimed in claim 12, wherein said step e) comprises:

e1) monitoring timings when an exposure position is shifted, from a given one of said cell fields to a new one of said cell fields or from a given one of said first areas to a new one of said first areas, during an exposure of said one of said frames; and e2) updating some of said correction coefficients based on said timings, said some of said correction coefficients, only, being needed to be updated during said exposure of said one of said frames.

14. The method as claimed in claim 13, wherein said step e2) comprises the steps of:

storing correction-coefficient updating information about which correction coefficients need to be updated at said timings; and updating only said some of said correction coefficients based on said timings and said correction coefficient updating information.

15. The method as claimed in claim 11, further comprising obtaining new data regarding said corrections of said main deflector and said sub-deflector during said exposure of said wafer, and said step c) calculates said correction coefficients based on said new data after said new data is obtained.

16. A method of exposing a wafer to a charged-particle beam, said charged-particle beam being generated by a beam source and passing through a hole pattern formed through a plate to form a pattern on said wafer, said method comprising the steps of:

a) deflecting said charged-particle beam between said beam source and said wafer by using a deflector based on deflection data, said deflector having an inductor impedance; and b) adding a pulse signal to an input of an amplifier when said deflection data is supplied to said deflector via said amplifier, said pulse signal having a reversed phase relative to a first wave of ringing appearing in an output of said amplifier so as to cancel at least said first wave of said ringing.

17. The method as claimed in claim 16, wherein said step b) adds, to said input of said amplifier, said pulse signal having a pulse length shorter than a time period between a start of said first wave of said ringing and a start of a second wave of said ringing.

18. The method as claimed in claim 16, wherein said step b) sets at least one of a pulse-generation timing, a pulse magnitude, and a pulse length of said pulse signal.

19. The method as claimed in claim 16, wherein said step b) sets each of a pulse generation timing, a pulse magnitude, and a pulse length of said pulse signal independently.

20. The method as claimed in claim 16, wherein said step b) generates said pulse signal based on pulse parameters regarding said pulse signal stored in a memory.

21. The method as claimed in claim 20, further comprising a step of c) storing said pulse parameters regarding said pulse signal in said memory.

22. The method as claimed in claim 21, wherein said step c) stores said pulse parameters in said memory after obtaining said pulse parameters with which a derivation of said output of said amplifier becomes zero in a shortest period of time after a change in said output of said amplifier.

23. The method as claimed in claim 21, wherein said step c) stores said pulse parameters in said memory after obtaining said pulse parameters with which said output of said amplifier falls within a predetermined range in a shortest period of time after a change in said output of said amplifier.

24. The method as claimed in claim 21, wherein said step c) stores said pulse parameters in said memory after obtaining said pulse parameters with which a derivation of a detection signal becomes zero in a shortest period of time after a start of movement of said charged-particle beam, said detection signal reflecting said movement of said charged particle beam on said wafer.

25. The method as claimed in claim 16, wherein said step a) uses a set of stages of coils as said deflector, each of said stages of said coils has at least one coil, said deflection data being supplied to each of said stages of said coils via a respective amplifier, and any two of said stages of said coils adjacent to each other being driven by currents flowing in respective, opposite directions.

26. The method as claimed in claim 25, wherein said step a) uses a plurality of sets of said stages of said coils, said plurality of said sets being arranged with different phases around an axis of said charged-particle beam.

27. A method of exposing a wafer to a charged-particle beam, said charged-particle beam being generated by a beam source and passing through a hole pattern formed through a plate to form a pattern on said wafer, said method comprising the steps of:

a) generating deflection data; and b) deflecting said charged-particle beam between said beam source and said wafer using a deflector controlled in accordance with said deflection data, said deflector having an inductor impedance and comprising a set of stages of coils, each of said stages of said coils having at least one coil and said deflection data being supplied to each of said stages of said coils via a respective amplifier, any two of said stages of said coils adjacent to each other being driven by currents of respective, opposite directions.

28. The method as claimed in claim 27, wherein said step b) uses a plurality of sets of said stages of said coils, said plurality of said sets with respective, different phases being arranged around an axis of said charged-particle beam.

29. A device for exposing a wafer to a charged-particle beam, said charged-particle beam being generated by a beam source and passing through a hole pattern, extending through a plate, to form a pattern on said wafer, said device comprising:

a deflector deflecting said charged particle beam between said beam source and said wafer in accordance with deflection data, said deflector having an inductor impedance; and a circuit unit adding a pulse signal to an input of an amplifier when said deflection data is supplied to said deflector via said amplifier, said pulse signal having a reversed phase relative to a first wave of ringing appearing in an output of said amplifier so as to cancel at least said first wave of said ringing.

30. The device as claimed in claim 29, wherein said circuit adds to said input of said amplifier, said pulse signal having a pulse length shorter than a time period between a start of said first wave of said ringing and a start of a second wave of said ringing.

31. The device as claimed in claim 29, wherein said circuit sets at least one of a pulse-generation timing, a pulse magnitude, and a pulse length of said pulse signal.

32. The device as claimed in claim 29, wherein said circuit sets each of a pulse generation timing, a pulse magnitude, and a pulse length of said pulse signal independently.

33. The device as claimed in claim 29, wherein said circuit generates said pulse signal based on pulse parameters regarding said pulse signal stored in a memory.

34. The device as claimed in claim 33, further comprising a controller storing said pulse parameters regarding said pulse signal in said memory.

35. The device as claimed in claim 34, wherein said controller stores said pulse parameters in said memory after obtaining said pulse parameters with which a derivation of said output of said amplifier becomes zero in the shortest period of time after a change in said output of said amplifier.

36. The device as claimed in claim 34, wherein said controller stores said pulse parameters in said memory after obtaining said pulse parameters with which said output of said amplifier falls within a predetermined range in the shortest period of time after a change in said output of said amplifier.

37. The device as claimed in claim 34, wherein said controller further comprises:

a detector generating a detection signal reflecting movement of said charged-particle beam on, and relative to, said wafer; and a unit storing said pulse parameters in said memory after obtaining said pulse parameters with which a derivation of said detection signal becomes zero in a shortest period of time after a start of said movement of said charged-particle beam relative to said wafer.

38. The device as claimed in claim 29, wherein said deflector includes a set of stages of coils, each of said stages of said coils has at least one coil, said deflection data being supplied to each of said stages of said coils via a respective amplifier, any two adjacent said stages of said coils being driven respectively by currents of respective, opposite directions of current flow.

39. The device as claimed in claim 38, wherein said deflector includes a plurality of sets of said stages of said coils, said plurality of said sets having respective, different phases and being arranged around an axis of said charged-particle beam.

40. A device for exposing a wafer to a charged-particle beam, said charged-particle beam being generated by a beam source and passing through a hole pattern, extending through a plate, to form a pattern on said wafer, said device comprising:

a data generator generating deflection data;

a deflector deflecting said charged-particle beam between said beam source and said wafer in accordance with said deflection data, said deflector comprising a set of stages of coils, each of said stages of said coils having at least one coil; and a unit supplying said deflection data to each of said stages of said coils via a respective amplifier and setting currents to respective, opposite directions of current flow, said currents respectively driving any two adjacent said stages of said coils.

41. The device as claimed in claim 40, wherein said deflector includes a plurality of sets of said stages of said coils, said plurality of said sets having respective, different phases and being arranged around an axis of said charged-particle beam.

42. A method of exposing a wafer to a charged-particle beam in a device including a first lens, a second lens, a third lens, and an aperture which are arranged in that orders from a top to a bottom of said device, and have respective center points thereof disposed on a beam axis of said charged-particle beam, and a stencil mask having a plurality of hole patterns for shaping a cross section of said charged-particle beam, said stencil mask being situated at a position of said second lens and extending in a direction perpendicular to said beam axis, said charged-particle beam passing through said first lens, said second lens, a selected hole pattern of said stencil mask, said third lens and said aperture to reach said wafer, a first cross-over image being situated between said first lens and said second lens, a second cross-over image being situated between said second lens and said third lens and relatively nearer to said third lens, said device further including a first deflector placed between said first lens and said second lens, said first deflector having a center thereof on said beam axis, and a second deflector placed between said second lens and said third lens, said second deflector having a center thereof on said beam axis, and a third deflector placed between said second lens and said third lens, said third deflector having a center thereof on said beam axis and above said second cross-over image and said second deflector being situated nearer to said second lens than is said third deflector, said method comprising the steps of:

a) applying substantially identical voltages respectively to said second deflector and to said third deflector;

b) deflecting said charged-particle beam through said first deflector such that an upward extension of said charged-particle beam, having been deflected, runs through a general position of said first cross-over image;

c) deflecting said charged-particle beam through said second deflector such that said charged-particle beam reaches a general position of said center of said third deflector; and d) deflecting said charged-particle beam through said third deflector such that said charged particle beam runs along said beam axis after being deflected by said third deflector.

43. The method as claimed in claim 42, further comprising the steps of:

e) correcting a first error of a trajectory of said charged-particle beam through a first correction deflector, said first error being caused by a displacement of a position of said first cross-over image, said first correction deflector being placed between said first lens and said second lens and having a center thereof on said beam axis, said first correction deflector having a length in a direction of said beam axis smaller than that of said first deflector; and f) correcting a second error of said trajectory of said charged-particle beam through a second correction deflector, said second error being caused by a displacement of a position of said second cross-over image, said second correction deflector being placed between said second lens and said third deflector and having a center thereof on said beam axis, said second correction deflector having a length in a direction of said beam axis smaller than those of said second deflector and said third deflector, wherein said first deflector is situated such that said center of said first deflector is located at said general position of said first cross-over image.

44. The method as claimed in claim 43, further comprising the steps of:

e) changing focusing of said first lens while keeping a zero deflection amount for said second deflector and said third deflector, to obtain a focusing A1 of said first lens with which a change in a current passing through said aperture becomes a minimum, for a change in a deflection amount of said first deflector;

f) changing focusing of said first lens while keeping a zero deflection amount for said first deflector, to obtain a focusing A2 of said first lens with which a change in a current passing through said aperture becomes minimum, for changes in deflection amounts of said second deflector and said third deflector;

g) obtaining an optimal focusing L of said first lens, using an equation:

$$L=(M'A1+N-A2)/(M+N).$$

wherein M:N is a ratio of a first voltage (VS1), applied to said first correction deflector, to a second voltage (VS2), applied to said second correction deflector.

45. The method as claimed in claim 44, further comprising the steps of:

h) obtaining said optimal focusing L of said first lens by using said equation after setting M:N to an initial value;

i) changing said first voltage (VS1) while keeping a zero deflection amount for said second deflector and said third deflector and while keeping said first lens to said optimal focusing L, to obtain said first voltage (VS1) with which a change in said current passing through said aperture becomes a minimum for a change in a deflection amount of said first deflector;

j) changing said second voltage (VS2), while keeping a zero deflection amount for said first deflector and while keeping said first lens to said optimal focusing L, to obtain said second voltage (VS2) with which a change in said current passing through said aperture becomes minimum for changes in deflection amounts of said second deflector and said third deflector;

k) updating said ratio M:N based on said first voltage (VS1) and said second voltage (VS2); and l) updating said optimal focusing L by using an updated ratio M:N and said equation.

46. The method as claimed in claim 43, further comprising the steps of:

e) storing first correction values in a memory, said first correction values being used for maximizing a transient exposure amount of said charged particle beam when exposing said wafer to said charged particle beam, each of said first correction values being provided for a corresponding one of said hole patterns of said stencil mask; and f) applying a first voltage to said first correction deflector, based on a sum of one of said first correction values and a second correction value, said second correction value being used for correcting said trajectory of said charged-particle beam in a static condition, said one of said first correction values being read from said memory and corresponding to one of said hole patterns when said one of said hole patterns is selected for an exposure of said wafer.

47. The method as claimed in claim 46, further comprising the steps of:

g) storing said transient exposure amount of said charged-particle beam for each of said hole patterns of said stencil mask in a first memory; and h) storing candidate values of said first correction values for each of said hole patterns of said stencil mask in a second memory, said candidate values for a given one of said hole patterns corresponding to different transient exposure amounts of said charged-particle beam, wherein said first memory and said second memory together form said memory, and an output of said first memory is used as an address of said second memory.

48. The method as claimed in claim 42, wherein said first deflector comprises fourth and fifth detectors, further comprising the steps of:

e) applying substantially identical voltages respectively to the fourth deflector and to the fifth deflector, said fourth deflector being situated nearer to said first lens than said fifth deflector, said fourth deflector having a center thereof on said beam axis and below said first crossover image and said fifth deflector having a center thereof on said beam axis;

f) deflecting said charged-particle beam through said fourth deflector;

g) deflecting said charged-particle beam through said fifth deflector such that an upward extension of said charged-particle beams having been deflected, runs through a general position of said first cross-over image;

h) correcting a first error of a trajectory of said charged-particle beam through a first correction deflector, said first error being caused by a displacement of a position of said first cross-over image, said first correction deflector being placed between said fourth deflector and said second lens and having a center thereof on said beam axis, said first correction deflector having a length in a direction of said beam axis smaller than that of said fourth deflector and said fifth deflector; and i) correcting a second error of said trajectory of said charged-particle beam through a second correction deflector, said second error being caused by a displacement of a position of said second cross-over image, said second correction deflector being placed between said second lens and said third deflector and having a center thereof on said beam axis, said second correction deflector having a length in a direction of said beam axis smaller than those of said second deflector and said third deflector.

49. The method as claimed in claim 48, further comprising the step of adjusting a rotation angle of one of said fourth deflector and said fifth deflector around said beam axis by rotating said one of said fourth deflector and said fifth deflector, respectively, around said beam axis.

50. The method as claimed in claim 42, further comprising the step of adjusting a rotation angle of one of said second deflector and said third deflector around said beam axis by rotating said one of said second deflector and said third deflector, respectively, around said beam axis.

51. The method as claimed in claim 42, further comprising the step of applying said substantially identical voltage to said first deflector, in addition to said second deflector and said third deflector.

52. A device for exposing a wafer to a charged-particle beam in a device including a first lens, a second lens, a third lens, and an aperture which are arranged in that order, from a top-to a bottom of said device, and have respective center points thereof disposed on a beam axis of said charged-particle beam, and a stencil mask having a plurality of hole patterns for shaping a cross section of said charged-particle beam, said stencil mask being situated at a position of said second lens and extending in a direction perpendicular to said beam axis, said charged-particle beam passing through said first lens, said second lens, a selected hole pattern of said stencil mask, said third lens and said aperture to reach said wafer, a first cross-over image being situated between said first lens and said second lens and a second cross-over image being situated between said second lens and said third lens and relatively nearer to said third lens, said device comprising:

a first deflector placed between said first lens and said second lens and having a center thereof on said beam axis, said first deflector deflecting said charged-particle beam such that an upward extension of said charged-particle beams having been deflected runs through a general position of said first cross-over image;

a second deflector placed between said second lens and said third lens and having a center thereof on said beam axis;

a third deflector placed between said second lens and said third lens and having a center thereof on said beam axis and above said second cross-over image, said third deflector being situated nearer to said third lens than said second deflector, wherein said second deflector deflects said charged-particle beam such that said charged-particle beam reaches a general position of said center of said third deflector and said third deflector deflects said charged-particle beam such that said charged-particle beam runs along said beam axis after being deflected by said third deflector; and a first amplifier applying substantially identical voltages respectively to said second deflector and to said third deflector.

53. The device as claimed in claim 52, wherein said first deflector is situated such that said center point of said first deflector is located at said general position of said first cross-over image.

54. The device as claimed in claim 53, further comprising:

a first correction deflector correcting a first error of a trajectory of said charged-particle beam, said first error being caused by a displacement of a position of said first cross-over image, said first correction deflector being placed between said first lens and said second lens and having a center thereof on said beam axis, said first correction deflector having a length in a direction of said beam axis smaller than that of said first deflector; and a second correction deflector correcting a second error of said trajectory of said charged particle beam, said second error being caused by a displacement of a position of said second cross-over image, said second correction deflector being placed between said second lens and said third deflector and having a center thereof on said beam axis, said second correction deflector having a length in a direction of said beam axis smaller than that of each of said second deflector and said third deflector.

55. The device as claimed in claim 54, wherein said first amplifier applies said substantially identical voltages to said first deflector in addition to said second and third deflectors, respectively.

56. The device as claimed in claim 52, further comprising a second amplifier, wherein:

said first deflector comprises:

a fourth deflector deflecting said charged particle beam and having a center thereof on said beam axis and below said first cross-over image, and a fifth deflector situated nearer to said second lens than is said fourth deflector and having a center thereof on said beam axis, said fifth deflector deflecting said charged-particle beam such that an upward extension of said charged-particle beam, having been deflected, runs through a general position of said first cross-over image; and said second amplifier applies substantially equal voltages to said fourth deflector and said fifth deflector, respectively.

57. The device as claimed in claim 56, further comprising:

a first correction deflector correcting a first error of a trajectory of said charged-particle beam, said first error being caused by a displacement of a position of said first cross-over image, said first correction deflector being placed between said fourth deflector and said second lens and having a center thereof on said beam axis, said first correction deflector having a length in a direction of said beam axis smaller than that of said fourth deflector and said fifth deflector; and a second correction deflector correcting a second error of said trajectory of said charged-particle beam, said second error being caused by a displacement of a position of said second cross-over image, said second correction deflector being placed between said second lens and said third deflector and having a center thereof on said beam axis, said second correction deflector having a length in a direction of said beam axis smaller than that of said second deflector and said third deflector.

58. The device as claimed in claim 56, further comprising a unit adjusting a rotation angle of one of said fourth deflector and said fifth deflector around said beam axis by rotating said one of said fourth deflector and said fifth deflector, respectively, around said beam axis.

59. The device as claimed in claim 56, wherein said first amplifier and said second amplifier respectively output substantially equal voltages.

60. The device as claimed in claim 52, further comprising a unit adjusting a rotation angle of one of said second deflector and said third deflector around said beam axis by rotating said one of said second deflector and said third deflector, respectively, around said beam axis.

61. The device as claimed in claim 52, further comprising:

memory storing first correction values used for maximizing a transient exposure amount of said charged-particle beam when exposing said wafer to said charged-particle beam, each of said first correction values being provided for a corresponding one of said hole patterns of said stencil mask;

a digital-to-analog converter converting digital data to an analog signal;

a second amplifier amplifying said analog signal to apply said analog signal to said first deflector;

a controller controlling said memory to output one of said first correction values, when said digital data is changed, thereby to select one of said hole patterns of said stencil mask, said one of said first correction values corresponding to said one of said hole patterns of said stencil mask; and a first-correction-deflector driving unit applying a voltage to said first correction deflector, based on a sum of said one of said first correction values and a second correction value, said second correction value being used for correcting a trajectory of said charged-particle beam in a static condition.

62. The device as claimed in claim 61, wherein said memory comprises:

a first memory storing said transient exposure amount of said charged-particle beam for each of said hole patterns of said stencil mask;

a second memory storing candidate values of said first correction values for each of said hole patterns of said stencil mask, said candidate values for a given one of said hole patterns corresponding to different transient exposure amounts of said charged particle beam, wherein an output of said first memory is used as an address of said second memory.

* * * * *

UNITED STATES PATENT AND TRADEMARK OFFICE
CERTIFICATE OF CORRECTION

PATENT NO. : 6,242,751 B1
DATED : June 5, 2001
INVENTOR(S) : Akio Takemoto et al.

Page 1 of 1

It is certified that error appears in the above-identified patent and that said Letters Patent is hereby corrected as shown below:

<u>Column 64,</u>
Line 19, change "orders" to -- order, --.
Line 35, change the equation to -- $L = (M \cdot A1 + N \cdot A2)/(M + N)$, --.

Signed and Sealed this

Fifth Day of March, 2002

Attest:

Attesting Officer

JAMES E. ROGAN
*Director of the United States Patent and Trademark Office*